(12) United States Patent
Kodama

(10) Patent No.: US 7,371,505 B2
(45) Date of Patent: May 13, 2008

(54) PHOTOSENSITIVE COMPOSITION AND METHOD FOR FORMING PATTERN USING THE SAME

(75) Inventor: Kunihiko Kodama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 304 days.

(21) Appl. No.: 11/167,813

(22) Filed: Jun. 28, 2005

(65) Prior Publication Data

US 2005/0287473 A1  Dec. 29, 2005

(30) Foreign Application Priority Data

Jun. 28, 2004 (JP) .......................... P.2004-189265
Oct. 18, 2004 (JP) .......................... P.2004-302988

(51) Int. Cl.
*G03F 7/004* (2006.01)
*G03F 7/32* (2006.01)
*C08F 234/02* (2006.01)
*C07C 69/74* (2006.01)

(52) U.S. Cl. .................. 430/270.1; 430/326; 430/905; 430/910; 526/256; 526/266; 526/270; 526/309; 560/120; 560/126; 560/128

(58) Field of Classification Search ............. 403/270.1; 430/326, 905, 910, 270.1; 526/256, 266, 526/270, 309; 560/120, 126, 128
See application file for complete search history.

(56) References Cited

U.S. PATENT DOCUMENTS

| 6,383,713 | B1 * | 5/2002 | Uetani et al. ............ 430/270.1 |
| 6,388,101 | B1 | 5/2002 | Hada et al. |
| 6,517,994 | B2 * | 2/2003 | Watanabe ................. 430/270.1 |
| 6,639,035 | B1 * | 10/2003 | Chen et al. .................. 526/266 |
| 6,703,178 | B2 | 3/2004 | Chen et al. |
| 6,844,132 | B2 * | 1/2005 | Kodama et al. .......... 430/270.1 |
| 7,033,726 | B2 * | 4/2006 | Nishimura et al. ....... 430/270.1 |
| 2001/0026901 | A1 | 10/2001 | Maeda et al. |
| 2002/0165328 | A1 | 11/2002 | Yamamoto et al. |
| 2003/0010748 | A1 | 1/2003 | Kodama et al. |
| 2003/0013039 | A1 | 1/2003 | Kobayashi et al. |

FOREIGN PATENT DOCUMENTS

| EP | 1 179 750 A1 | 2/2002 |
| EP | 1 338 922 A2 | 8/2003 |
| EP | 1 352 904 A1 | 10/2003 |
| JP | 9-73173 A | 3/1997 |
| JP | 2000-159758 A | 6/2000 |
| JP | 2001-109154 A | 4/2001 |

OTHER PUBLICATIONS

Partial European Search Report dated Nov. 25, 2005.
European Search Report issued Jan. 30, 2008.

* cited by examiner

*Primary Examiner*—John S. Chu
(74) *Attorney, Agent, or Firm*—Sughrue Mion, PLLC

(57) ABSTRACT

A positive working photosensitive composition which is useful in the manufacturing step of a semiconductor such as IC, the manufacture of a circuit board such as liquid crystals and thermal heads, and other fabrication steps and has an excellent resolution and line edge roughness, and a method for forming a pattern using the same, are provided, which are a photosensitive composition containing (A) a resin having a repeating unit having a specific group, whose solubility in an alkaline developer increases by the action of an acid, and a method for forming a pattern using the same.

24 Claims, 1 Drawing Sheet

PHOTOSENSITIVE COMPOSITION AND METHOD FOR FORMING PATTERN USING THE SAME

BACKGROUND OF THE INVENTION

1. Field of the Invention

The present invention relates to a photosensitive composition which is useful in the manufacturing step of a semiconductor such as IC, the manufacture of a circuit board such as liquid crystals and thermal heads, and other fabrication steps and to a method for forming a pattern using the same. More specifically, the invention relates to a photosensitive composition which is suitable in the case of using far ultraviolet light of not more than 220 nm or the like as an exposure light source or using electron beams or the like as an irradiation source and to a method for forming a pattern using the same.

2. Background Art

A chemical amplification type photosensitive composition is a pattern forming material in which radiations such as far ultraviolet light are irradiated to generate an acid in the exposed area, a reaction using this acid as a catalyst changes solubility in a developer between an active radiation-irradiated area and a non-irradiated area, and a pattern is formed on a substrate.

In the case where KrF excimer laser is used as an exposure light source, since a resin comprising poly(hydroxystyrene) as a basic skeleton and having small absorption mainly in a region of 248 nm is used as the major component, the resulting system has high sensitivity and high resolution and can form a good pattern and becomes a good system as compared with the related art naphthoquinonediazide/novolak resin system.

On the other hand, in the case of using a light source with a shorter wavelength, for example, ArF excimer laser (193 nm), as an exposure light source, since a compound having an aromatic group exhibits large absorption substantially in a region of 193 nm, even the foregoing chemical amplification system was not satisfactory yet.

For that reason, there have been developed resists for ArF excimer laser containing a resin having an alicyclic hydrocarbon structure.

Furthermore, it has been found that a performance is enhanced by containing a repeating unit having a lactone structure in the foregoing resin having an alicyclic hydrocarbon structure. Patent Document 1 (JP-A-9-73173) and Patent Document 2 (U.S. Pat. No. 6,388,101B) describe resist compositions using a resin containing a repeating unit having a mevalonic lactone structure or a γ-lactone structure; and Patent Document 3 (JP-A-2000-159758), Patent Document 4 (JP-A-2001-109154), and Patent Document 5 (U.S. No. 2001-26901A) describe resist composition using a resin containing a repeating unit having an alicyclic lactone structure.

However, it is the actual situation that from the viewpoint of overall performance as a resin, it is extremely difficult to find out an adequate combination of a resin, a photo-acid generator, additives, a solvent, and so on to be used. Furthermore, in forming a fine pattern having a line width of not more than 100 nm, improvements in not only a resolution but also a line edge roughness performance of line pattern were required.

The "line edge roughness" as referred to herein means that an edge at the interface between a line pattern of the resist and a substrate exhibits a shape such that it fluctuates irregularly in the vertical direction against the line direction due to characteristics of the resist. When this pattern is observed from directly above, the edge is seen unevenly (from approximately ± several nm to several tens nm). Since this unevenness is transferred onto the substrate by an etching step, if the unevenness is large, failure of electric characteristics is caused, leading to a reduction of the yield.

SUMMARY OF THE INVENTION

Accordingly, an object of the invention is to provide a photosensitive composition which even in forming a fine pattern of not more than 100 nm, has an excellent resolution and is improved in the line edge roughness and a method for forming a pattern using the same.

The invention is concerned with a photosensitive composition as construed as set forth below and a method for forming a pattern using the same, whereby the foregoing object of the invention is achieved.

1. A photosensitive composition comprising (A) a resin increasing the solubility in an alkaline developer by the action of an acid, wherein the resin (A) comprises at least one repeating unit selected from the group consisting of:

(a) a repeating unit comprising: at least one of a hydroxyl group and a group where a hydrogen atom of a hydroxyl group is substituted with a group selected from an acyl group, an alkyl group, a cycloalkyl group and an acid decomposable group; and a group having a lactone structure; and (b) a repeating unit comprising a group having a lactone structure, in which a 5- or 6-membered ring is fused.

2. The photosensitive composition according to the item 1, wherein the resin (A) comprises a repeating unit having at least one structure selected from structures represented by the following general formulae (I) to (II):

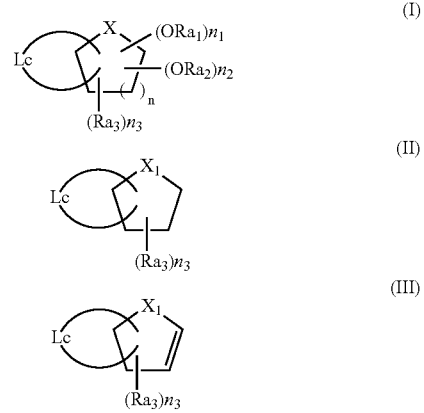

wherein
X represents —$CH_2$—, an oxygen atom, a sulfur atom, or —C(=O)—,

Lc represents a group for forming a lactone, $Ra_1$ and $Ra_2$ each independently represents a hydrogen atom, an alkyl group, a cycloalkyl group, an acyl group, or an acid decomposable group, $Ra_3$ represents a carboxyl group, an alkyl group, an alkoxy group, an acyloxy group, an alkoxycarbonyl group, or a group having an acid decomposable group, two of $Ra_1$ to $Ra_3$ may combine together to form a ring, $X_1$ represents —$CH_2$—, —$CH_2CH_2$—, —$CH_2O$—, —O—, —S—, or —$CH_2S$—, n represents an integer of 1 or 2, $n_1$ and $n_2$ each represents an integer of from 0 to 3, with proviso that $(n_1+n_2)$ represents an integer of from 1 to 6, and $n_3$ represents an integer of from 0 to 3.

3. The photosensitive composition according to the item 1, wherein the resin (A) comprises a repeating unit containing at least one structure selected from structures represented by the following general formulae (I') to (III'):

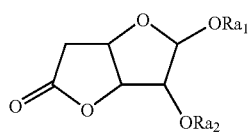

(I')

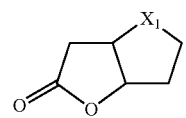

(II')

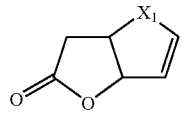

(III')

wherein $Ra_1$ and $Ra_2$ each independently represents a hydrogen atom, an alkyl group, a cycloalkyl group, an acyl group or an acid decomposable group, $Ra_1$ and $Ra_2$ may combine together to form a ring, and $X_1$ represents —$CH_2$—, —$CH_2CH_2$—, —$CH_2O$—, —O—, —S—, or —$CH_2S$—.

4. The photosensitive composition according to the item 1, wherein the resin (A) comprises at least one repeating unit selected from repeating units represented by the following general formulae (Ia) to (IIIa):

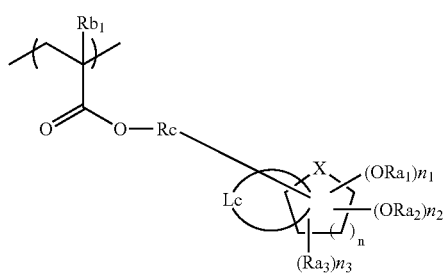

(Ia)

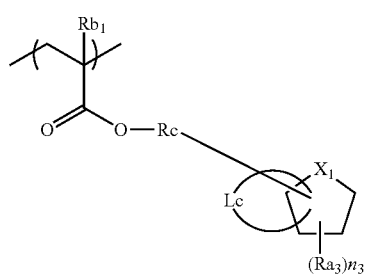

(IIa)

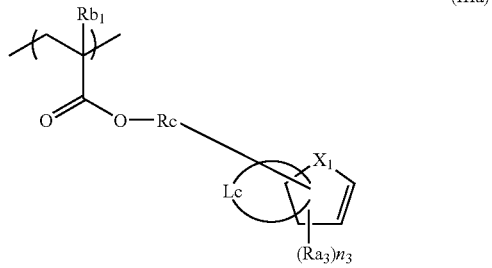

(IIIa)

wherein $Rb_1$ represents a hydrogen atom, an alkyl group, or —$CH_2$—O—$Rb_2$, wherein $Rb_2$ represents a hydrogen, atom, an alkyl group, a cycloalkyl group, an acyl group, or a group having a lactone structure, Rc represents a single bond or a divalent connecting group, X represents —$CH_2$—, an oxygen atom, a sulfur atom, or —C(=O)—, Lc represents a group for forming a lactone, $Ra_1$ and $Ra_2$ each independently represents a hydrogen atom, an alkyl group, a cycloalkyl group, an acyl group, or an acid decomposable group, $Ra_3$ represents a carboxyl group, an alkyl group, an alkoxy group, an acyloxy group, an alkoxycarbonyl group, or a group having an acid decomposable group, two of $Ra_1$ to $Ra_3$ may combine together to form a ring, $X_1$ represents —$CH_2$—, —$CH_2CH_2$—, —$CH_2O$—, —O—, —S—, or —$CH_2S$—, n represents an integer of 1 or 2, $n_1$ and $n_2$ each represents an integer of from 0 to 3, with proviso that $(n_1+n_2)$ represents an integer of from 1 to 6, and $n_3$ represents an integer of from 0 to 3.

5. The photosensitive composition according to the item 1, wherein the resin (A) comprises at least one repeating unit selected from repeating units represented by the following general formulae (Ia-1) to (IIIa-1):

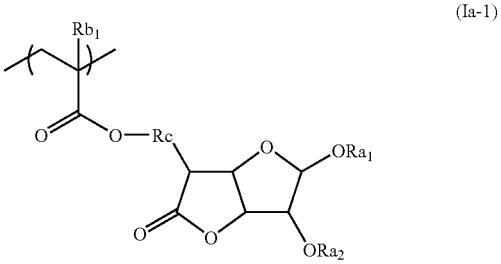

(Ia-1)

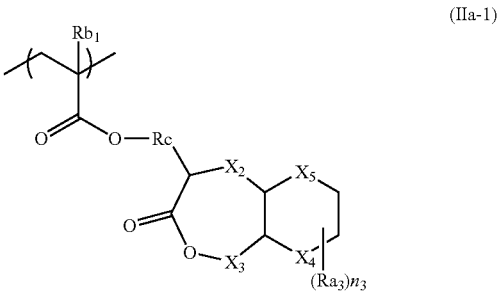

(IIa-1)

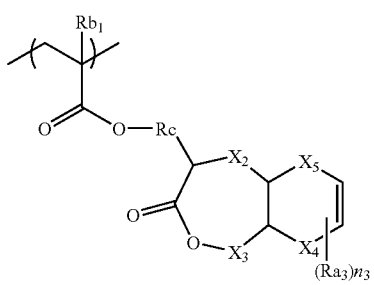
(IIIa-1)

wherein

Rb$_1$ represents a hydrogen atom, an alkyl group, or —CH$_2$—O—Rb$_{2a}$, wherein Rb$_{2a}$ represents a hydrogen atom, an alkyl group, a cycloalkyl group, an acyl group, or a group having a lactone structure;

Rc represents a single bond or a divalent connecting group,

Ra$_1$ and Ra$_2$ each independently represents a hydrogen atom, an alkyl group, a cycloalkyl group, an acyl group, or an acid decomposable group, Ra$_3$ represents a carboxyl group, an alkyl group, an alkoxy group, an acyloxy group, an alkoxycarbonyl group, or a group having an acid decomposable group, two of Ra$_1$ to Ra$_3$ may combine together to form a ring, X$_2$ represents a single bond or —CH$_2$—, X$_3$ represents a single bond or —CH$_2$—, X$_4$ represents a single bond, —CH$_2$—, —CH$_2$CH$_2$—, —CH$_2$O—, —O—, —S—, or —CH$_2$S—, X$_5$ represents a single bond, —CH$_2$—, —CH$_2$CH$_2$—, —CH$_2$O—, —O—, —S—, or —CH$_2$S—, the sum of the number of atoms exclusive of a hydrogen atom of X$_4$ and X$_5$ is 1 or 2, and n$_3$ represents an integer of from 0 to 3.

6. The photosensitive composition according to the item 1, wherein the resin (A) comprises at least one repeating unit selected from repeating units represented by the following general formulae (Ia"), (IIa'), (IIa"), (IIIa') and (IIIa"):

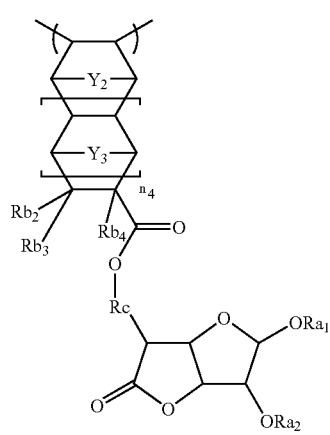
(Ia")

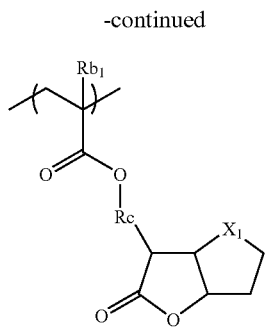
(IIa')

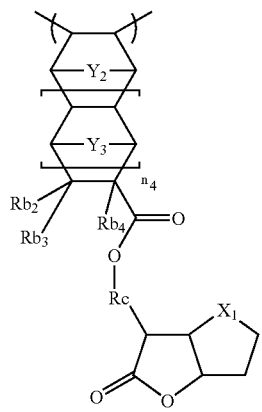
(IIa")

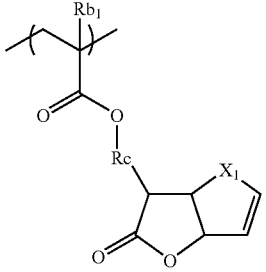
(IIIa')

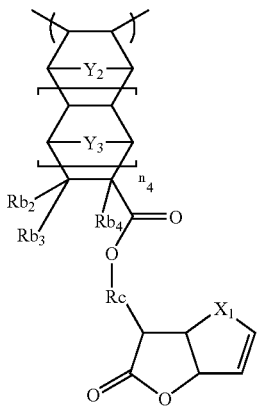
(IIIa")

wherein

Rb$_1$ represents a hydrogen atom, an alkyl group, or —CH$_2$—O—Rb$_2$a, wherein Rb$_2$a represents a hydrogen atom, an alkyl group, a cycloalkyl group, an acyl group, or a group having a lactone structure, Rc represents a single bond or a divalent connecting group, Ra$_1$ and Ra$_2$ each independently represents a hydrogen atom, an alkyl group, a cycloalkyl group, an acyl group, or an acid decomposable group, Ra$_1$ and Ra$_2$ may combine together to form a ring, X$_1$ represents —CH$_2$—, —CH$_2$CH$_2$—, —CH$_2$O—, —O—, —S—, or —CH$_2$S—, Y$_2$ and Y$_3$ each independently represents —CH$_2$—, —CH$_2$CH$_2$—, —O—, or —S—, Rb$_2$, Rb$_3$, and Rb$_4$ each independently represents a hydrogen atom, an alkyl group, a hydroxyl group, a carboxyl group, or an alkoxycarbonyl group, n$_4$ represents 0 or 1.

7. A resin having at least one repeating unit selected from repeating units having a structure represented by the following general formulae (I') to (III'):

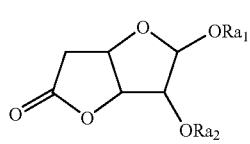
(I')

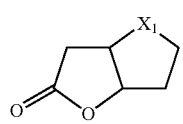
(II')

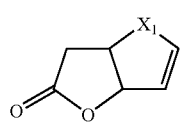
(III')

wherein

Ra$_1$ and Ra$_2$ each independently represents a hydrogen atom, an alkyl group, a cycloalkyl group, an acyl group, or an acid decomposable group, Ra$_1$ and Ra$_2$ may combine together to form a ring, and X$_1$ represents —CH$_2$—, —CH$_2$CH$_2$—, —CH$_2$O—, —O—, —S—, or —CH$_2$S—.

8. A resin having at least one repeating unit selected from repeating units represented by the following general formulae (Ia) to (IIa):

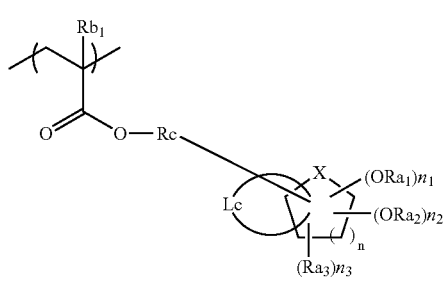
(Ia)

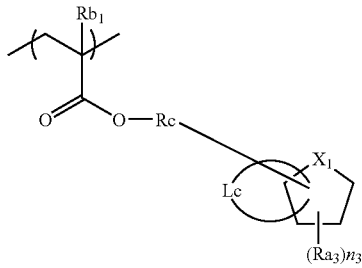
(IIa)

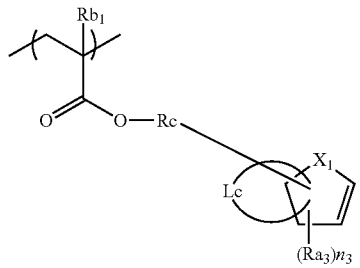
(IIIa)

wherein

Rb$_1$ represents a hydrogen atom, an alkyl group, or —CH$_2$—O—Rb$_{2a}$, wherein Rb$_{2a}$ represents a hydrogen atom, an alkyl group, a cycloalkyl group, an acyl group, or a group having a lactone structure, Rc represents a single bond or a divalent connecting group, X represents —CH$_2$—, an oxygen atom, a sulfur atom, or —C(=O)—, Lc represents a group for forming a lactone, Ra$_1$ and Ra$_2$ each independently represents a hydrogen atom, an alkyl group, a cycloalkyl group, an acyl group, or an acid decomposable group, Ra$_3$ represents a carboxyl group, an alkyl group, an alkoxy group, an acyloxy group, an alkoxycarbonyl group, or a group having an acid decomposable group, two of Ra$_1$ to Ra$_3$ may combine together to form a ring, X$_1$ represents —CH$_2$—, —CH$_2$CH$_2$—, —CH$_2$O—, —O—, —S—, or —CH$_2$S—, n represents an integer of 1 or 2, n$_1$ and n$_2$ each represents an integer of from 0 to 3, with proviso that (n$_1$+n$_2$) represents an integer of from 1 to 6, and n$_3$ represents an integer of from 0 to 3.

9. A resin having at least one repeating unit selected from repeating units represented by the following general formulae (Ia'), (Ia"), (IIa'), (IIa"), (IIIa') and (IIIa"):

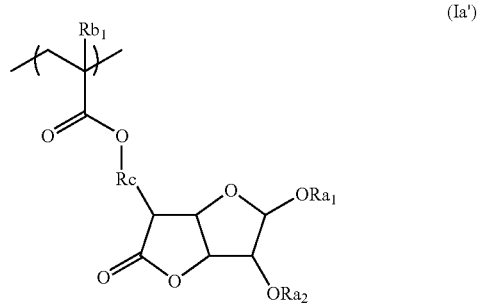
(Ia')

(Ia'')

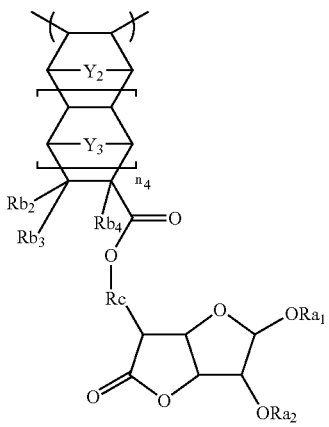

(IIa')

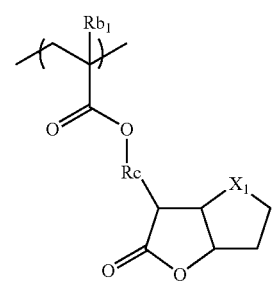

(IIa'')

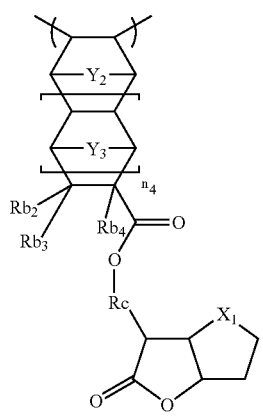

(IIIa')

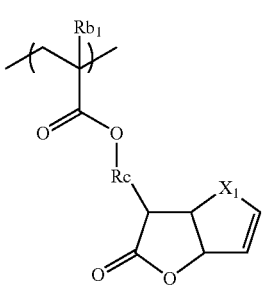

-continued (IIIa'')

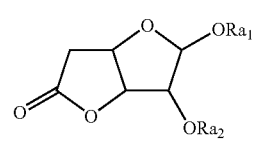

wherein $Rb_1$ represents a hydrogen atom, an alkyl group, or —$CH_2$—O—$Rb_{2a}$, wherein $Rb_{2a}$ represents a hydrogen atom, an alkyl group, a cycloalkyl group, an acyl group, or a group having a lactone structure, Rc represents a single bond or a divalent connecting group, $Ra_1$ and $Ra_2$ each independently represents a hydrogen atom, an alkyl group, a cycloalkyl group, an acyl group, or an acid decomposable group, $Ra_1$ and $Ra_2$ may combine together to form a ring, $X_1$ represents —$CH_2$—, —$CH_2CH_2$—, —$CH_2O$—, —O—, —S—, or —$CH_2S$—, $Y_2$ and $Y_3$ each independently represents —$CH_2$—, —$CH_2CH_2$—, —O—, or —S—, $Rb_2$, $Rb_3$, and $Rb_4$ each independently represents a hydrogen atom, an alkyl group, a hydroxyl group, a carboxyl group, or an alkoxycarbonyl group, and $n_4$ represents 0 or 1.

10. A polymerizable compound containing a structure represented by any one of the following general formulae (I') to (III'):

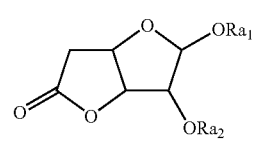

I'

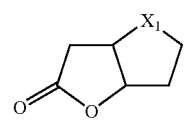

II'

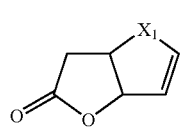

III' wherein

Ra$_1$ and Ra$_2$ each independently represents a hydrogen atom, an alkyl group, a cycloalkyl group, an acyl group, or an acid decomposable group, Ra$_1$ and Ra$_2$ may combine together to form a ring, and X$_1$ represents —CH$_2$—, —CH$_2$CH$_2$—, —CH$_2$O—, —O—, —S—, or —CH$_2$S—.

11. A polymerizable compound represented by any one of the following general formulae (Ib) to (IIIb):

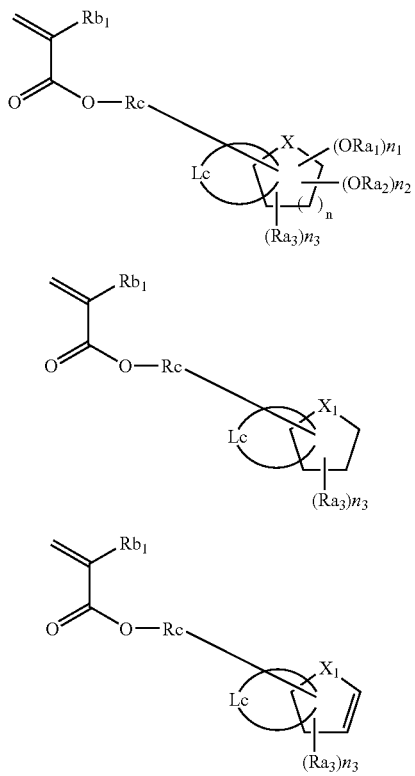

wherein

Rb$_1$ represents a hydrogen atom, an alkyl group, or —CH$_2$—O—Rb$_{2a}$, wherein Rb$_{2a}$ represents a hydrogen atom, an alkyl group, a cycloalkyl group, an acyl group, or a group having a lactone structure, Rc represents a single bond or a divalent connecting group, X represents —CH$_2$—, an oxygen atom, a sulfur atom, or —C(=O)—, Lc represents a group for forming a lactone, Ra$_1$ and Ra$_2$ each independently represents a hydrogen atom, an alkyl group, a cycloalkyl group, an acyl group, or an acid decomposable group, Ra$_3$ represents a carboxyl group, an alkyl group, an alkoxy group, an acyloxy group, an alkoxycarbonyl group, or a group having an acid decomposable group, two of Ra$_1$ to Ra$_3$ may combine together to form a ring, X$_1$ represents —CH$_2$—, —CH$_2$CH$_2$—, —CH$_2$O—, —O—, —S—, or —CH$_2$S—, n represents an integer of 1 or 2, n$_1$ and n$_2$ each represents an integer of from 0 to 3, with proviso that (n$_1$+n$_2$) represents an integer of from 1 to 6, and n$_3$ represents an integer of from 0 to 3.

12. A polymerizable compound represented by any one of the following general formulae (Ib'), (Ib"), (IIb'-1), (IIb'-1), (IIIb'-1) and (IIIb"-1):

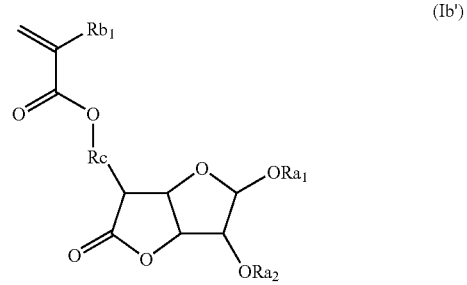

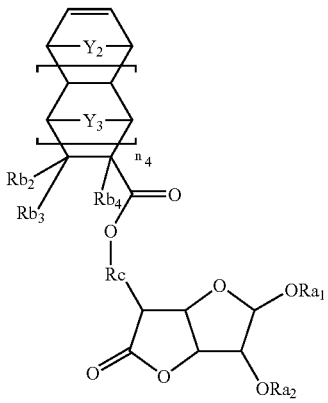

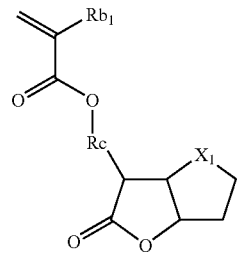

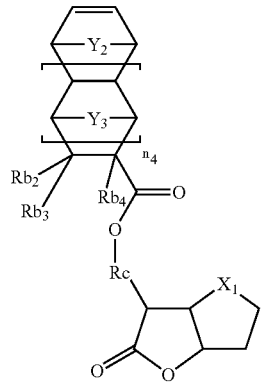

-continued

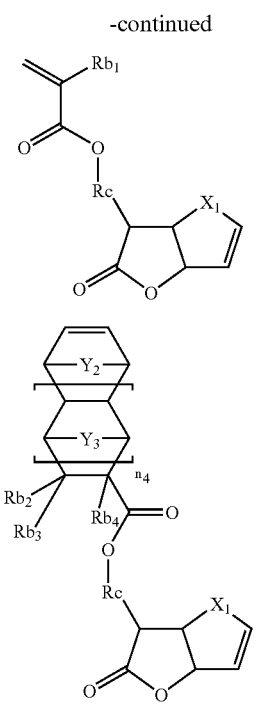

(IIIb'-1)

(IIIb''-1)

wherein

Rb$_1$ represents a hydrogen atom, an alkyl group, or —CH$_2$—O—Rb$_{2a}$, wherein Rb$_{2a}$ represents a hydrogen atom, an alkyl group, a cycloalkyl group, an acyl group, or a group having a lactone structure, Rc represents a single bond or a divalent connecting group, Ra$_1$ and Ra$_2$ each independently represents a hydrogen atom, an alkyl group, a cycloalkyl group, an acyl group, or an acid decomposable group, Ra$_1$ and Ra$_2$ may combine together to form a ring, X$_1$ represents —CH$_2$—, —CH$_2$CH$_2$—, —CH$_2$O—, —O—, —S—, or —CH$_2$S—, Y$_2$ and Y$_3$ each independently represents —CH$_2$—, —CH$_2$CH$_2$—, —O—, or —S—, Rb$_2$, Rb$_3$, and Rb$_4$ each independently represents a hydrogen atom, an alkyl group, a hydroxyl group, a carboxyl group, or an alkoxycarbonyl group, and n$_4$ represents 0 or 1.

13. A method for forming a pattern, which comprises: forming a film from the photosensitive composition according to any one of the items 1 to 6; exposing the film; and then developing the exposed film.

According to the invention, it is possible to provide a photosensitive composition which even in forming a fine pattern of not more than 100 nm, has an excellent resolution and is improved in the line edge roughness and a method for forming a pattern using the same.

Figure 1:
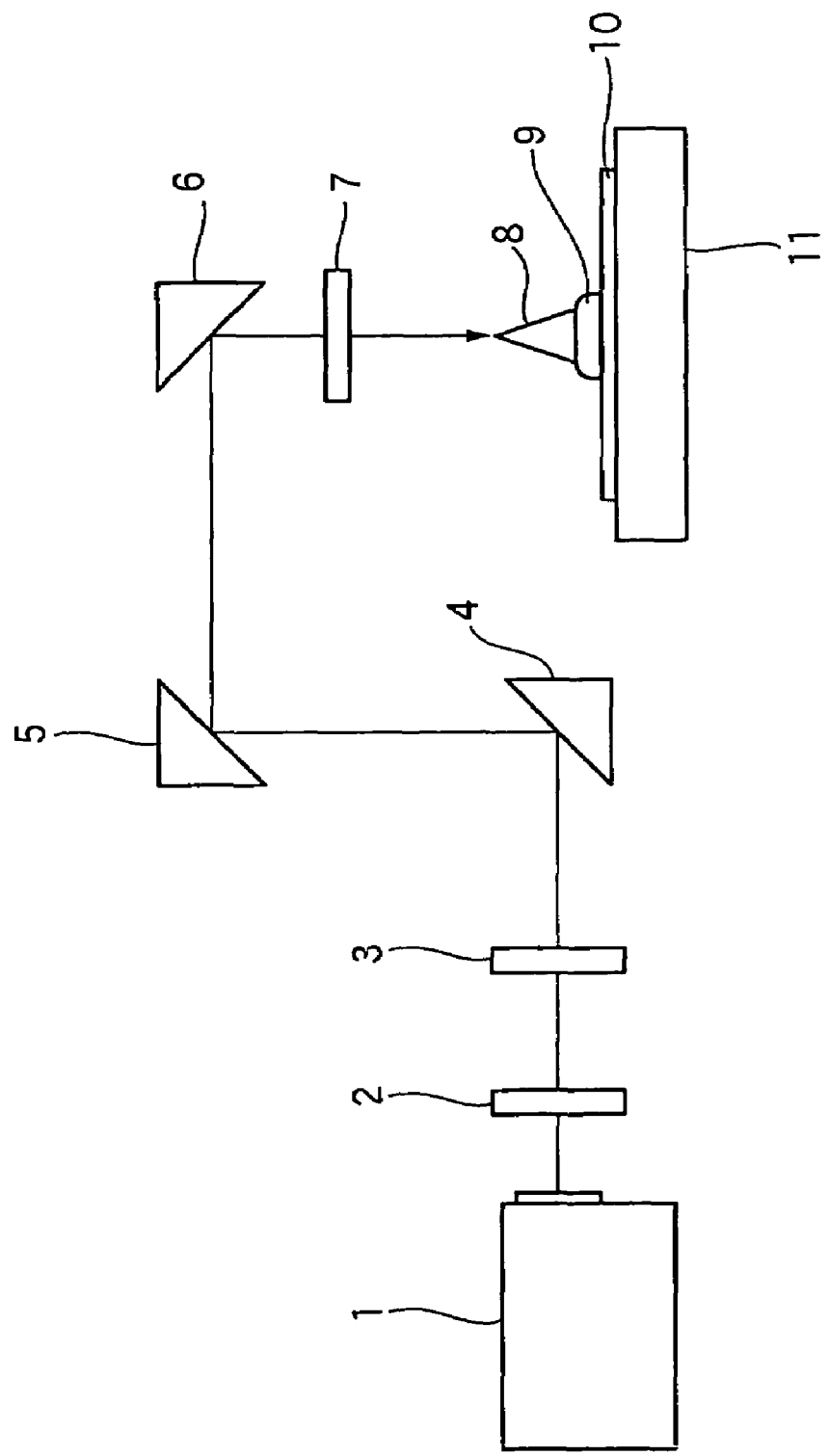
FIG. 1 is a schematic view of a double-beam interference exposure device.

Description of Reference Numerals and Signs
1: Laser
2: Diaphragm
3: Shutter
4, 5, 6: Reflection mirror
7: Condenser lens
8: Prism
9: Liquid immersion liquid
10: Wafer having antireflection film and resist film
11: Wafer stage

DETAILED DESCRIPTION OF THE INVENTION

Incidentally, in this specification, in the expressions of groups (atomic groups), the expression which does not describe "substituted" or "unsubstituted" includes both one having a substituent and one not having a substituent. For example, the term "alkyl group" includes not only an alkyl group not having a substituent (unsubstituted alkyl group) but also an alkyl group having a substituent (substituted alkyl group).

The invention will be hereunder described in detail.

[1] (A) a resin increasing the solubility in an alkaline developer by the action of an acid, wherein the resin (A) comprises at least one repeating unit selected from the group consisting of: (a) a repeating unit comprising: at least one of a hydroxyl group and a group where a hydrogen atom of a hydroxyl group is substituted with a group selected from an acyl group, an alkyl group, a cycloalkyl group and an acid decomposable group; and a group having a lactone structure; and (b) a repeating unit comprising a group having a lactone structure, in which a 5- or 6-membered ring is fused The photosensitive composition of the invention contains a resin (A), whose solubility in an alkaline developer increases by the action of an acid, the resin (A) having at least one repeating unit selected from the group consisting of (a) a repeating unit comprising: at least one of a hydroxyl group and a group where a hydrogen atom of a hydroxyl group is substituted with a group selected from an acyl group, an alkyl group, a cycloalkyl group and an acid decomposable group; and a group having a lactone structure in the same repeating unit (this repeating unit will be also hereinafter referred to as "repeating unit (a)"); and a repeating unit having a group having a laotone structure having a 5- or 6-membered ring fused therein (this repeating unit will be also hereinafter referred to as "repeating unit (b)").

In the repeating unit (a), as the acyl group as the substituent of the hydroxyl group, an acyl group having from 2 to 20 carbon atoms is enumerated. Examples thereof include acyl groups having a chain hydrocarbon group such as an acetyl group and a propionyl group; and acyl groups having a monocyclic or polycyclic cyclic hydrocarbon group such as a cyclohexanecarbonyl group and an adamantanecarbonyl group.

As the alkyl group as the substituent of the hydroxyl group, an alkyl group having from 1 to 20 carbon atoms is enumerated. Examples thereof include linear or branched chain alkyl groups such as a methyl group, an ethyl group, a propyl group, a butyl group, an octyl group, and a dodecyl group.

As the cycloalkyl group as the substituent of the hydroxyl group, a cycloalkyl group having from 3 to 20 carbon atoms is enumerated. Examples thereof include monocyclic cycloalkyl groups such as a cyclopentyl group and a cyclohexyl group; and polycyclic cycloalkyl groups such as an adamantyl group, a norbornyl group, and a tetracyclodecanyl group.

As the acid decomposable group as the substituent of the hydroxyl group, a group having a structure in which the hydroxyl group is protected by an acid decomposable protective group, such as an acetal group, a ketal group, a silyl ether group, and a tertiary alkyloxycarbonyl group, can be enumerated. Alternatively, the acid decomposable group may be substituted on a hydrogen atom of the hydroxyl group via a connecting group.

The acid decomposable group is preferably a group in which hydrogen atoms of the two adjacent hydroxyl groups (that is, $Ra_1$ and $Ra_2$ as described later, hereinafter the same) are taken together to form a cyclic acetal or cyclic ketal structure; more preferably a 5-membered ring ketal structure; and further preferably a group in which hydrogen atoms of the two adjacent hydroxyl groups are taken together to form a 2,2-dialkyl-1,3-dioxolane structure. The two alkyl groups on the oxolane may combine together to form a monocyclic or polycyclic structure.

In the invention, hydrogen atoms of the two adjacent hydroxyl groups may be substituted with a common alkyl group or cycloalkyl group, etc.

As the lactone structure, any structure can be used so far as it has a lactone structure. The lactone structure is preferably a 5-membered ring or 6-membered ring lactone structure. The lactone structure moiety may or may not have a substituent. Preferred examples of the substituent include an alkyl group having from 1 to 8 carbon atoms, a cycloalkyl group having from 4 to 7 carbon atoms, an alkoxy group having from 1 to 8 carbon atoms, an alkoxycarbonyl group having from 1 to 8 carbon atoms, a carboxyl group, and a cyano group.

As the preferred lactone structure, lactone structures represented by the following (LC1-1) to (LC1-12) can be enumerated. These may have the foregoing substituents.

LC1-1

LC1-2

LC1-3

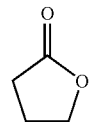

LC1-4

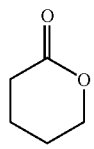

LC1-5

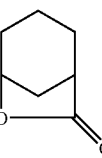

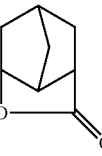

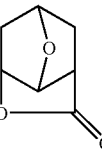

-continued

LC1-6

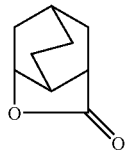

LC1-7

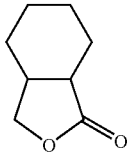

LC1-8

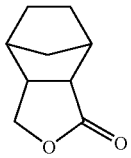

LC1-9

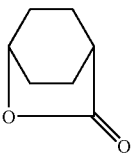

LC1-10

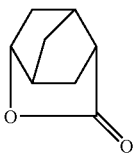

LC1-11

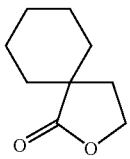

LC1-12

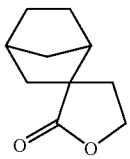

As the structure having: at least one of a hydroxyl group and a group in which a hydrogen atom of a hydroxyl group is substituted with a group selected from an acyl group, an alkyl group, a cycloalkyl group and an acid decomposable group; and a lactone structure in the same structure, a structure represented by the following general formula (I) can be preferably enumerated, more preferably, a structure represented by the following general formula (I'), still more preferably, a structure represented by the following general formula (I'-1) can be enumerated.

(I)

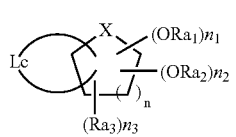

-continued

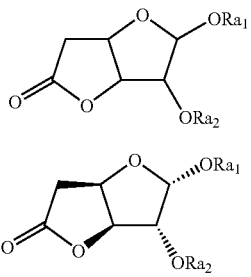
(I')

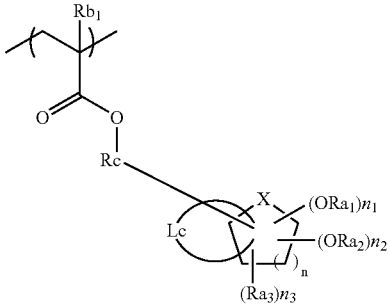
(Ia)

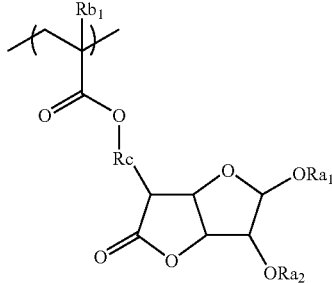
(Ia')

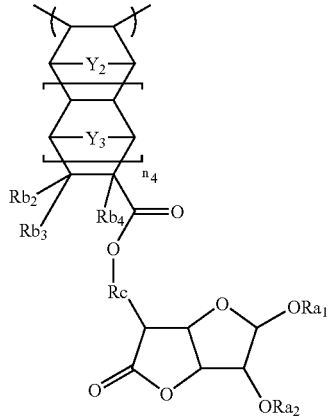
(Ia")

In the general formulae (I), (I') and (I'-1),

X represents —$CH_2$—, an oxygen atom, a sulfur atom, or —C(=O)—,

Lc represents a group for forming a lactone, $Ra_1$ and $Ra_2$ each independently represents a hydrogen atom, an alkyl group, a cycloalkyl group, an acyl group, or an acid decomposable group, $Ra_3$ represents a carboxyl group, an alkyl group, an alkoxy group, an acyloxy group, an alkoxycarbonyl group, or a group having an acid decomposable group, two of $Ra_1$ to $Ra_3$ may combine together to form a ring, n represents an integer of 1 or 2, $n_1$ and $n_2$ each represents an integer of from 0 to 3, with proviso that ($n_1+n_2$) represents an integer of from 1 to 6, and $n_3$ represents an integer of from 0 to 3.

The lactone in Lc is the same as the foregoing lactone structure.

The alkyl group, cycloalkyl group, acyl group and acid decomposable group in $Ra_1$ and $Ra_2$ are the same as the alkyl group, cycloalkyl group, acyl group and acid decomposable group, respectively as enumerated previously as the substituent of the hydroxyl group.

The alkyl group of $Ra_3$ and alkyl group in the alkoxy group and alkoxycarbonyl group of $Ra_3$ are the same as the foregoing alkyl group.

The acyl group in the acyloxy group of $Ra_3$ is the same as the foregoing acyl group.

As the group which two of $Ra_1$ to $Ra_3$ are taken together to form, for example, a hydrocarbon group having from 3 to 20 carbons can be enumerated, and it may have an oxygen atom.

Preferably, $Ra_1$ and $Ra_2$ combine together to form a cyclic acetal or cyclic ketal structure. As a group formed by binding of $Ra_1$ and $Ra_2$, an isopropyridene group, cyclopentylidene group, cyclohexylidene group, and adamantyliene group are preferably exemplified.

Examples of the repeating unit having the structure of the general formula (I) include (meth)acrylic ester derivatives, (meth)acrylamide derivatives, vinyl ether derivatives, olefin derivatives, and styrene derivatives, each having the structure of the general formula (I). Of these, (meth)acrylic ester derivatives are preferable; a repeating unit represented by the following general formula (Ia) is more preferable; and a repeating unit represented by the following general formula (Ia') is further preferable. Cycloolefin derivatives represented by the following general formula (Ia") are also preferable.

In the general formulae (Ia), (Ia') and (Ia"), $Rb_1$ represents a hydrogen atom, an alkyl group, or —$CH_2$—O—$Rb_{2a}$, wherein $Rb_{2a}$ represents a hydrogen atom, an alkyl group, a cycloalkyl group, an acyl group, or a group having a lactone structure, Rc represents a single bond or a divalent connecting group, X represents —$CH_2$—, an oxygen atom, a sulfur atom, or —C(=O)—, Lc represents a group for forming a lactone, $Ra_1$ and $Ra_2$ each independently represents a hydrogen atom, an alkyl group, a cycloalkyl group, an acyl group, or an acid decomposable group, $Ra_3$ represents a carboxyl group, an alkyl group, an alkoxy group, an acyloxy group, an alkoxycarbonyl group, or a group having an acid decomposable group, two of $Ra_1$ to $Ra_3$ may be taken together to form a ring or an acid decomposable group, $Y_2$ and $Y_3$ each independently represents —$CH_2$—, —$CH_2CH_2$—, —O—, or —S—, $Rb_2$, $Rb_3$, and $Rb_4$ each independently represents a hydrogen atom, an alkyl group, a hydroxyl group, a carboxyl group, or an alkoxycarbonyl group, and the alkyl group may be substituted with a fluorine atom or the like, n represents an integer of 1 or 2, $n_1$ and $n_2$ each represents an integer of from 0 to 3, with proviso that $(n_1+n_2)$ represents an integer of from 1 to 6, $n_3$ represents an integer of from 0 to 3, and $n_4$ represents 0 or 1.

The alkyl group of $Rb_1$ and $Rb_2$ to $Rb_4$ is preferably a linear or branched alkyl group having from 1 to 5 carbon atoms, and examples thereof include a methyl group, an ethyl group, a propyl group, an n-butyl group, a sec-butyl, and a t-butyl group. The alkyl group of $Rb_1$ and $Rb_2$ to $Rb_4$ may have a substituent. Examples of the substituent of the alkyl group of $Rb_1$ and $Rb_2$ to $Rb_4$ include a fluorine atom, a chlorine atom, and a hydroxyl group.

Examples of the alkyl group, cycloalkyl group and acyl group in $Rb_{2a}$ include those which are the same as in the alkyl group, cycloalkyl group and acyl group, respectively as enumerated previously as the substituent of the hydroxyl group.

Examples of the lactone in the group having a lactone structure of $Rb_{2a}$ include those which are the same as in the foregoing lactone structure.

Examples of the divalent connecting group of Rc include an alkylene group, a cycloalkylene group, $—CO_2—$, and a connecting group composed of a plurality of these groups.

The alkyl group, cycloalkyl group and acyl group of $Rb_2$, the group having a lactone structure of $Rb_{2a}$, and the divalent connecting group of Rc may have a substituent. Examples of the substituent of the alkyl group, cycloalkyl group and acyl group of $Rb_{2a}$, the group having a lactone structure of $Rb_{2a}$, and the divalent connecting group of Rc include a fluorine atom, a chlorine atom, and a hydroxyl group.

As the divalent connecting group of Rc, an alkylcarboxyl connecting group or cycloalkylcarboxyl connecting group resulting from connection of an alkylene group or a cycloalkylene group and a $—CO_2—$ group is preferable; and a polycyclic cycloalkylcarboxyl connecting group is more preferable. Specific examples thereof include an adamantylcarboxyl connecting group and a norbornanecarboxyl group.

As Rc, a single bond is especially preferable. When Rc is a single bond, a glass transition temperature of the resin can be adjusted at a proper temperature so that an exposure latitude is enhanced.

In the repeating unit having the structure of the general formula (I), repeating units having a lactone structure having a specific stereostructure represented by the following general formula (Ia'-1) or (Ia"-1) can be enumerated as the especially preferred repeating unit. By using a lactone having such a specific stereostructure, a resolving power and a line edge roughness are improved.

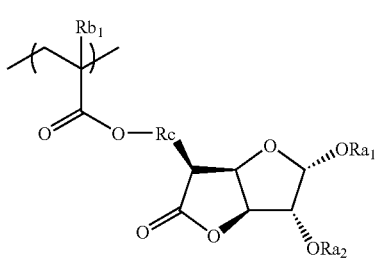

(Ia'-1)

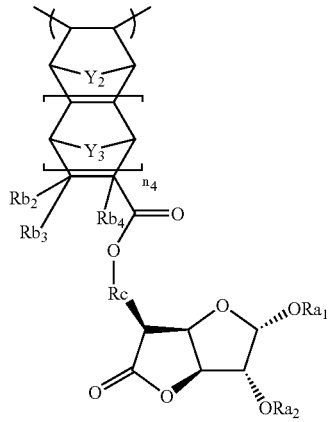

(Ia"-1)

$Rb_1$, Rc, $Ra_1$, and $Ra_2$ in the general formula (Ia'-1) are synonymous with $Rb_1$, Rc, $Ra_1$, and $Ra_2$, respectively in the general formula (Ia).

$Y_2$, $Y_3$, $Rb_2$, $Rb_3$, $Rb_4$, Rc, $Ra_1$, $Ra_2$, and $n_4$ in the general formula (Ia"-1) are synonymous with $Y_2$, $Y_3$, $Rb_2$, $Rb_3$, $Rb_4$, Rc, $Ra_1$, $Ra_2$, and $n_4$, respectively in the general formula (Ia")

Preferred specific examples of the repeating unit (a) will be given below.

Incidentally, in the following specific examples, plural optical isomers can be included, and a single optical isomer may be used. Though a mixture of plural optical isomers may be used, it is preferred to use a single optical isomer.

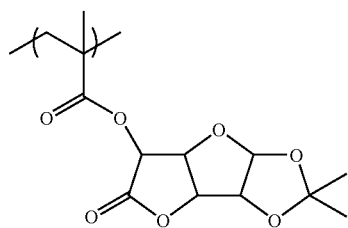

I-1

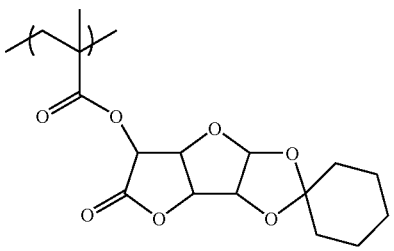

I-2

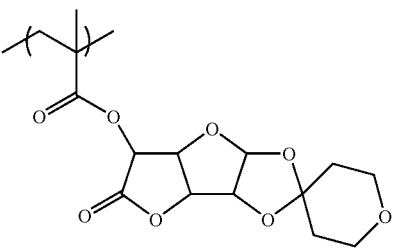

I-3

-continued
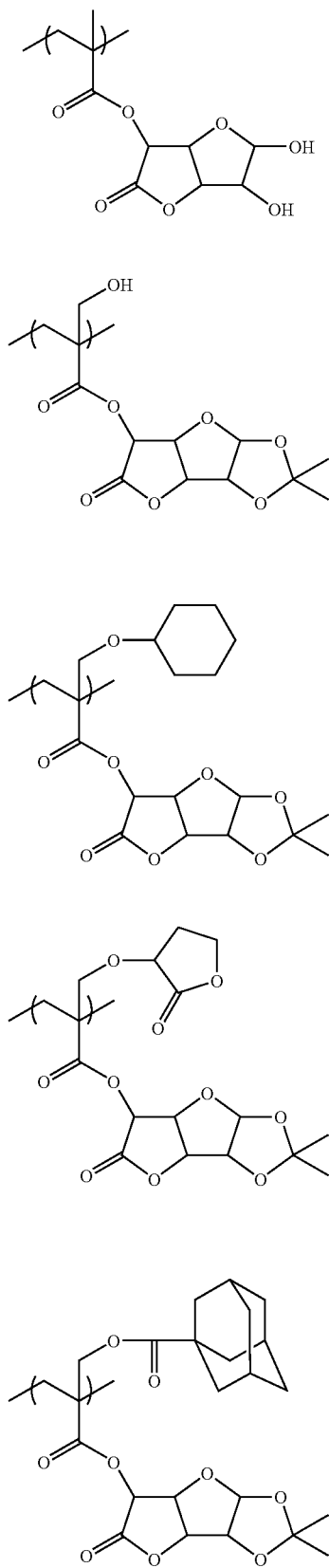
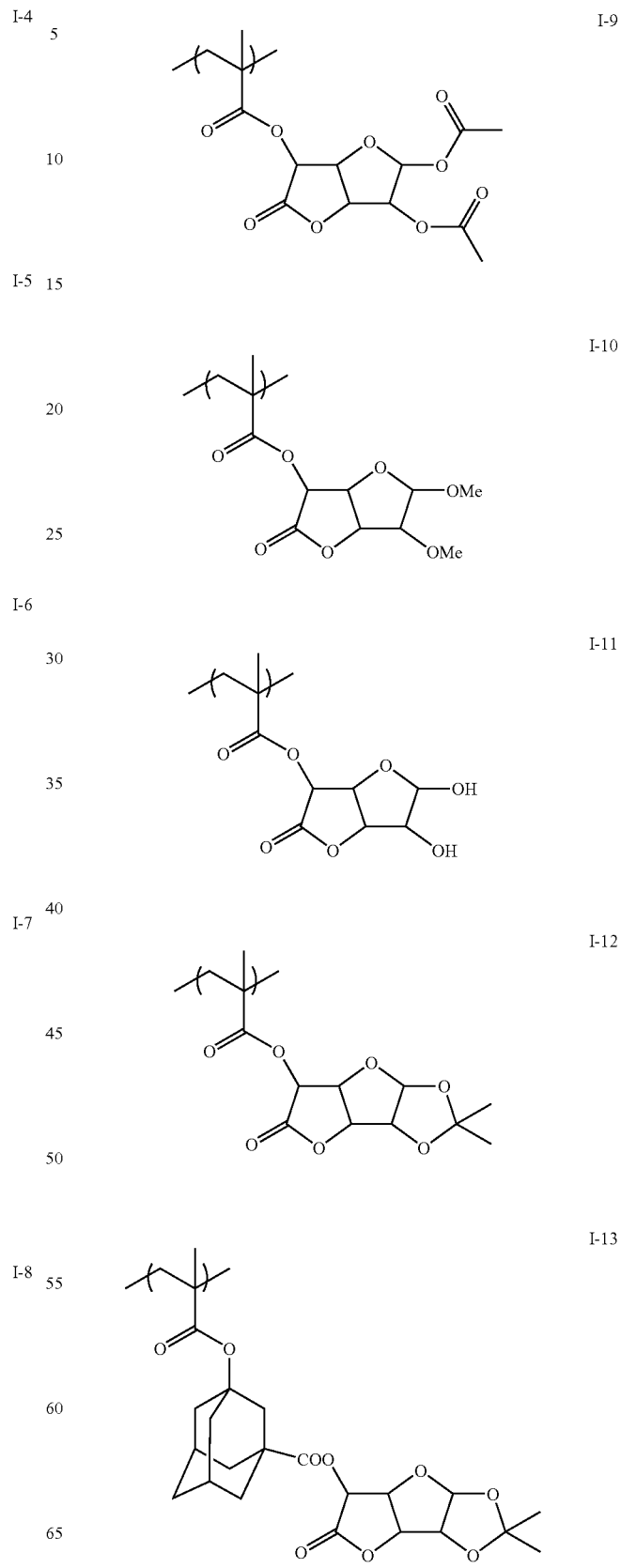

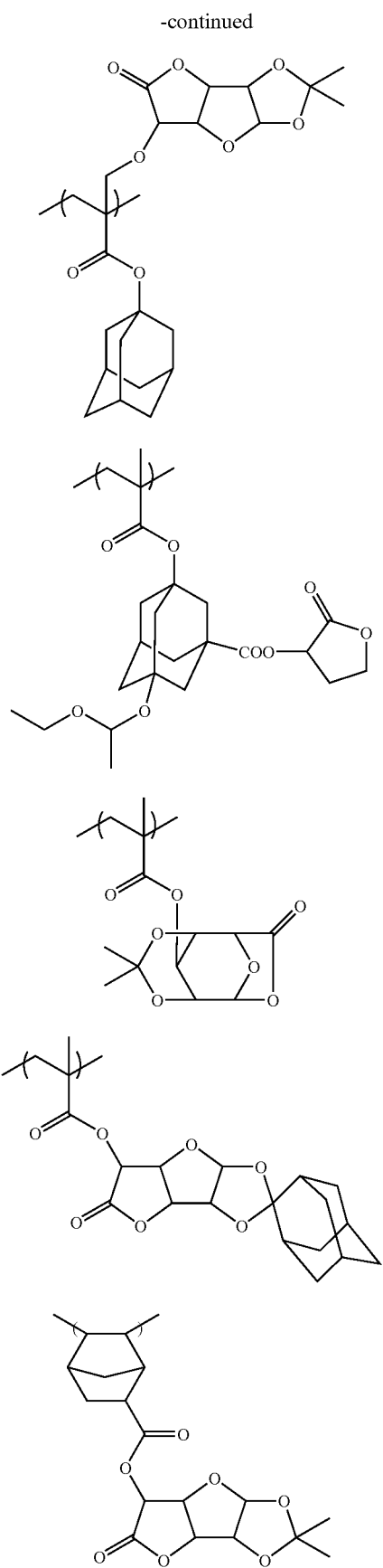
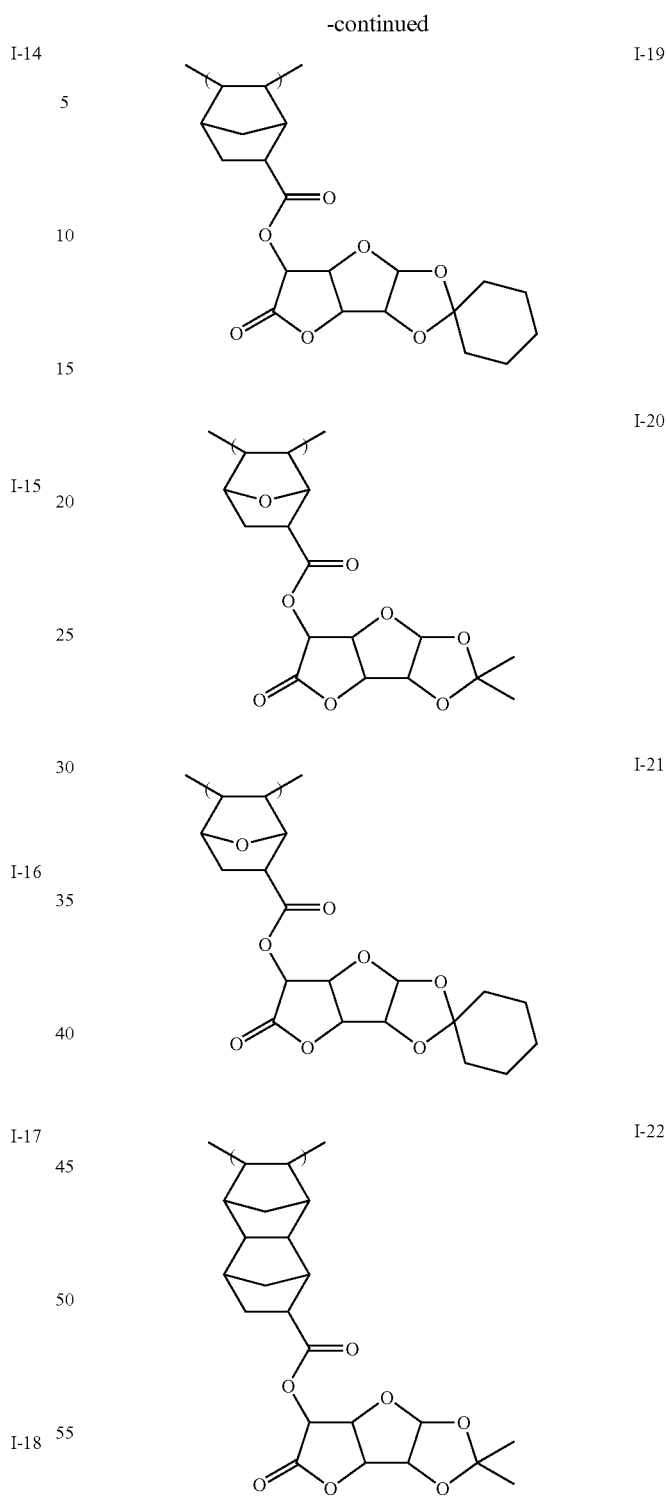

As the monomer corresponding to the repeating unit (a), a monomer represented by the following general formula (Ib) is preferable; a monomer represented by the following general formula (Ib') or (Ib") is more preferable; and a monomer having a lactone structure having a specific stereostructure represented by the following general formula (Ib'-1) or (Ib"-1) is further preferable.

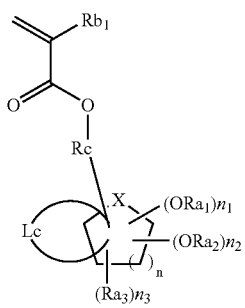
(Ib)

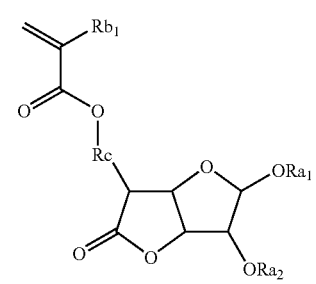
(Ib')

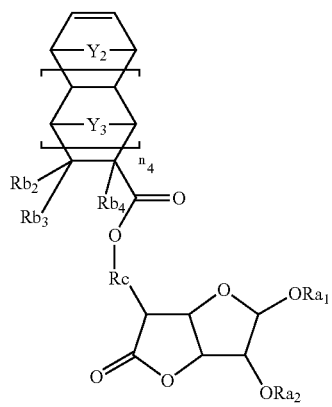
(Ib")

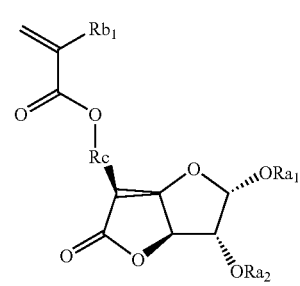
(Ib'-1)

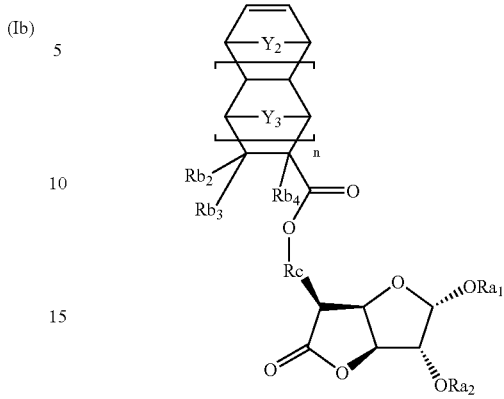
(Ib"-1)

In the general formulae (Ib), (Ib'), (Ib"), (Ib'-1) and (Ib"-1), $Rb_1$ represents a hydrogen atom, an alkyl group, or —$CH_2$—O—$Rb_{2a}$, wherein $Rb_{2a}$ represents a hydrogen atom, an alkyl group, a cycloalkyl group, an acyl group, or a group having a lactone structure, Rc represents a single bond or a divalent connecting group, X represents —$CH_2$—, an oxygen atom, a sulfur atom, or —C(=O)—, Lc represents a group for forming a lactone, $Ra_1$ and $Ra_2$ each independently represents a hydrogen atom, an alkyl group, a cycloalkyl group, an acyl group, or an acid decomposable group, $Ra_3$ represents a carboxyl group, an alkyl group, an alkoxy group, an acyloxy group, an alkoxycarbonyl group, or a group having an acid decomposable group, two of $Ra_1$ to $Ra_3$ may be taken together to form a ring or an acid decomposable group, $Y_2$ and $Y_3$ each independently represents —$CH_2$—, —$CH_2CH_2$—, —O—, or —S—, $Rb_2$, $Rb_3$, and $Rb_4$ each independently represents a hydrogen atom, an alkyl group, a hydroxyl group, a carboxyl group, or an alkoxycarbonyl group, and the alkyl group may be substituted with a fluorine atom or the like, n represents an integer of 1 or 2, $n_1$ and $n_2$ each represents an integer of from 0 to 3, with proviso that ($n_1+n_2$) represents an integer of from 1 to 6, $n_3$ represents an integer of from 0 to 3, and $n_4$ represents 0 or 1.

Preferred specific examples of the monomer corresponding to the repeating unit (a) will be given below.

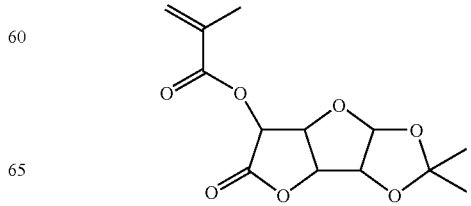
Ib-1

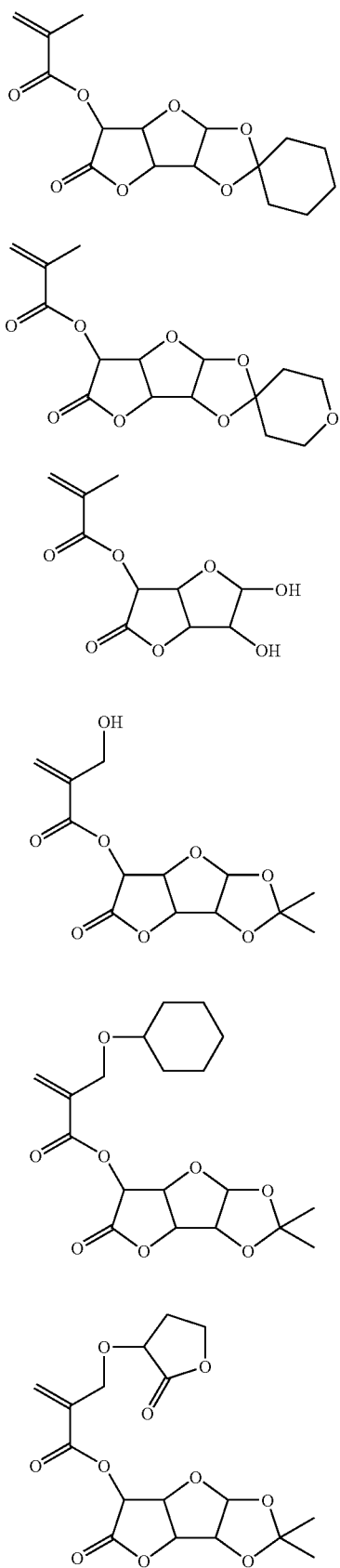
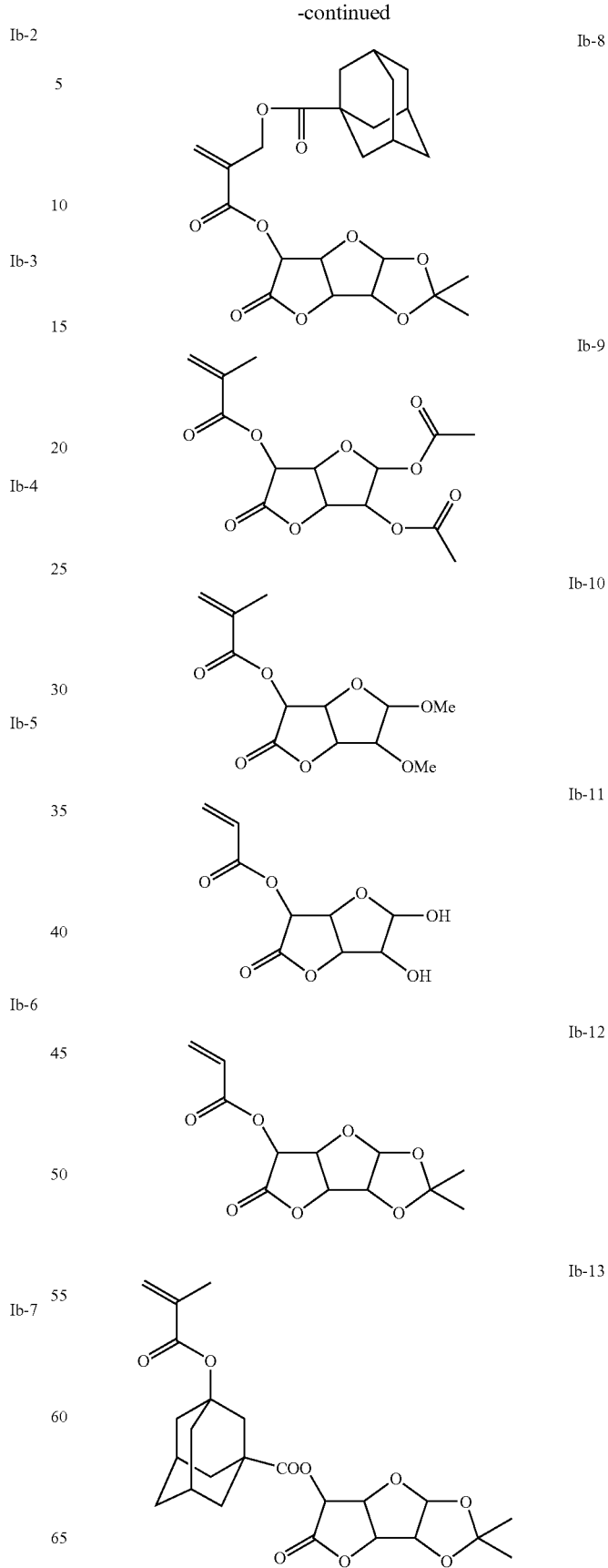

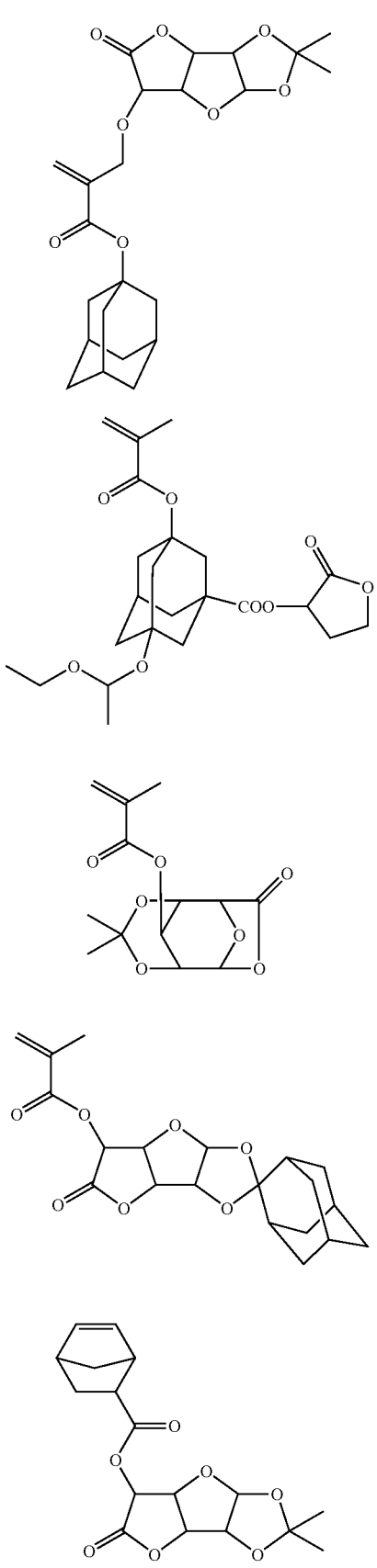
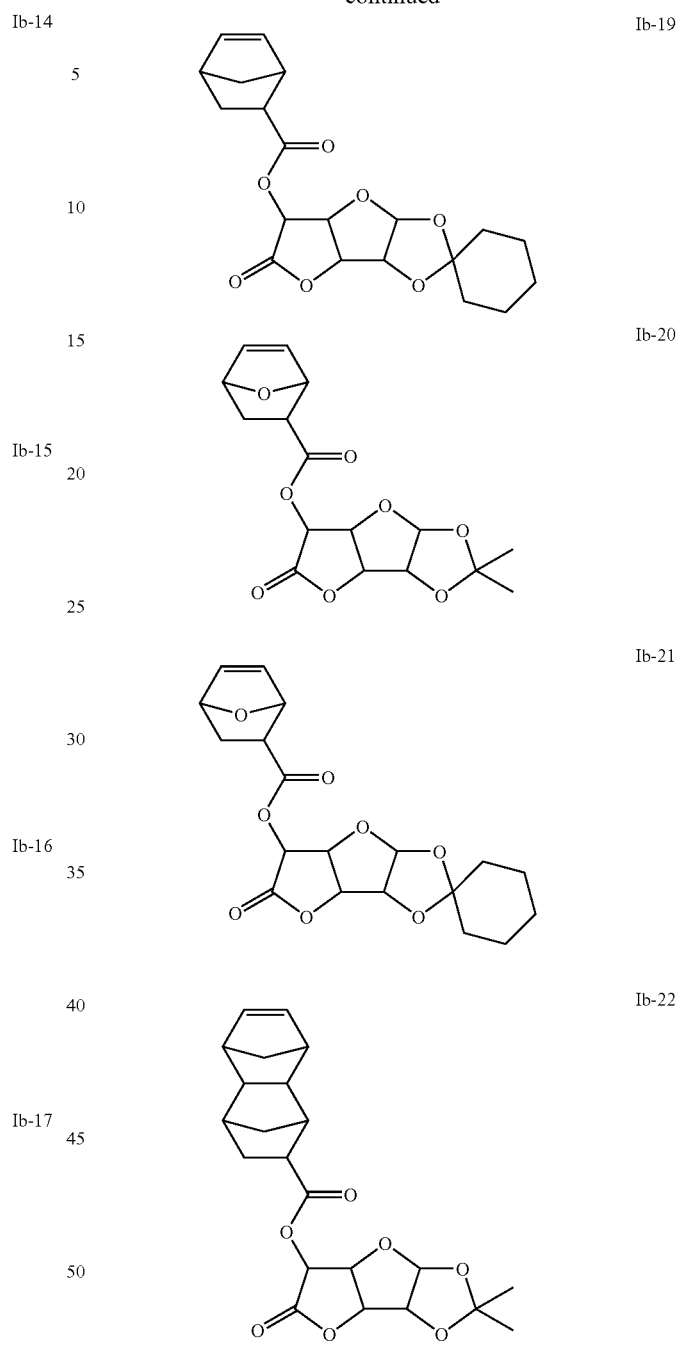

In the repeating unit (b), the 5- or 6-membered ring as formed by fusion may contain a hetero atom such as an oxygen atom and a sulfur atom in the atoms forming the ring and may contain a double bond. Specific examples thereof include a cyclohexane ring, a cyclopentane ring, a tetrahydrofuran ring, a tetrahydropyran ring, a cyclohexene ring, a cyclopentene ring, a dihydrofuran ring, a dihydropyran ring, a tetrahydrothiophene ring, and a dihydrothiophene ring.

As the latone structure having a 5- or 6-membered ring fused therein, structures represented by the following general formulae (II) and (III) can be enumerated.

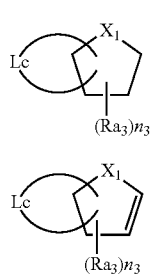

(II)

(III)

In the general formulae (II) and (III),

Lc represents a group for forming a lactone, $Ra_3$ represents a carboxyl group, an alkyl group, an alkoxy group, an acyloxy group, an alkoxycarbonyl group, or a group having an acid decomposable group, when plural $Ra_3$s are present, two of plural $Ra_3$s may combine together to form a ring, $X_1$ represents —$CH_2$—, —$CH_2CH_2$—, —$CH_2O$—, —O—, —S—, or —$CH_2S$—, and $n_3$ represents an integer of from 0 to 3.

Lc, $Ra_3$, and $n_3$ in the general formulae (II) and (III) are the same as Lc, $Ra_3$, and $n_3$, respectively in the general formulae (I).

As the lactone structure as formed by Lc, a 5- or 6-membered ring lactone is preferable.

As the lactones of the general formulae (II) and (II), a lactone represented by the following general formula (II') or (III') is preferable; a lactone having a specific stereostructure represented by the following general formula (II'-1) or (III'-1) is more preferable; and a lactone represented by the general formula (II'-1) or (III'-1) wherein $X_1$ represents —$CH_2$— is further preferable.

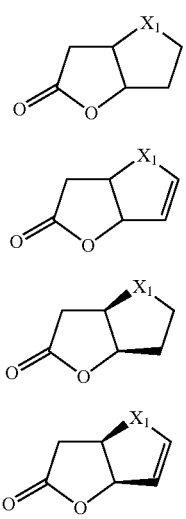

II'

III'

II'-1

III'-1

$X_1$ in the general formulae (II'), (III'), (II'-1) and (III'-1) is synonymous with $X_1$ in the general formula (II).

As the repeating unit having the structure represented by the general formula (II) or (III), a repeating unit represented by the following general formula (IIa) or (IIIa) is more preferable, and a repeating unit, in which Rc is bonded at the α-position of the lactone structure is more preferable.

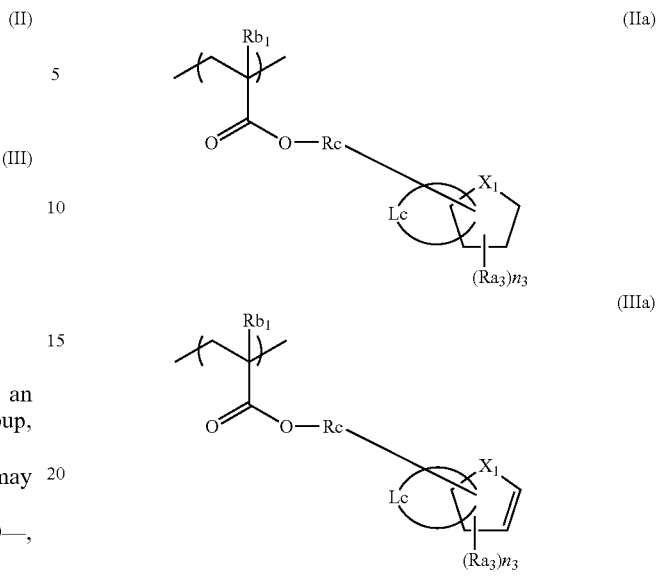

(IIa)

(IIIa)

In the general formulae (IIa) and (IIIa), $Rb_1$ represents a hydrogen atom, an alkyl group, or —$CH_2$—O—$Rb_2$, wherein $Rb_2$ represents a hydrogen atom, an alkyl group, a cycloalkyl group, an acyl group, or a group having a lactone structure, Rc represents a single bond or a divalent connecting group, Lc represents a group for forming a lactone structure, $Ra_3$ represents a carboxyl group, an alkyl group, an alkoxy group, an acyloxy group, an alkoxycarbonyl group, or a group having an acid decomposable group, when plural $Ra_3$s are present, two of plural $Ra_3$s may combine together to form a ring, $X_1$ represents —$CH_2$—, —$CH_2CH_2$—, —$CH_2O$—, —O—, —S—, or —$CH_2S$—, and $n_3$ represents an integer of from 0 to 3.

Lc, $Ra_3$ and $n_3$ in the general formulae (IIa) and (IIIa) are the same as Lc, $Ra_3$ and $n_3$, respectively in the general formula (I).

$Rb_1$ and Rc in the general formulae (IIa) and (IIIa) are the same as $Rb_1$ and Rc, respectively in the general formula (Ia).

As the repeating unit having the structure represented by the general formula (II) or (III), a repeating unit represented by the following general formula (IIa-I) or (IIIa-I) is more preferable.

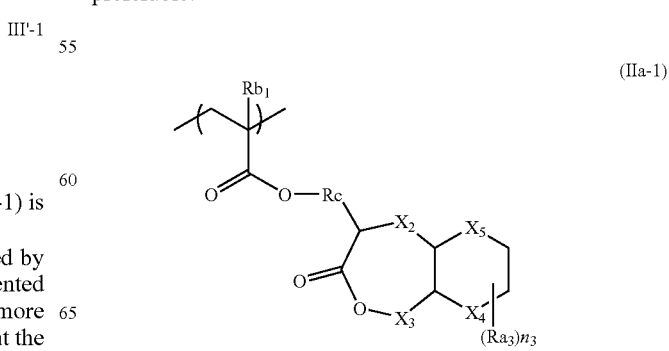

(IIa-1)

-continued (IIIa-1)

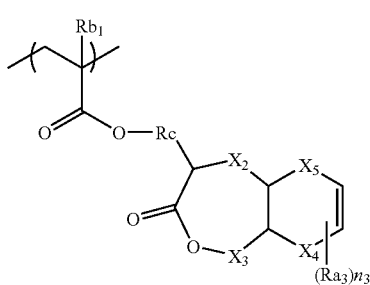

In the general formulae (IIa-1) and (IIIa-1),

Rb$_1$ represents a hydrogen atom, an alkyl group, or —CH$_2$—O—Rb$_2$, wherein Rb$_2$ represents a hydrogen atom, an alkyl group, a cycloalkyl group, an acyl group, or a group having a lactone structure, Rc represents a single bond or a divalent connecting group, Ra$_3$ represents a carboxyl group, an alkyl group, an alkoxy group, an acyloxy group, an alkoxycarbonyl group, or a group having an acid decomposable group, when plural Ra$_3$s are present, two of plural Ra$_3$s may combine together to form a ring, X$_2$ represents a single bond or —CH$_2$—, X$_3$ represents a single bond or —CH$_2$—, X$_4$ represents a single bond, —CH$_2$—, —CH$_2$CH$_2$—, —CH$_2$O—, —O—, —S—, or —CH$_2$S—, X$_5$ represents a single bond, —CH$_2$—, —CH$_2$CH$_2$—, —CH$_2$O—, —O—, —S—, or —CH$_2$S—, the sum of the number of atoms exclusive of a hydrogen atom of X$_4$ and X$_5$ is 1 or 2, and n$_3$ represents an integer of from 0 to 3.

As the combination of X$_2$ to X$_5$, a combination in which X$_2$ to X$_4$ each represents a single bond, and X$_5$ represents —CH$_2$—, and a combination in which X$_2$ to X$_4$ each represents a single bond, and X$_5$ represents —CH$_2$—CH$_2$— are preferable.

Ra$_3$ and n$_3$ in the general formulae (IIa-1) and (IIIa-1) are the same as Ra$_3$ and n$_3$, respectively in the general formula (I).

Rb$_1$ and Rc in the general formulae (IIa-1) and (IIIa-1) are the same as Rb$_1$ and Rc, respectively in the general formula (Ia).

As the repeating unit having the structure represented by the general formula (II) or (III), a repeating unit represented by the following general formula (IIa') or (IIIa') is further preferable. Cycloolefin derivatives represented by the following general formula (IIa") or (IIIa") are also preferable.

(IIa')

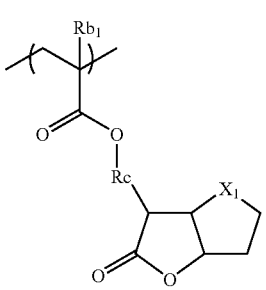

(IIa")

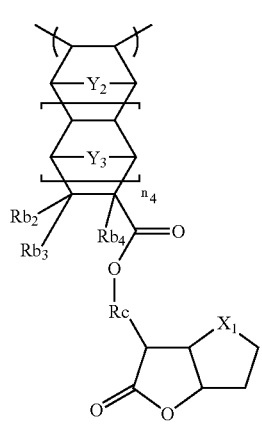

(IIIa')

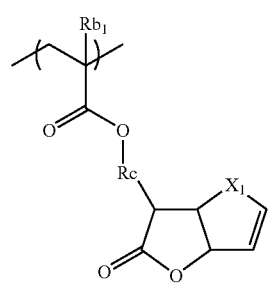

(IIIa")

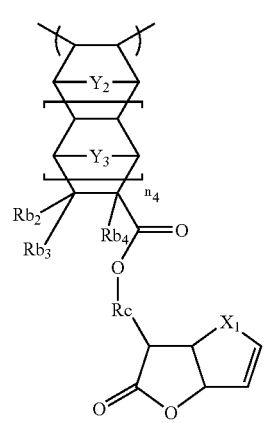

Rb$_1$, Rc, and X$_1$ in the general formulae (IIa') and (IIIa') are synonymous with Rb$_1$, Rc, and X$_1$, respectively in the general formula (IIa).

Y$_2$, Y$_3$, Rb$_2$, Rb$_3$, Rb$_4$, Rc, and n$_4$ in the general formulae (IIa") and (IIIa") are synonymous with Y$_2$, Y$_3$, Rb$_2$, Rb$_3$, Rb$_4$, Rc, and n$_4$, respectively in the general formula (Ia"); and X$_1$ in the general formulae (IIa") and (IIIa") is synonymous with X$_1$ in the general formula (IIa).

As the repeating unit having the structure represented by the general formula (II) or (III), a repeating unit having a lactone structure having a specific stereostructure represented by the following general formula (IIa'-1), (IIa"-1), (IIIa'-1) or (IIIa"-1) is especially preferable. By using a lactone having such a specific stereostructure, a resolving power and a line edge roughness are improved.

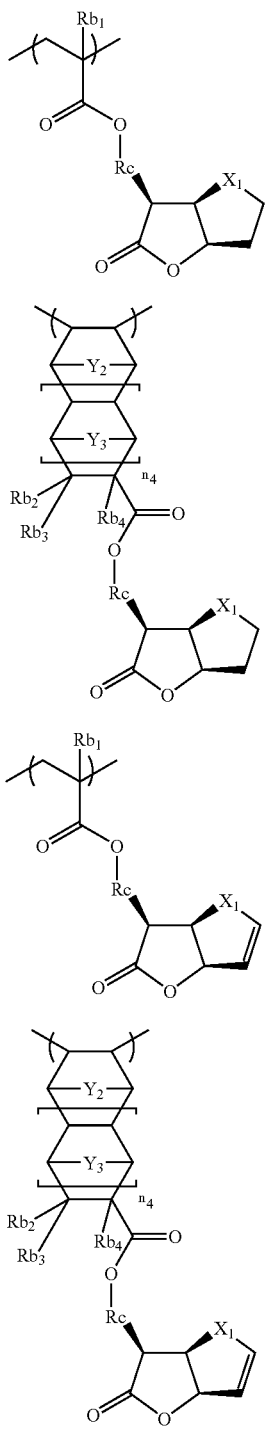

Preferred examples of the repeating unit having the lactone structure represented by the general formula (II) will be given below.

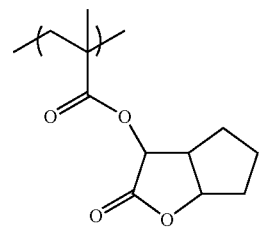

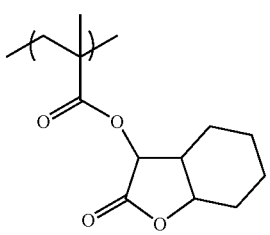

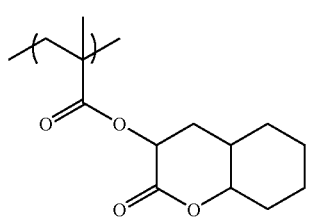

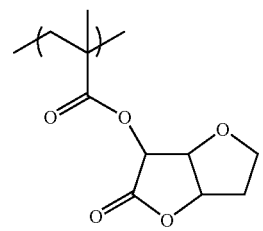

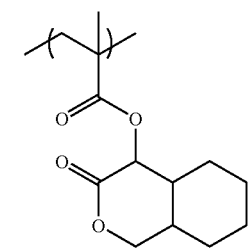

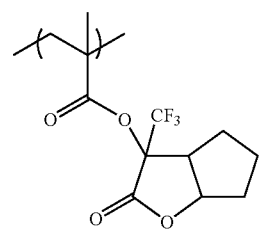

$Rb_1$, Rc, and $X_1$ in the general formulae (IIa'-1) and (IIIa'-1) are synonymous with $Rb_1$, Rc, and $X_1$, respectively in the general formula (IIa).

$Y_2$, $Y_3$, $Rb_2$, $Rb_3$, $Rb_4$, Rc, and $n_4$ in the general formulae (IIa''-1) and (IIIa''-1) synonymous with $Y_2$, $Y_3$, $Rb_2$, $Rb_3$, $Rb_4$, Rc, and $n_4$, respectively in the general formula (Ia''); and $X_1$ in the general formulae (IIa''-1) and (IIa''-1) is synonymous with $X_1$ in the general formula (IIa).

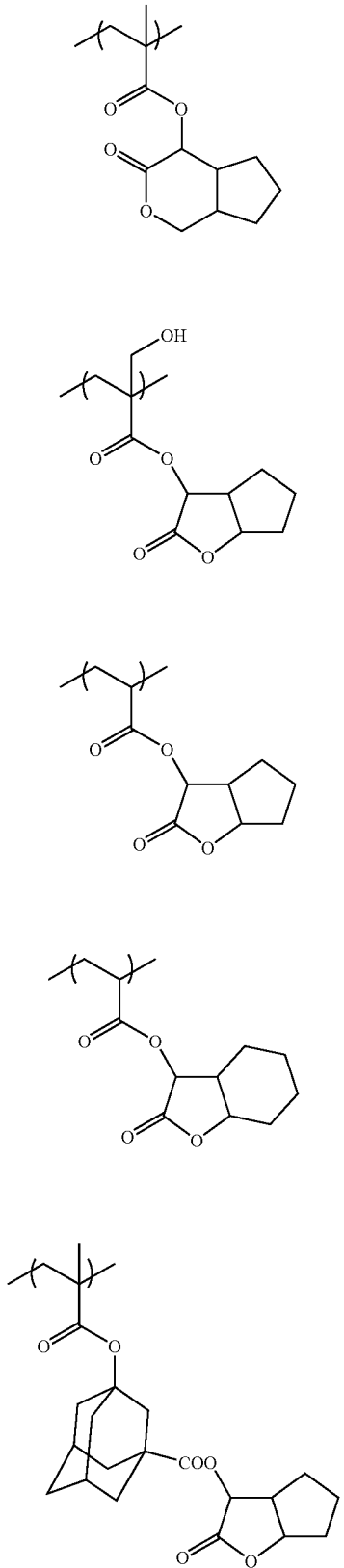
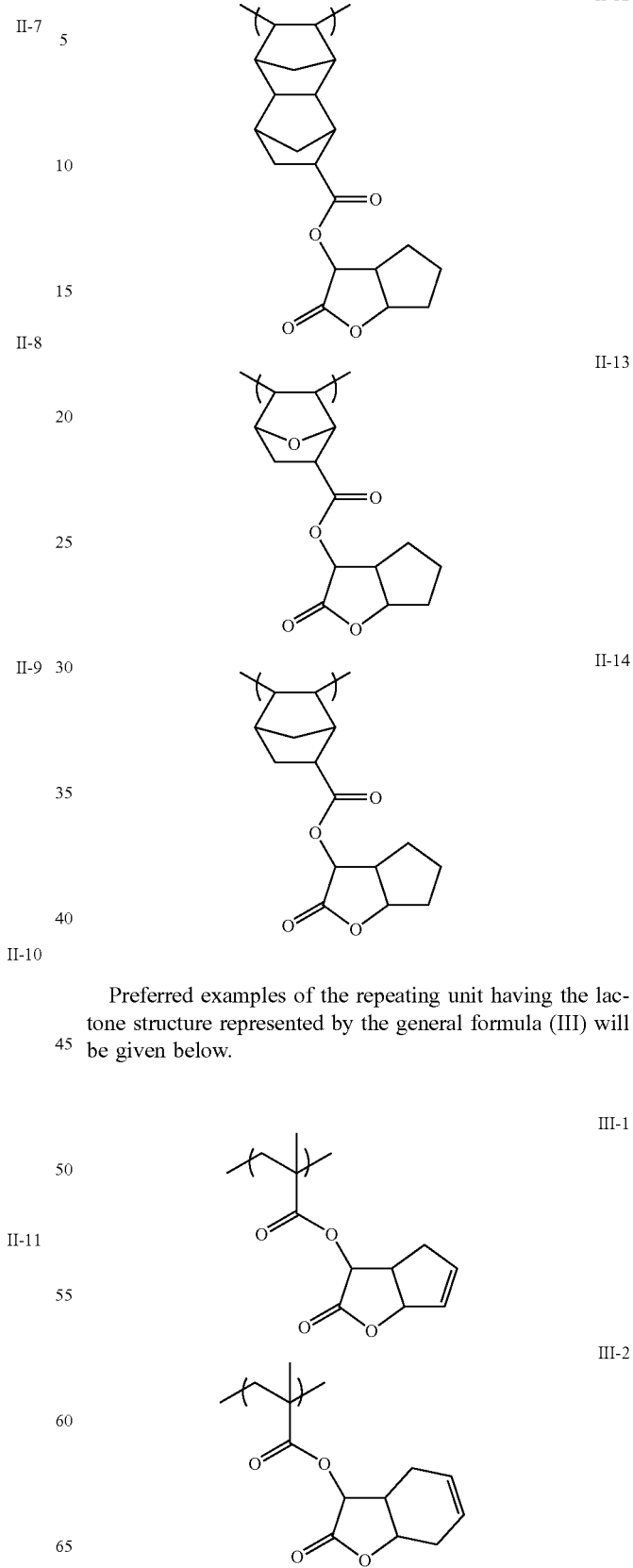
Preferred examples of the repeating unit having the lactone structure represented by the general formula (III) will be given below.

III-3
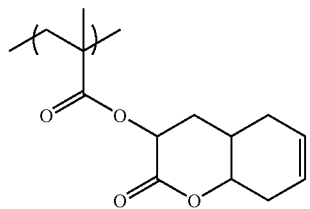
III-4
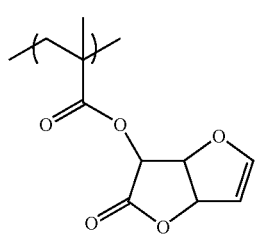
III-5
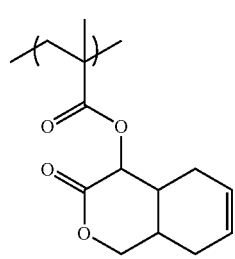
III-6
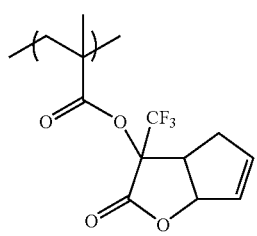
III-7
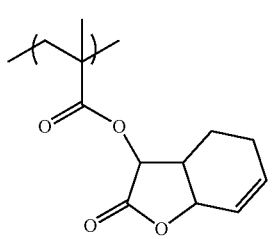
III-8
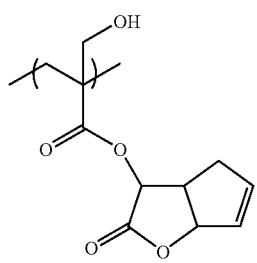
III-9
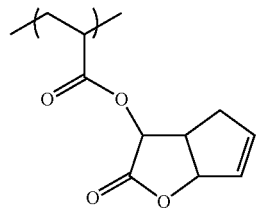
III-10
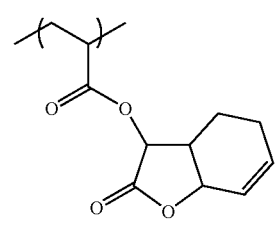
III-11
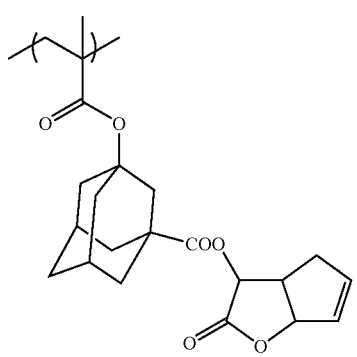
III-12
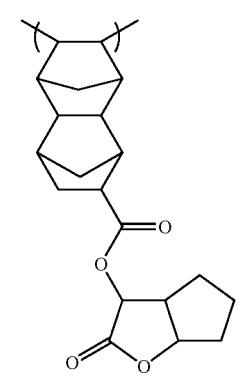
III-13
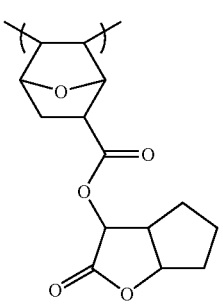

-continued

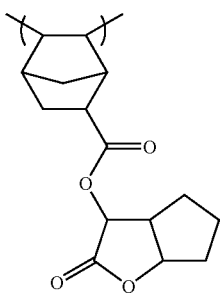

(III-14)

As the monomer corresponding to the repeating unit (b), monomers represented by the following general formulae (IIb) and (IIIb) are preferable; and monomers represented by the following general formulae (IIb') and (IIIb') are more preferable.

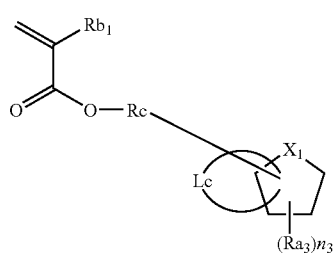

(IIb)

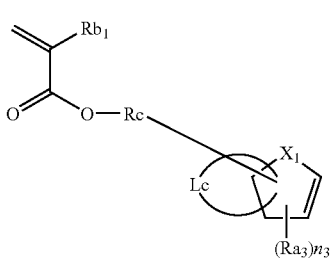

(IIIb)

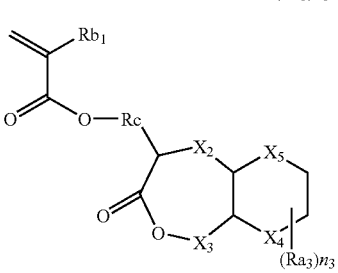

(IIb')

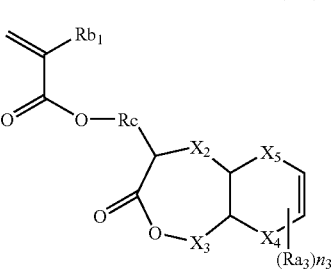

(IIIb')

$Rb_1$, $Rc$, $Lc$, $X_1$, $Ra_3$, and $n_3$ in the general formulae (IIb) and (IIIb) are the same as $Rb_1$, $Rc$, $Lc$, $X_1$, $Ra_3$, and $n_3$, respectively in the general formulae (IIa) and (IIIa).

$Rb_1$, $Rc$, $Ra_3$, $n_3$, $X_2$, $X_3$, $X_4$, and $X_5$ in the general formulae (IIb') and (IIIb') are the same as $Rb_1$, $Rc$, $Ra_3$, $n_3$, $X_2$, $X_3$, $X_4$, and $X_5$, respectively in the general formulae (IIa-1) and (IIIa-1).

As the monomer corresponding to the repeating unit (b), a monomer represented by the following general formula (IIb'-1), (IIb''-1), (IIIb'-1) or (IIIb''-1) is more preferable; and a monomer having a lactone structure having a specific stereostructure represented by the following general formula (IIb'-2), (IIb''-2), (IIIb'-2) or (IIIb''-2) is especially preferable.

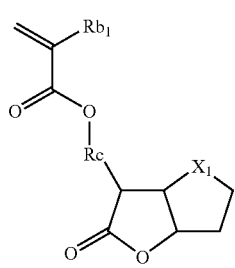

(IIb'-1)

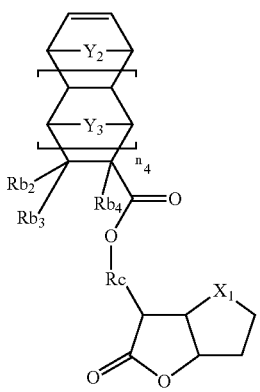

(IIb''-1)

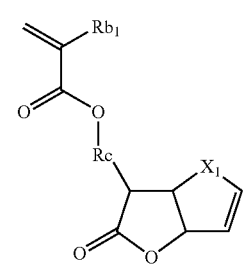

(IIIb'-1)

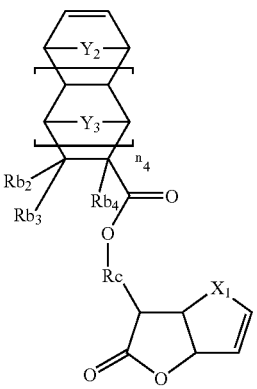

(IIIb''-1)

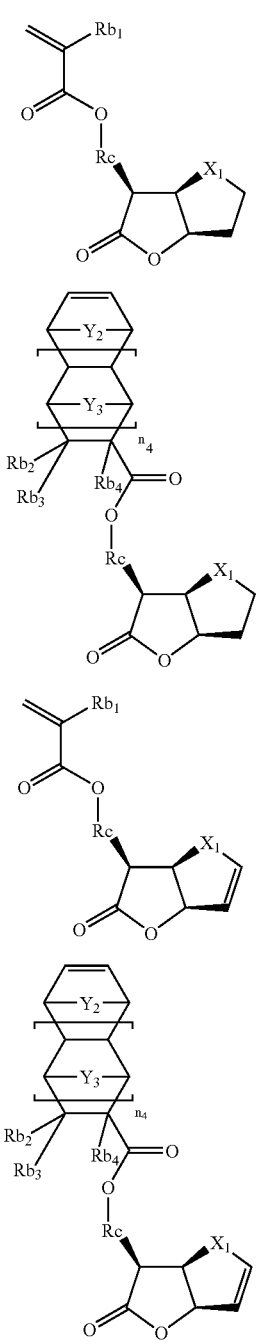

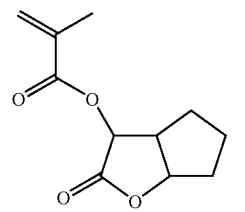

IIb-1

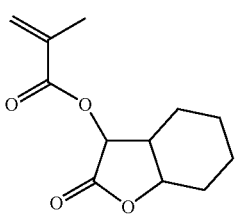

IIb-2

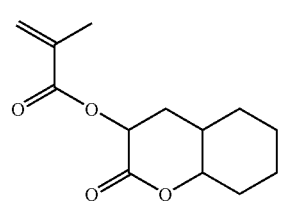

IIb-3

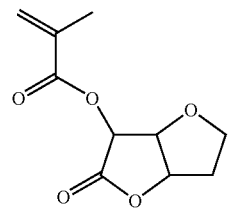

IIb-4

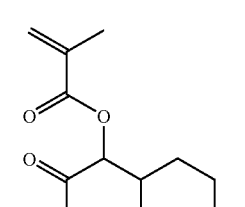

IIb-5

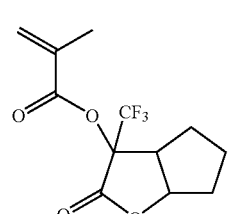

IIb-6

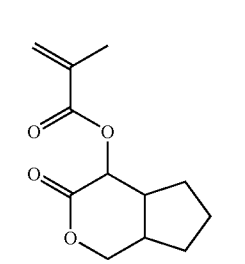

IIb-7

$Rb_1$, Rc, and $X_1$ in the general formulae (IIb'-1), (IIIb'-1), (IIb'-2) and (IIIb'-2) are synonymous with $Rb_1$, Rc, and $X_1$, respectively in the general formula (IIa).

$Y_2$, $Y_3$, $Rb_2$, $Rb_3$, $Rb_4$, Rc, and $n_4$ in the general formulae (IIb'-1), (IIIb''-1), and (IIIb''-2) are synonymous with $Y_2$, $Y_3$, $Rb_2$, $Rb_3$, $Rb_4$, Rc, and $n_4$, respectively in the general formula (Ia''); and $X_1$ in the general formulae (IIb'-1), (IIIb''-1), (IIb'-2) and (IIIb'-2) is synonymous with $X_1$ in the general formula (IIa).

Specific examples of the monomer represented by the general formula (IIb) will be given below, but it should not be construed that the invention is limited thereto.

-continued
IIb-8
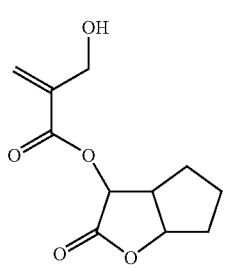
IIb-9
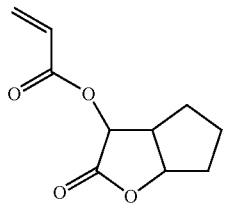
IIb-10
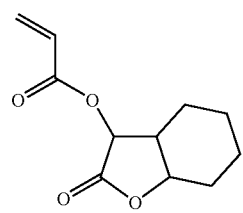
IIb-11
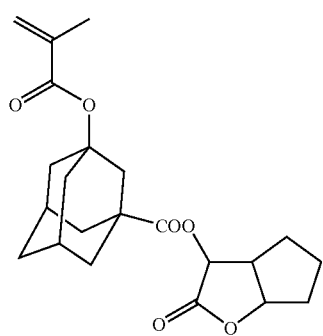
IIb-12
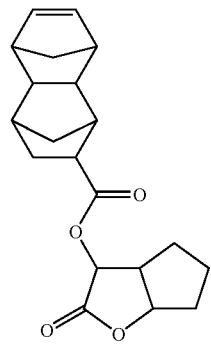
IIb-13
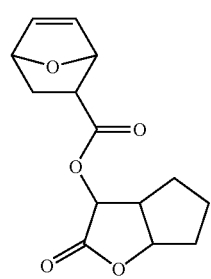
-continued
IIb-14
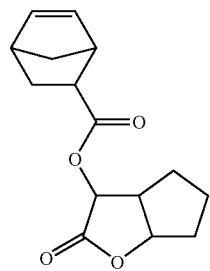
Specific examples of the monomer represented by the general formula (IIIb) will be given below, but it should not be construed that the invention is limited thereto.
IIIb-1
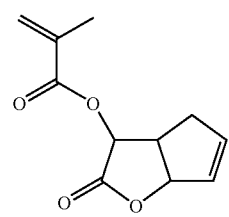
IIIb-2
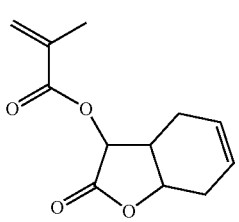
IIIb-3
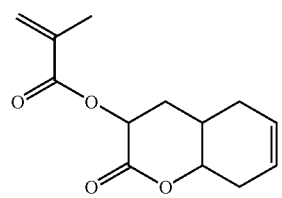
IIIb-4
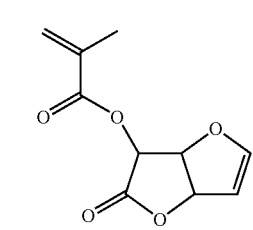
IIIb-5

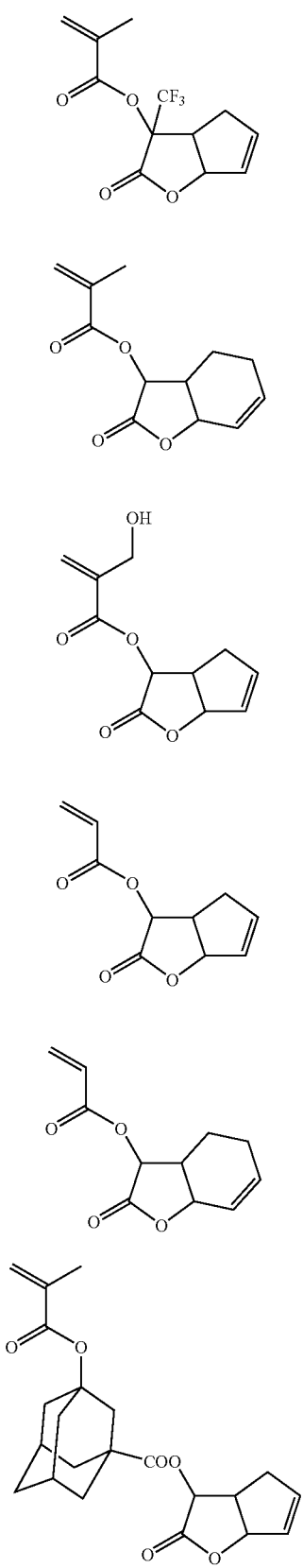
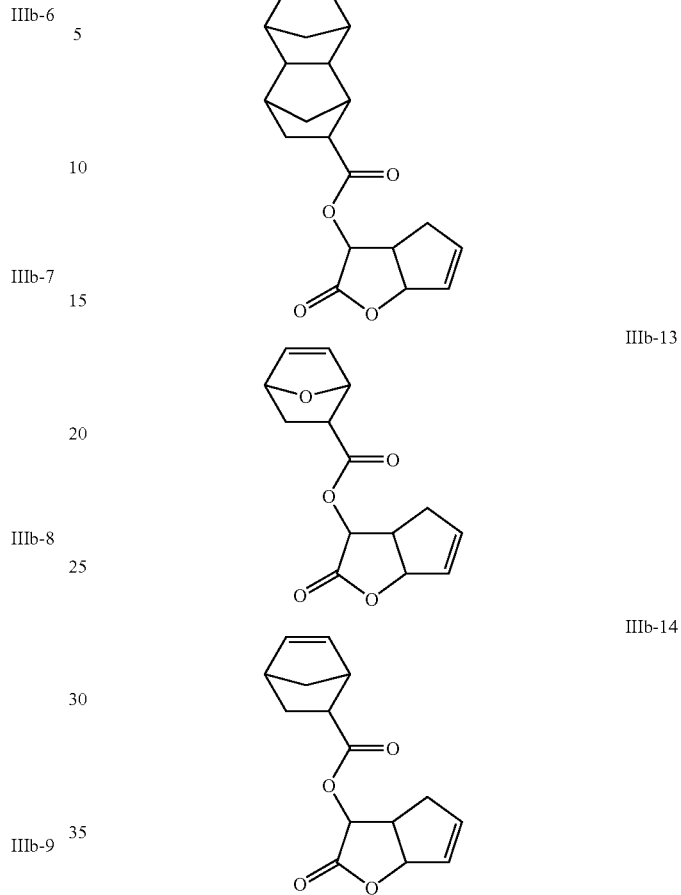

As the lactone structure which the resin of the invention has, when a compound having a structure in which a 5- or 6-membered ring is fused at the β- and γ-positions of the 5-membered ring lactone as represented by the following general formula (I′), (II′) or (III′) is used, especially excellent resolving power and line edge roughness are obtained. Moreover, when the compound has a specific stereostructure represented by the following general formula (I′-1), (II′-1) or (III′-1), higher effects are obtained.

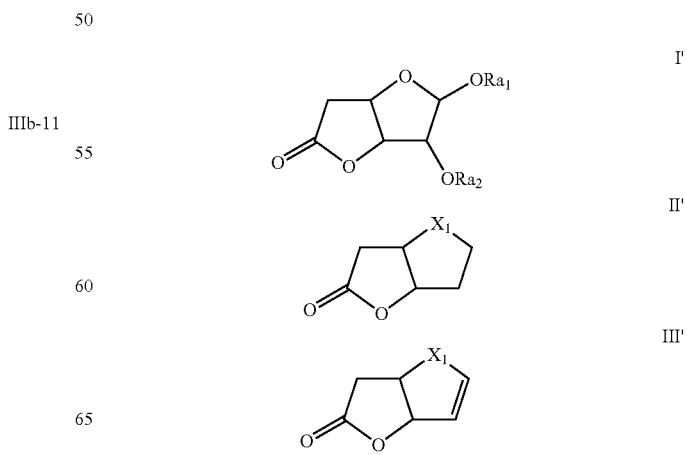

-continued

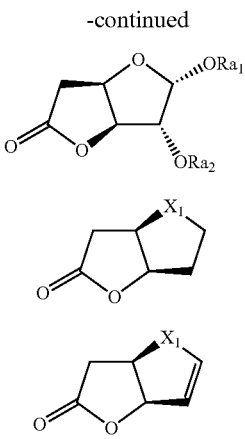

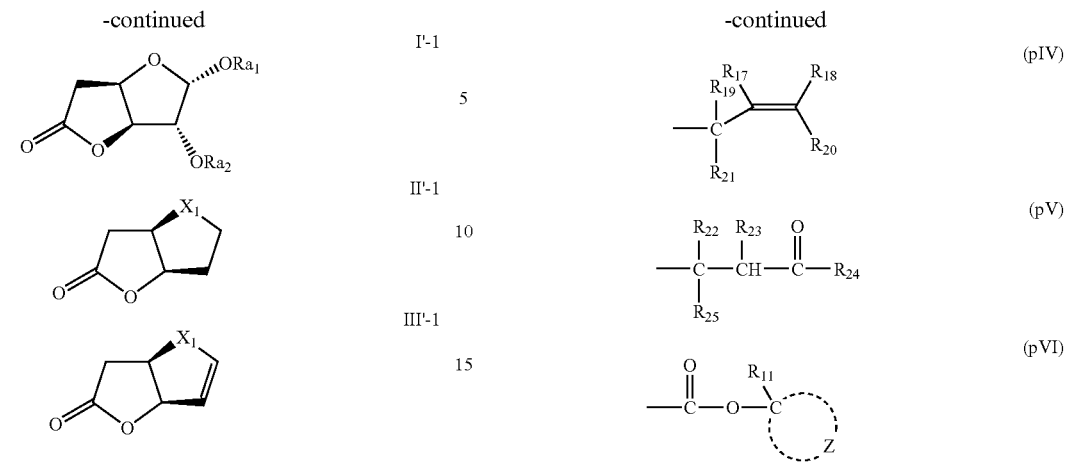

The monomers corresponding to the foregoing repeating units (a) and (b) can be obtained by reacting a corresponding hydroxylactone with, for example, (meth)acrylic anhydride, (meth)acrylic acid chloride, etc. under a basic condition. The hydroxylactone can be synthesized by, for example, a method as described in *Tetrahedron*, (1987), p. 415; a method as described in *J. Chem. Soc. PERKIN Trans.*, 1, (1993), p. 313; a method as described in Tetrahedron, (1994), p. 10265; and a method as described in *J. Org. Chem.*, (1952), p. 600.

The resin which is used in the photosensitive composition of the invention is a resin having a group capable of being decomposed by an acid (hereinafter also referred to as "acid decomposable group") in the main chain or side chain or both the main chain and the side chain of the resin.

As the group capable of being decomposed by an acid, a group as substituted with a group capable of splitting off a hydrogen atom of a —COOH group by an acid is preferable.

Preferred examples of the acid decomposable group include a cumyl ester group, an enol ester group, an acetal ester group, and a tertiary alkyl ester group, with a tertiary alkyl ester group being more preferred.

It is preferable that the resin whose solubility in an alkaline developer increases by the action of an acid is a resin containing at least one member selected from the group consisting of repeating units having a partial structure containing an alicyclic hydrocarbon represented by any one of the following general formulae (pI) to (pVI) and a repeating unit represented by the following general formula (II-AB).

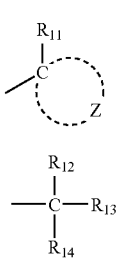

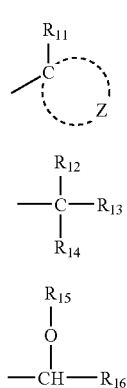

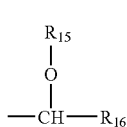

In the formulae, $R_{11}$ represents a methyl group, an ethyl group, an n-propyl group, an isopropyl group, an n-butyl group, an isobutyl group, or a sec-butyl group, and Z represents an atomic group necessary for forming an alicyclic hydrocarbon group together with the carbon atom;

$R_{12}$ to $R_{16}$ each independently represents a linear or branched alkyl group having from 1 to 4 carbon atoms or an alicyclic hydrocarbon group, with proviso that at least one of $R_{12}$ to $R_{14}$, or either one of $R_{15}$ or $R_{16}$ represents an alicyclic hydrocarbon group;

$R_{17}$ to $R_{21}$ each independently represents a hydrogen atom, a linear or branched alkyl group having from 1 to 4 carbon atoms, or an alicyclic hydrocarbon atom, with proviso that at least one of $R_{17}$ to $R_{21}$ represents an alicyclic hydrocarbon group and that either one of $R_{19}$ or $R_{21}$ represents a linear or branched alkyl group having from 1 to 4 carbon atoms or an alicyclic hydrocarbon group; and $R_{22}$ to $R_{25}$ each independently represents a hydrogen atom, a linear or branched alkyl group having from 1 to 4 carbon atoms, or an alicyclic hydrocarbon atom, with proviso that at least one of $R_{22}$ to $R_{25}$ represents an alicyclic hydrocarbon group and that $R_{23}$ and $R_{24}$ may combine together to form a ring.

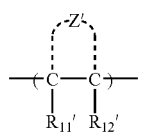

In the formula (II-AB), $R_{11}'$ and $R_{12}'$ each independently a hydrogen atom, a cyano group, a halogen atom, or an alkyl group, and Z' represents an atomic group containing two bonded carbon atoms (C—C), which is necessary for forming an alicyclic structure.

Furthermore, it is more preferable that the foregoing general formula (II-AB) is the following general formula (II-A) or general formula (II-B).

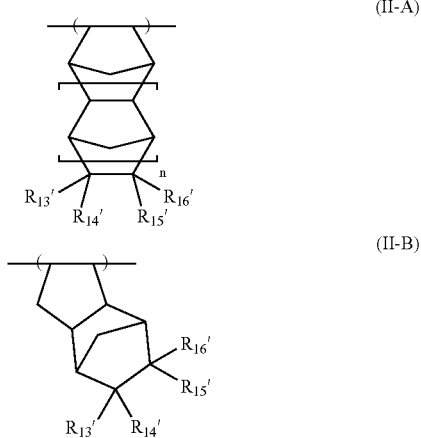

In the formulae (II-A) and (II-B), $R_{13}'$ to $R_{16}'$ each independently represents a hydrogen atom, a halogen atom, a cyano group, —COOH, —COOR$_5$, a group which is decomposed by the action of an acid, —C(=O)—X-A'-R$_{17}'$, an alkyl group, or a cyclic hydrocarbon group; and at least two of $R_{13}'$ to $R_{16}'$ may combine together to form a ring.

Here, $R_5$ represents an alkyl group, a cyclic hydrocarbon group, or a —Y group as described below, X represents an oxygen atom, a sulfur atom, —NH—, —NHSO$_2$—, or —NHSO$_2$NH—, A' represents a single bond or a divalent connecting group, $R_{17}'$ represents —COOH, —COOR$_5$, —CN, a hydroxyl group, an alkoxy group, —CO—NH—R$_6$, —CO—NH—SO$_2$—R$_6$, or a —Y group as described below, $R_6$ represents an alkyl group or a cyclic hydrocarbon group, and n represents 0 or 1.

—Y group:

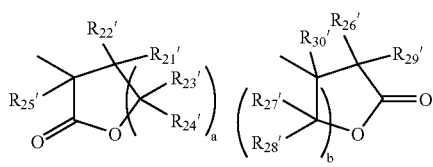

In the —Y group, $R_{21}'$ to $R_{30}'$ each independently represents a hydrogen atom or an alkyl group; and a and b each represents 1 or 2.

In the general formulae (pI) to (pVI), the alkyl group in $R_{12}$ to $R_{25}$ may be substituted or unsubstituted and represents a linear or branched alkyl group having from 1 to 4 carbon atoms. Examples of the alkyl group include a methyl group, an ethyl group, an n-propyl group, an isopropyl group, an n-butyl group, an isobutyl group, a sec-butyl group, and a t-butyl group.

Also, examples of the additional substituent of the foregoing alkyl group include an alkoxy group having from 1 to 4 carbon atoms, a halogen atom (for example, a fluorine atom, a chlorine atom, a bromine atom, and an iodine atom), an acyl group, an acyloxy group, a cyano group, a hydroxyl group, a carboxy group, an alkoxycarbonyl group, and a nitro group.

The alicyclic hydrocarbon group in $R_{11}$ to $R_{25}$ or the alicyclic hydrocarbon group formed by Z and the carbon atom may be monocyclic or polycyclic. Specific examples thereof include groups having a monocyclic, bicyclic, tricyclic or tetracyclic structure having 5 or more carbon atoms. The carbon atom number is preferably from 6 to 30, and especially preferably from 7 to 25. Such an alicyclic hydrocarbon group may have a substituent.

Preferred examples of the alicyclic hydrocarbon group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group. Of these, an adamantyl group, a decalin residue, a norbornyl group, a cedrol group, a cyclohexyl group, a cycloheptyl group, a cyclooctyl group, a cyclodecanyl group, and a cyclododecanyl group are more preferable.

Examples of the substituent of such an alicyclic hydrocarbon group include an alkyl group, a halogen atom, a hydroxyl group, an alkoxy group, a carboxyl group, and an alkoxycarbonyl group. As the foregoing alkyl group, lower alkyl groups such as a methyl group, an ethyl group, a propyl group, an isopropyl group, and a butyl group are preferable; and a methyl group, an ethyl group, a propyl group, and an isopropyl group are more preferable. Examples of the alkoxy group include ones having from 1 to 4 carbon atoms such as a methoxy group, an ethoxy group, a propoxy group, and a butoxy group. The alkyl group and the alkoxy group may additionally have a substituent. Examples of the additional substituent of the alkyl group or alkoxy group include a hydroxyl group, a halogen atom, and an alkoxy group.

The structures represented by the general formulae (pI) to (pVI) can be used for protecting an alkali-soluble group. As the alkali-soluble group, various groups which are known in this technical field are enumerated.

Specific examples thereof include a carboxyl group, a sulfonic group, a phenol group, and a thio group, with a carboxyl group and a sulfonic group being preferred.

As the alkali-soluble group as protected by a structure of any one of the structures represented by the general formulae (pI) to (pVI) in the foregoing resin, structures in which the hydrogen atom of the carboxyl group is substituted by any one of the structures represented by the general formulae (pI) to (pVI) are preferable.

As the repeating unit having the alkali-soluble group as protected by any one of the structures represented by the general formulae (pI) to (pVI), a repeating unit represented by the following general formula (pA) is preferable.

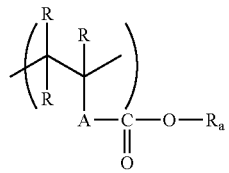

Here, R represents a hydrogen atom, a halogen atom, or a linear or branched alkyl group having from 1 to 4 carbon atoms, and plural Rs may be the same of different.

A represents a single group or a combination of two or more groups selected from the group consisting of a single bond, an alkylene group, an ether group, a thioether group, a carbonyl group, an ester group, an amide group, a sulfonamide group, a urethane group, and a urea group. The foregoing alkylene group may additionally have a substituent.

Ra represents any one of the groups represented by the foregoing formulae (pI) to (pVI).

The repeating unit represented by the general formula (pA) is most preferably a repeating unit by a 2-alkyl-2-adamantyl (meth)acrylate or a dialkyl(1-adamantyl)methyl (meth)acrylate.

Specific examples the represented by the general formula (pA) will be given below.

1
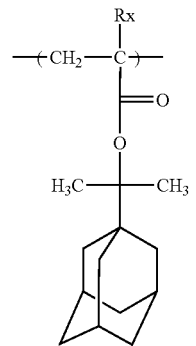

2
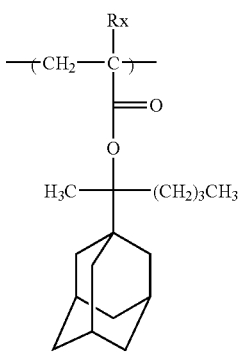

3
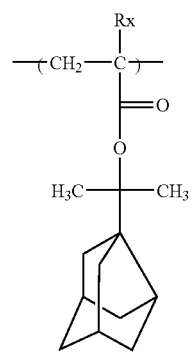

4
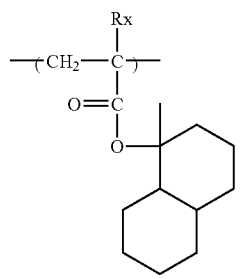

5
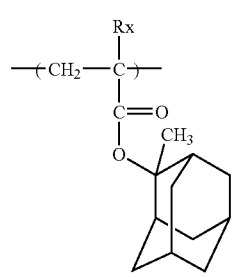

6
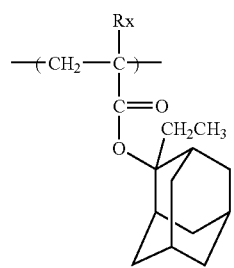

7
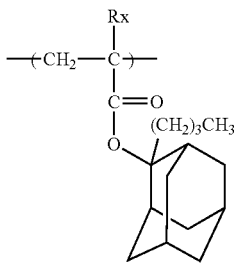

8
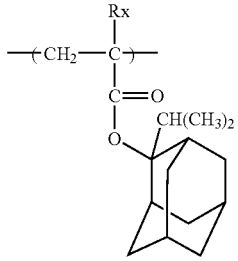

9
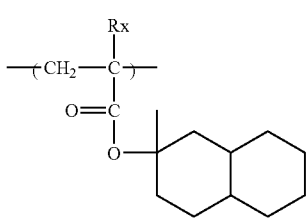

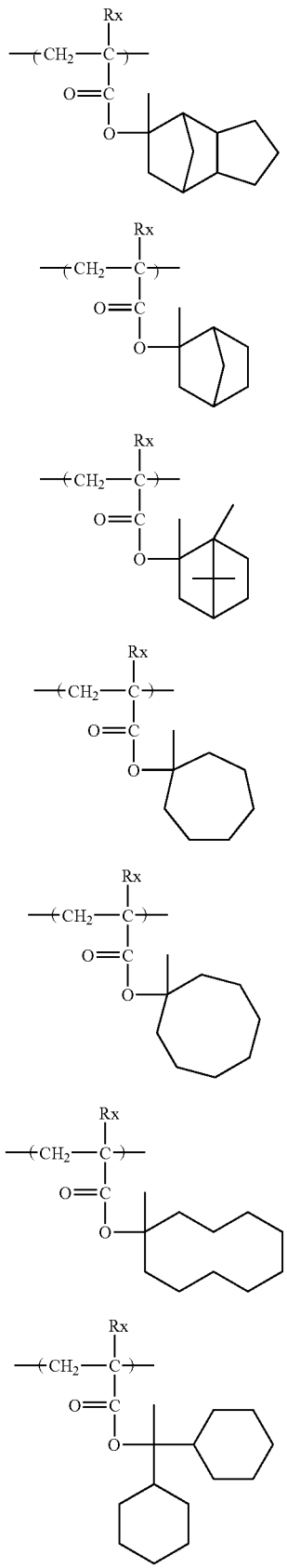
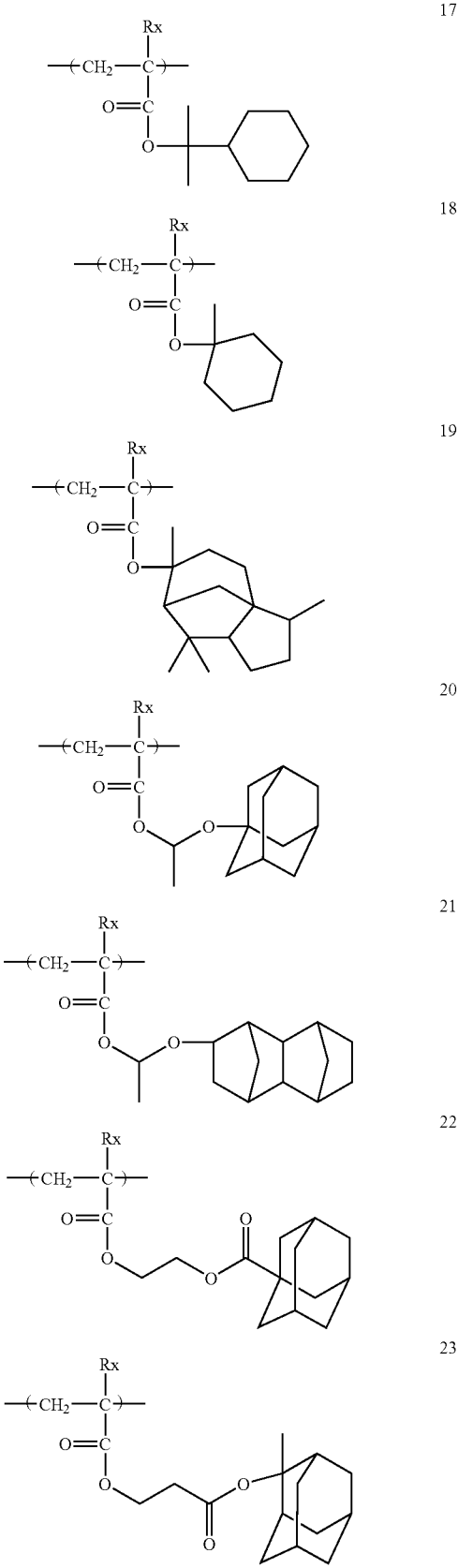

In the formulae, Rx represents H, CH$_3$, or CF$_3$.

In the foregoing general formula (II-AB), R$_{11}$' and R$_{12}$' each independently represents a hydrogen atom, a cyano group, a halogen atom, or an alkyl group.

Z' represents an atomic group containing two bonded carbon atoms (C—C), which is necessary for forming an alicyclic structure.

Examples of the halogen atom in the foregoing R$_{11}$' and R$_{12}$' include a chlorine atom, a bromine atom, a fluorine atom, and an iodine atom.

As the alkyl group in the foregoing R$_{11}$' and R$_{12}$', linear or branched alkyl groups having from 1 to 10 carbon atoms are preferable; linear or branched alkyl groups having from 1 to 6 carbon atoms are more preferable; and a methyl group, an ethyl group, a propyl group, an isopropyl group, an n-butyl group, an isobutyl group, a sec-butyl group, and a t-butyl group are further preferable.

The foregoing alkyl group may additionally have a substituent. Examples of the additional substituent of the alkyl group include a hydroxyl group, a halogen atom, a carboxyl group, an alkoxy group, an acyl group, a cyano group, and an acyloxy group. Examples of the halogen atom include a chlorine atom, a bromine atom, a fluorine atom, and an iodine atom. Examples of the alkoxy group include ones having from 1 to 4 carbon atoms such as a methoxy group, an ethoxy group, a propoxy group, and a butoxy group. Examples of the acyl group include a formyl group and an acetyl group; and examples of the acyloxy group include an acetoxy group.

The foregoing atomic group for forming an alicyclic structure of the foregoing Z' is an atomic group for forming a repeating unit of an alicyclic hydrocarbon in the resin. Above all, an atomic group for forming a bridged alicyclic structure for forming a repeating unit of a bridged alicyclic hydrocarbon is preferable.

As a skeleton of the alicyclic hydrocarbon to be formed, those which are the same as in the alicyclic hydrocarbon groups of R$_{11}$ to R$_{25}$ in the general formulae (pI) to (pVI) are enumerated.

The skeleton of the foregoing alicyclic hydrocarbon may have a substituent. As such a substituent, R$_{13}$' to R$_{16}$' in the foregoing general formula (II-A) or (II-B) can be enumerated.

Of the repeating units having the foregoing bridged alicyclic hydrocarbon, the repeating unit represented by the foregoing general formula (II-A) or (II-B) is more preferable.

In the acid decomposable resin according to the invention, the acid decomposable group may be contained in the foregoing —C(=O)—X-A'—R$_{17}$' or may be contained as a substituent of Z' of the general formula (II-AB).

A structure of the acid decomposable group is represented by —C(=O)—X$_1$—R$_0$.

In the formula, examples of R$_0$ include a tertiary alkyl group (for example, a t-butyl group and a t-amyl group), an isoboronyl group, a 1-alkoxyethyl group (for example, a 1-ethoxyethyl group, a 1-butoxyethyl group, a 1-isobutoxyethyl group, and a 1-cyclohexyloxyethyl group), an alkoxymethyl group (for example, a 1-methoxymethyl group and a 1-ethoxymethyl group), a 3-oxoalkyl group, a tetrahydropyranyl group, a tetrahydrofuranyl group, a trialkylsilyl ester group, a 3-oxocyclohexyl ester group, a 2-methyl-2-adamantyl group, and a mevalonic lactone residue. X$_1$ is synonymous with the foregoing X.

Examples of the halogen atom in the foregoing R$_{13}$' to R$_{16}$' include a chlorine atom, a bromine atom, a fluorine atom, and an iodine atom.

The alkyl group in the foregoing R$_5$, R$_6$, R$_{13}$' to R$_{16}$', and R$_{21}$' to R$_{30}$' is preferably a linear or branched alkyl group having from 1 to 10 carbon atoms; more preferably a linear or branched alkyl group having from 1 to 6 carbon atoms; and further preferably, a methyl group, an ethyl group, a propyl group, an isopropyl group, an n-butyl group, an isobutyl group, a sec-butyl group, or a t-butyl group.

The cyclic hydrocarbon group in the foregoing R$_5$, R$_6$, and R$_{13}$' to R$_{16}$' is, for example, a cyclic alkyl group or a bridged hydrocarbon, and examples thereof include a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornane epoxy group, a mentyl group, an isomentyl group, a neomentyl group, and a tetracyclododecanyl group.

Examples of the ring as formed when at least two of the foregoing R$_{13}$' to R$_{16}$' are taken together include rings having from 5 to 12 carbon atoms, such as cyclopentene, cyclohexene, cycloheptane, and cyclooctane.

Examples of the alkoxy group in the foregoing R$_{17}$' include ones having from 1 to 4 carbon atoms, such as a methoxy group, an ethoxy group, a propoxy group, and a butoxy group.

The foregoing alkyl group, cyclic hydrocarbon group and alkoxy group may additionally have a substituent. Examples of the additional substituent of the alkyl group, cyclic hydrocarbon group and alkoxy group include a hydroxyl group, a halogen atom, a carboxyl group, an alkoxy group, an acyl group, a cyano group, an acyloxy group, an alkyl group, and a cyclic hydrocarbon group. Examples of the halogen atom include a chlorine atom, a bromine atom, a fluorine atom, and an iodine atom. As the alkoxy group, ones having from 1 to 4 carbon atoms such as a methoxy group, an ethoxy group, a propoxy group, and a butoxy group can be enumerated; as the acetyl group, a formyl group and an acetyl group can be enumerated; and as the acyloxy group, an acetoxy group can be enumerated.

Furthermore, as the alkyl group and cyclic hydrocarbon group, those as enumerated previously are enumerated.

As the divalent connecting group of the foregoing A', a single group or a combination of two or more groups selected from the group consisting of an alkylene group, an ether group, a thioether group, a carbonyl group, an ester group, an amide group, a sulfonamide group, a urethane group, and a urea group can be enumerated. The foregoing alkylene group may have a substituent.

In the acid decomposable resin according to the invention, the group which is decomposed by the action of an acid can have at least one repeating unit of a repeating unit having a partial structure containing any one of the alicyclic hydrocarbons represented by the foregoing general formulae (pI) to (pVI), a repeating unit represented by the general formula (II-AB), and a repeating unit of a copolymerization component as described layer.

The various substituents of R$_{13}$' to R$_{16}$' in the foregoing general formula (II-A) or general formula (II-B) may also become a substituent of the atomic group Z for forming the atomic group or bridged alicyclic structure for forming an alicyclic structure in the foregoing general formula (II-AB).

Specific examples of the repeating unit represented by the foregoing general formula (II-A) or general formula (II-B) will be given below, but it should not be construed that the invention is limited thereto.

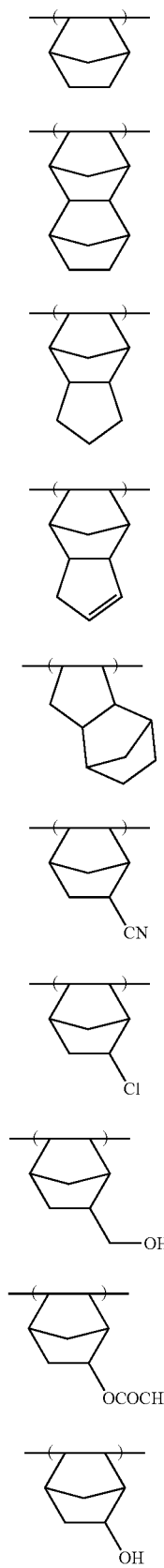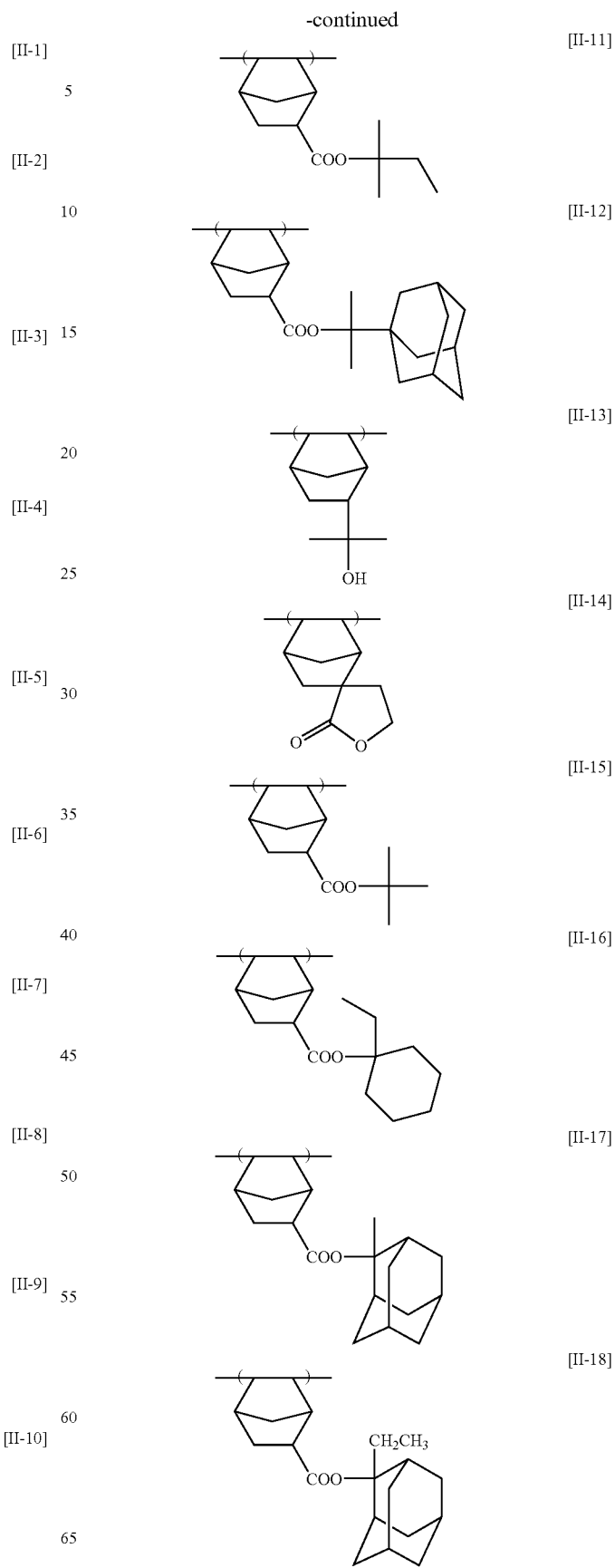

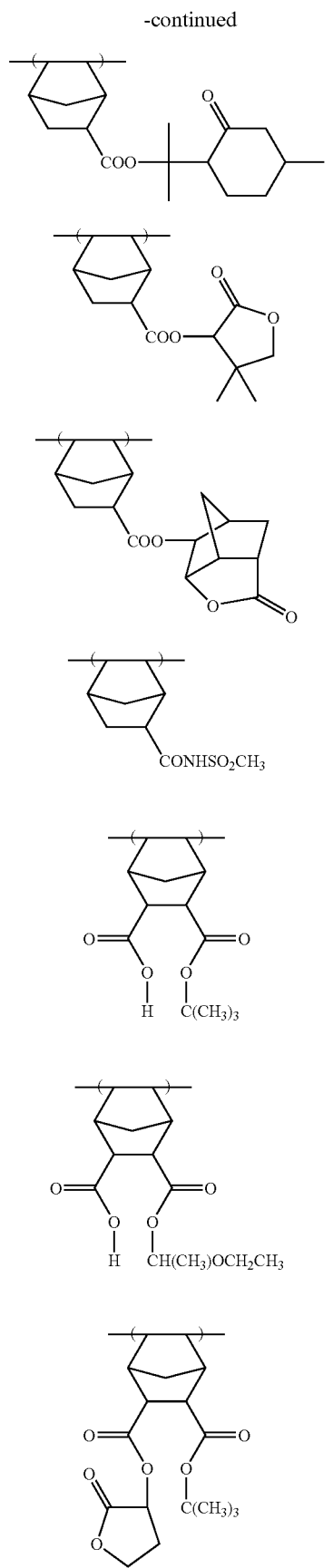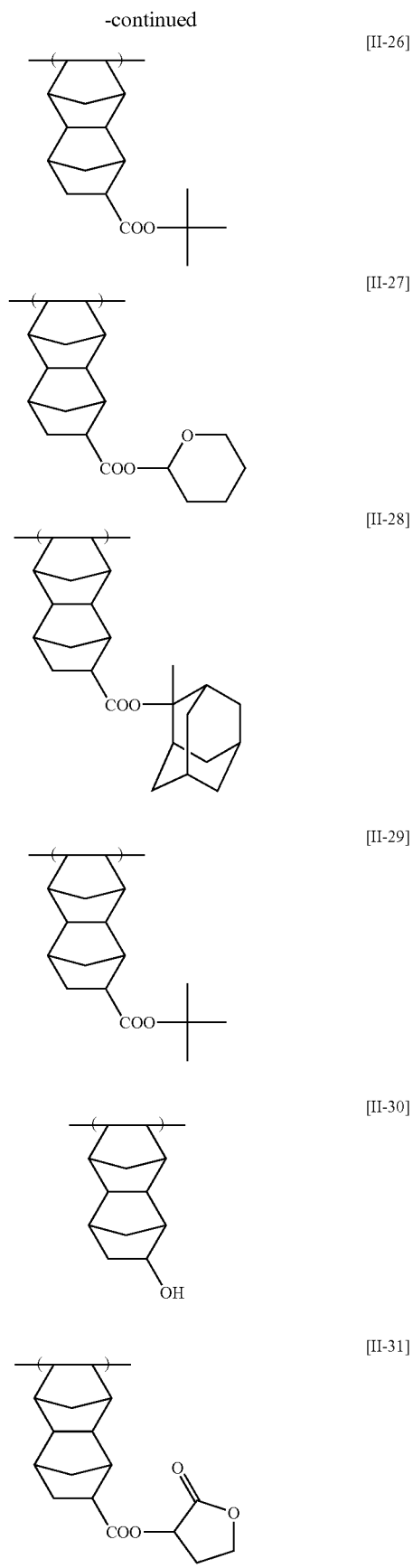

-continued

[II-32]
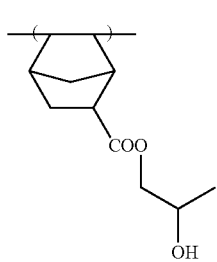

The acid decomposable resin of the invention can have a repeating unit having a lactone group in addition to the repeating unit having the group represented by the general formula (I). The subject repeating unit is preferably a repeating unit having a group having a lactone structure represented by the following general formula (Lc) or any one of the following general formulae (V-1) to (V-5), and the group having a lactone structure may be bonded directly to the main chain.

(Lc)
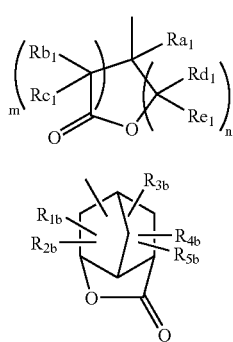

(V-1)
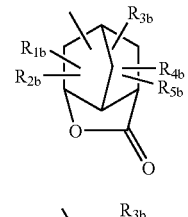

(V-2)
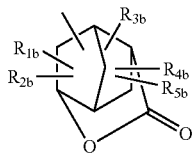

(V-3)
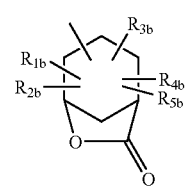

(V-4)
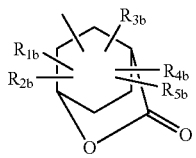

(V-5)
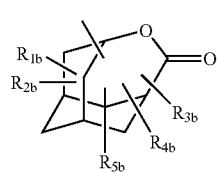

In the general formula (Lc), $Ra_1$, $Rb_1$, $Rc_1$, $Rd_1$, and $Re_1$ each independently represents a hydrogen atom or an alkyl group; m and n each independently represents an integer of from 0 to 3; and (m+n) is from 2 to 6.

In the general formulae (V-1) to (V-5), $R_{1b}$ to $R_{5b}$ each independently represents a hydrogen atom, an alkyl group, a cycloalkyl group, an alkoxy group, an alkoxycarbonyl group, an alkylsulfonylimino group, or an alkenyl group; and two of $R_{1b}$ to $R_{5b}$ may combine together to form a ring.

As the alkyl group of $Ra_1$ to $Re_1$ in the general formula (Lc) and the alkyl group in the alkyl group, alkoxy group, alkoxycarbonyl group and alkylsulfonylimino group of $R_{1b}$ to $R_{5b}$ in the general formulae (V-1) to (V-5), a linear or branched alkyl group is enumerated, and the alkyl group may have a substituent.

Examples of the repeating unit having the group having a lactone structure represented by the general formula (Lc) or any one of the general formulae (V-1) to (V-5) include a repeating unit in which at least one of $R_{13}'$ to $R_{16}'$ in the foregoing general formula (II-A) or (II-B) has a group represented by the general formula (Lc) or any one of the general formulae (V-1) to (V-5) (for example, $R_5$ of —$COOR_5$ represents the group represented by the general formula (Lc) or any one of the general formulae (V-1) to (V-5)) and a repeating unit represented by the following general formula (AI).

(AI)
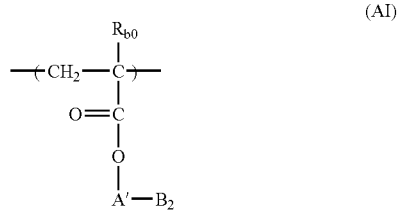

In the general formula (AI), $Rb_0$ represents a hydrogen atom, a halogen atom, or an alkyl group having from 1 to 4 carbon atoms.

Examples of the halogen atom of $Rb_0$ include a fluorine atom, a chlorine atom, a bromine atom, and an iodine atom. $Rb_0$ is preferably a hydrogen atom.

A' represents a single bond, an ether group, an ester group, a carbonyl group, an alkylene group, or a divalent group comprising a combination of these groups.

$B_2$ represents a group represented by the general formula (Lc) or any one of the general formulae (V-1) to (V-5).

Specific examples of the repeating unit having the group having a lactone structure will be given below, but it should not be construed that the invention is limited thereto.

(IV-1)
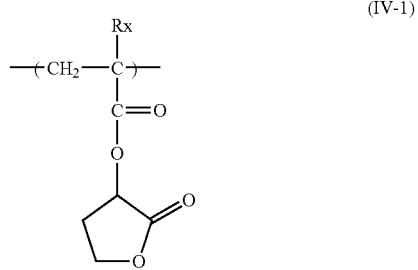

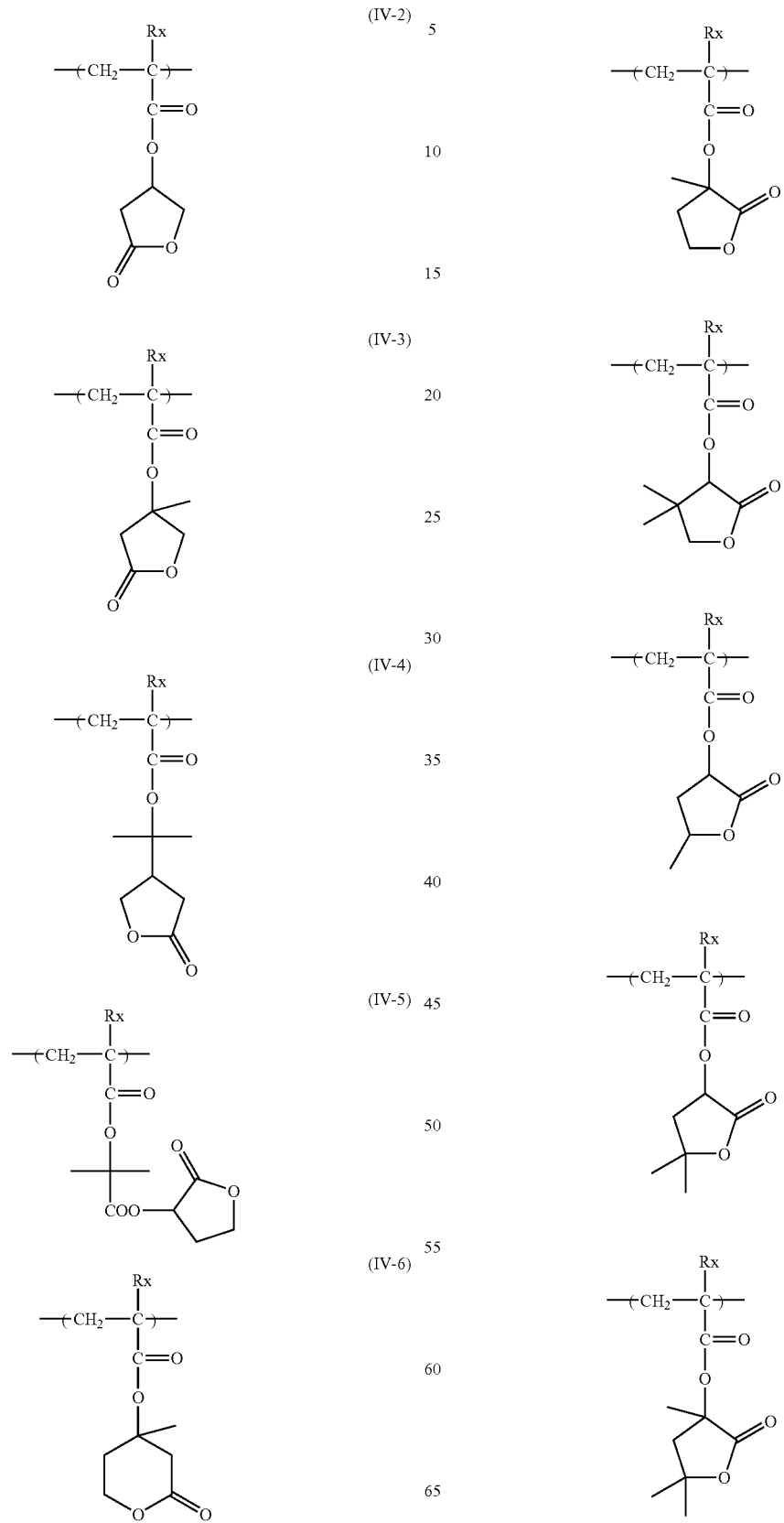

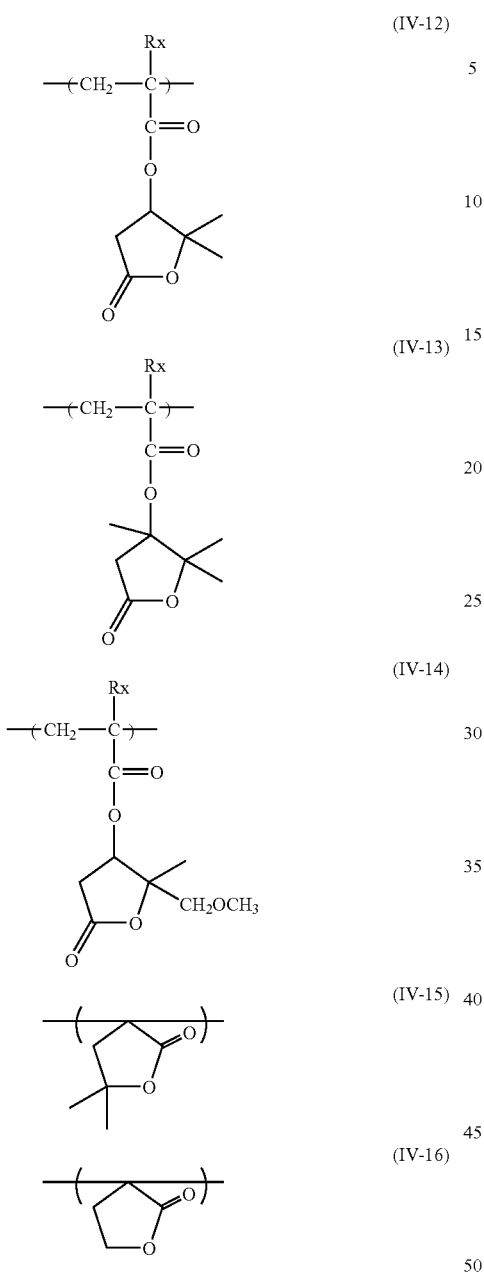
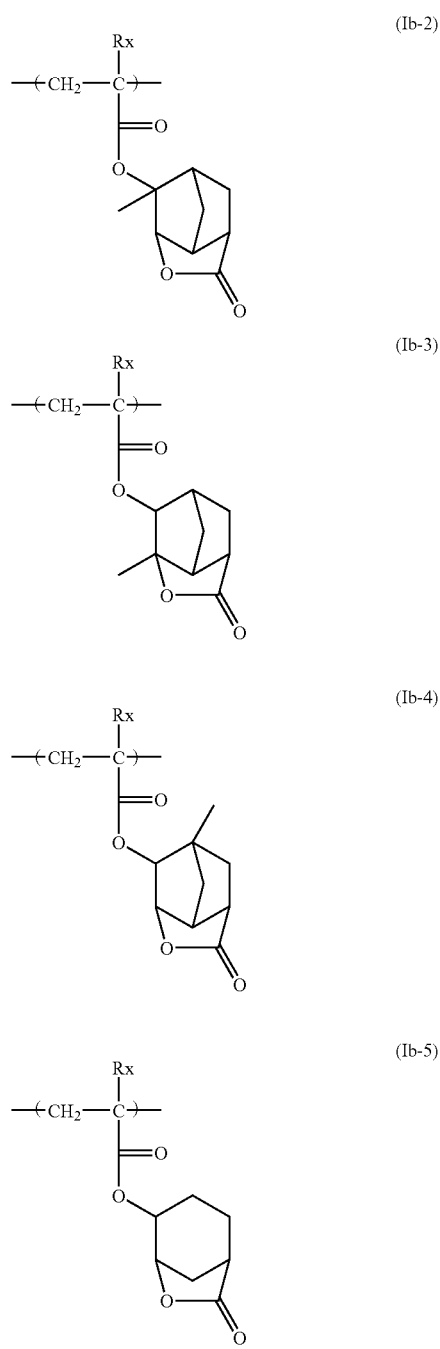
In the formulae, Rx represents H, CH$_3$, or CF$_3$.
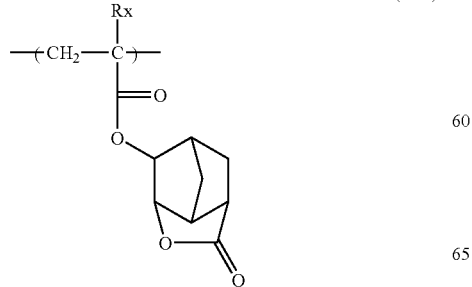
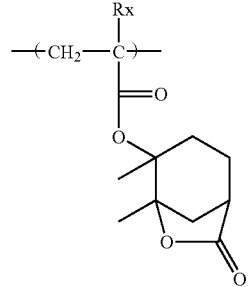

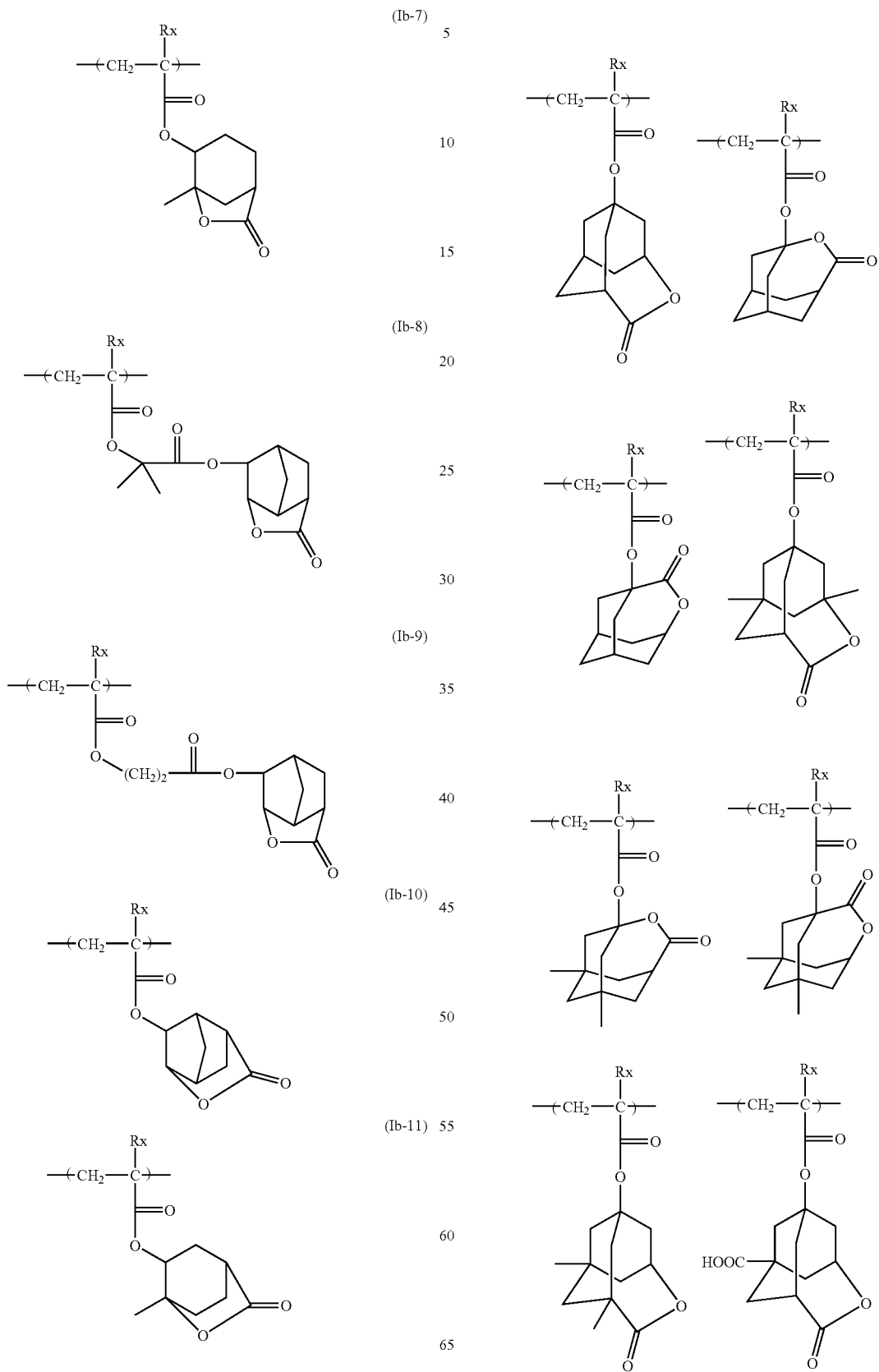
In the formulae, Rx represents H, CH₃, or CF₃.

-continued

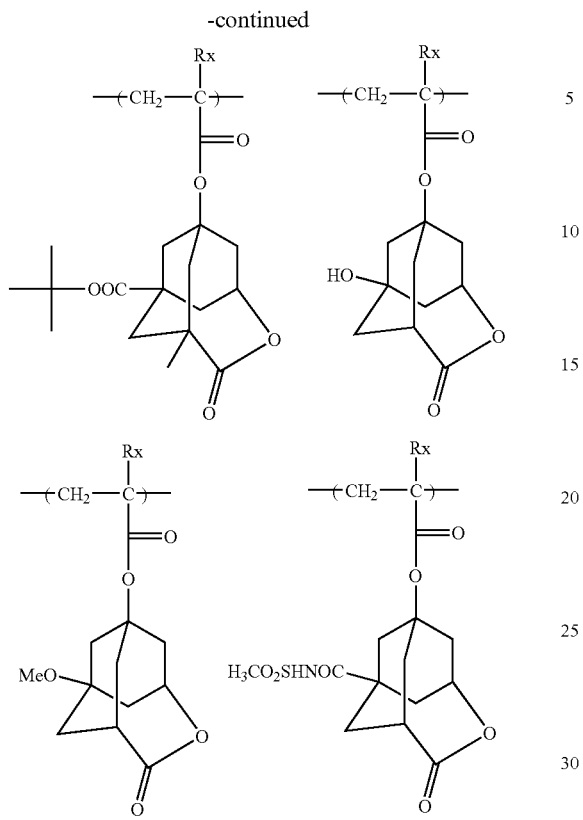

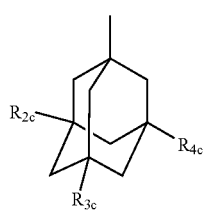

In the formulae, Rx represents H, $CH_3$, or $CF_3$.

The acid decomposable resin of the invention may contain a repeating unit having a group represented by the following general formula (VII).

(VII)

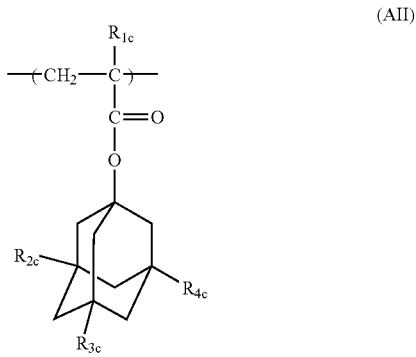

In the general formula (VII), $R_{2c}$ to $R_{4c}$ each independently represents a hydrogen atom or a hydroxyl group, with proviso that at least one of $R_{2c}$ to $R_{4c}$ represents a hydroxyl group.

The group represented by the general formula (VII) is preferably a dihydroxy body or a monohydroxy body, and more preferably a dihydroxy body.

Examples of the repeating unit having the group represented by the general formula (VII) include a repeating unit in which at least one of $R_{13}'$ to $R_{16}'$ in the foregoing general formula (II-A) or (II-B) has a group represented by the foregoing general formula (VII) (for example, $R_5$ of —$COOR_5$ represents a group represented by the general formula (VII)) and a repeating unit represented by the following general formula (AII).

(AII)

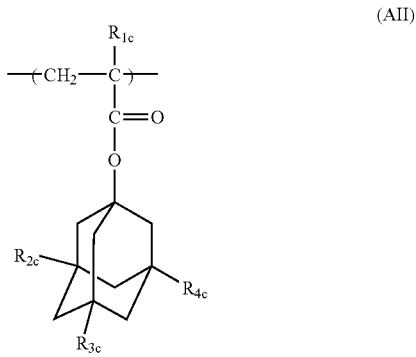

In the general formula (AII), $R_{1c}$ represents a hydrogen atom or a methyl group.

$R_{2c}$ to $R_{4c}$ each independently represents a hydrogen atom or a hydroxyl group, with proviso that at least one of $R_{2c}$ to $R_{4c}$ represents a hydroxyl group. It is preferable that two of $R_{2c}$ to $R_{4c}$ each represents a hydroxyl group.

Specific examples of the repeating unit having the structure of the general formula (AII) will be given below, but it should not be construed that the invention is limited thereto.

(1)

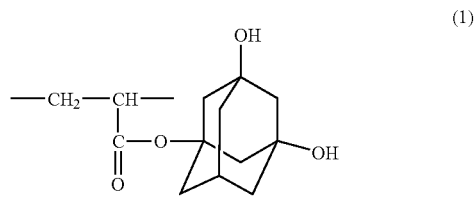

(2)

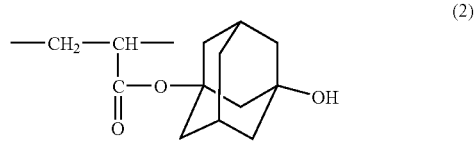

(3)

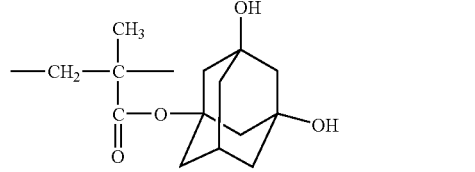

(4)

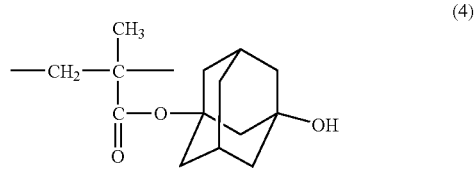

The acid decomposable resin of the invention may have a repeating unit having an alkali-soluble group.

As the alkali-soluble group, a carboxyl group is preferable. Specific examples thereof include a repeating unit in which a carboxyl group is bonded directly to the main chain by methacrylic acid, acrylic acid, or the like; and a repeating unit in which a carboxyl group by adamantane-3-carboxylic acid-1-(meth)acrylate or the like is bonded to the main chain via an alicyclic connecting group.

The acid decomposable resin of the invention may have a repeating unit represented by the following general formula (VIII).

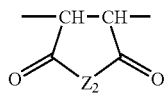
(VIII)

In the foregoing general formula (VIII), $Z_2$ represents —O— or —N($R_{41}$)—. Here, $R_{41}$ represents a hydrogen atom, a hydroxyl group, an alkyl group, or —OSO$_2$—$R_{42}$. $R_{42}$ represents an alkyl group, a cycloalkyl group, or a camphor residue. The alkyl group may be substituted with a halogen atom or the like.

Specific examples of the repeating unit represented by the foregoing general formula (VIII) include the following [I'-1] to [I'-7], but it should not be construed that the invention is limited thereto.

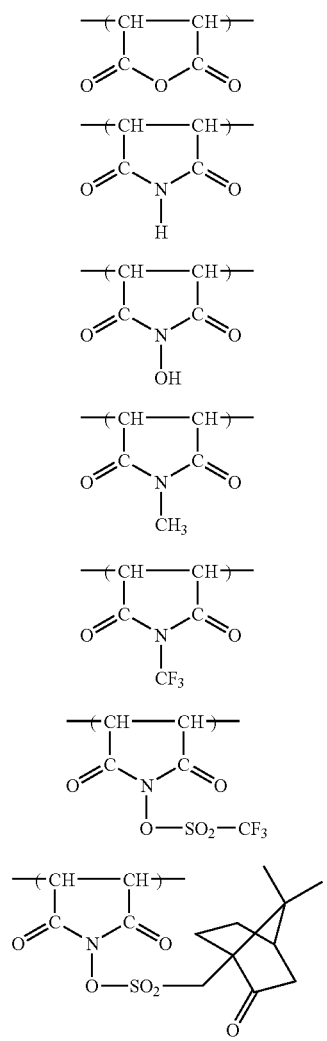

For the purpose of adjusting resistance to dry etching, adaptability of a standard developer, adhesion to a substrate, resist profile, and characteristics as generally required in resists, including resolution, heat resistance and sensitivity, the acid decomposable resin of the invention can contain various repeating structural units in addition to the foregoing repeating structural units.

As such repeating structural units, repeating structural units corresponding to the following monomers can be enumerated, but it should not be construed that the invention is limited thereto.

In this way, it is possible to finely adjusting performances as required in the acid decomposable resin, especially (1) solubility in a coating solvent, (2) film forming properties (for example, glass transition point), (3) alkali developability, (4) film thinning (for example, hydrophilicity/hydrophobicity and selected of an alkali-soluble group), (5) adhesion to a substrate in an unexposed area, and (6) resistance to dry etching.

Examples of such monomers include compounds having one addition polymerizable unsaturated bond selected from acrylic esters, methacrylic esters, acrylamides, methacrylamides, allyl compounds, vinyl ethers, and vinyl esters.

Besides, an addition polymerizable unsaturated compound may be copolymerized so far as it is copolymerizable with monomers corresponding to the foregoing various repeating units.

In the acid decomposable resin, a molar ratio of the content of each repeating structural unit is properly set up for the purpose of adjusting resistance to dry etching, adaptability of a standard developer, adhesion to a substrate, resist profile, and characteristics as generally required in resists, including resolution, heat resistance and sensitivity.

Preferred embodiments of the acid decomposable resin of the invention will be given below.

(1) An acid decomposable resin containing a repeating unit having a partial structure containing an alicyclic hydrocarbon represented by any one of the foregoing general formulae (pI) to (pVI) (side chain type).

(2) An acid decomposable resin containing a repeating unit represented by the general formula (II-AB) (main chain type).

However, in (2), the following can be additionally enumerated.

(3) An acid decomposable resin having a repeating unit represented by the general formula (II-AB), a maleic anhydride derivative, and a (meth)acrylate structure (hybrid type).

In the acid decomposable resin, the content of the at least one of the repeating unit (a) and the repeating unit (b) is preferably from 10 to 70% by mole, more preferably from 20 to 65% by mole, and further preferably from 25 to 60% by mole in the whole of repeating structural units.

In the acid decomposable resin, the content of the repeating unit containing an acid decomposable group is preferably from 10 to 70% by mole, more preferably from 20 to 65% by mole, and further preferably from 25 to 60% by mole in the whole of repeating structural units.

In the acid decomposable resin, the content of the repeating unit having a partial structure containing the alicyclic hydrocarbon represented by any one of the general formulae (pI) to (pVI) is preferably from 20 to 70% by mole, more preferably from 24 to 65% by mole, and further preferably from 28 to 60% by mole in the whole of repeating structural units.

In the acid decomposable resin, the content of the repeating unit represented by the general formula (II-AB) is preferably from 10 to 60% by mole, more preferably from 15 to 55% by mole, and further preferably from 20 to 50% by mole in the whole of repeating structural units.

Furthermore, though the content of the repeating structural unit based on the monomer of the foregoing additional copolymerization component in the resin can be properly set up depending upon the desired performance of the resist, in general, it is preferably not more than 99% by mole, more preferably not more than 90% by mole, and further preferably not more than 80% by mole based on the total molar number of the sum of the repeating structural unit having a partial structure containing the alicyclic hydrocarbon represented by any one of the foregoing general formulae (pI) to (pVI) and the repeating unit represented by the foregoing general formula (II-AB).

When the composition of the invention is one for ArF exposure, it is preferable that the resin does not have an aromatic group in view of transparency to ArF light.

The acid decomposable resin which is used in the invention can be synthesized by a customary method (for example, radical polymerization). For example, as a general synthesis method, monomer species are charged collectively or on the way of reaction in a reactor; the mixture is dissolved in a reaction solvent (for example, cyclic ethers such as tetrahydrofuran and 1,4-dioxane; ketones such as methyl ethyl ketone, methyl isobutyl ketone, and cyclohexanone; and solvents capable of dissolving the composition of the invention therein as described later, such as propylene glycol monomethyl ether acetate and propylene glycol monomethyl ether) to form a uniform solution as the need arises; and polymerization is then initiated in an atmosphere of an inert gas such as nitrogen and argon optionally under heating and using a commercially available radical initiator (for example, azo based initiators and peroxides). If desired, the initiator is supplemented or dividedly added, and after completion of the reaction, the reaction mixture is thrown into a solvent, thereby recovering a desired polymer by a method of powder or solid recovery or the like. The reaction concentration is 10% by weight or more, preferably 15% by weight or more, and more preferably 20% by weight or more. The reaction temperature is from 10° C. to 150° C., preferably from 30° C. to 120° C., and more preferably from 50 to 100° C.

The repeating structural units represented by the foregoing specific examples may be used singly or in admixture of plural kinds thereof.

Also, in the invention, the resin may be used singly or in admixture of plural kinds thereof.

The acid decomposable resin can have plural optical isomers in the repeating unit (a) or repeating unit (b). Though a single optical isomer may be used, or a mixture of plural optical isomers may be used, it is preferred to use a single optical isomer.

A weight average molecular weight of the resin according to the invention is preferably from 1,000 to 200,000, and more preferably from 3,000 to 20,000 as reduced into polystyrene by the GPC method. By making the weight average molecular weight fall within the range of from 1,000 to 200,000, it is possible to prevent deterioration of heat resistance or resistance to dry etching. Also, it is possible to prevent deterioration of developability or deterioration of film forming properties caused due to an increase of viscosity.

A resin having a weight molecular weight distribution usually ranging from 1 to 5, preferably from 1 to 4, and more preferably from 1 to 3 is used. When the molecular weight distribution is low, not only the resin has excellent resolution and resist shape, but also a side wall of the resist pattern is smooth and excellent in roughness properties.

In the photosensitive composition of the invention, a blending amount of all of the resins according to the invention in the whole composition is preferably from 40 to 99.99% by weight, and more preferably from 50 to 99.97% by weight in the whole of solids.

[2] A Compound Capable of Generating an Acid Upon Irradiation with Active Rays or Radiations (Compound (B)):

One embodiment of the photosensitive composition of the invention can preferably contain a compound capable of generating an acid upon irradiation with active ray or radiation.

As such a photo-acid generator, photoinitiators of photo-cationic polymerization, photoinitiators of photo-radical polymerization, photo-decoloring agents of dyes, photo-discoloring agents, and known compounds capable of generating an acid upon irradiation with active rays or radiations as used in micro-resists and the like or mixtures thereof can be properly selected and used.

Examples thereof include diazonium salts, phosphonium salts, sulfonium salts, iodonium salts, imide sulfonates, oxime sulfonates, diazodisulfones, disulfones, and o-nitrobenzyl sulfonate.

Furthermore, compounds resulting from introduction of a group or compound capable of generating an acid upon irradiation with active rays or radiations in the main chain or side chain of the polymer, for example, compounds as described in U.S. Pat. No. 3,849,137, German Patent No. 3,914,407, JP-A-63-26653, JP-A-55-164824, JP-A-62-69263, JP-A-63-146038, JP-A-63-163452, JP-A-62-153853, and JP-A-63-146029, can be used.

Moreover, compounds capable of generating an acid by light, as described in U.S. Pat. No. 3,779,778 and European Patent No. 126,712, can be used.

Of the compounds capable of being decomposed upon irradiation with active rays or radiations to generate an acid, which may be used, compounds represented by the following general formulae (ZI), (ZII) and (ZIII) are preferable.

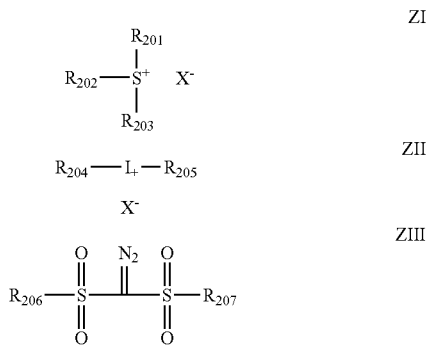

In the foregoing general formula (ZI), $R_{201}$, $R_{202}$, and $R_{203}$ each independently represents an organic group, and $X^-$ represents a non-nucleophilic anion (preferred examples thereof include a sulfonic acid anion, a carboxylic acid anion, a bis(alkylsulfonyl)amide anion, a tris(alkylsulfonyl)methide anion, $BF_4^-$, $PF_6^-$, and $SbF_6^-$; and carbon atom-containing organic anions are more preferable).

As the organic anion, the following organic anions are preferable.

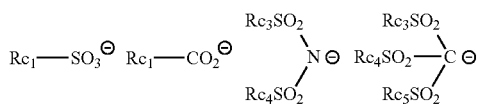

Rc$_1$ represents an organic group.

As the organic group in Rc$_1$, ones having from 1 to 30 carbon atoms are enumerated. Of these, an alkyl group, a cycloalkyl group, an aryl group, and a group in which a plurality of the foregoing groups are connected to each other via a connecting group such as a single bond, —O—, —CO$_2$—, —S—, —SO$_3$—, and —SO$_2$N(Rd$_1$)— are preferable.

Rd$_1$ represents a hydrogen atom or an alkyl group.

Rc$_3$, Rc$_4$, and Rc$_5$ each independently represents an organic group.

As the organic group of Rc$_3$, Rc$_4$, and Rc$_5$, those which are the same as in the preferred organic group in Rc$_1$ can be preferably enumerated, and a perfluoroalkyl group having from 1 to 4 carbon atoms is the most preferable.

Rc$_3$ and Rc$_4$ may combine together to form a ring.

Examples of the group which Rc$_3$ and Rc$_4$ are taken together to form include an alkylene group and an arylene group. Of these, a perfluoroalkylene group having from 2 to 4 carbon atoms is preferable.

As the organic group of Rc$_1$ and Rc$_3$ to Rc$_5$, an alkyl group in which the 1-position thereof is substituted with a fluorine atom or a fluoroalkyl group and a phenyl group which is substituted with a fluorine atom or a fluoroalkyl group are the most preferable. When the organic group has a fluorine atom or a fluoroalkyl group, an acidity of the acid as generated upon irradiation with light increases so that the sensitivity is enhanced.

The carbon atom number of the organic group as R$_{201}$, R$_{202}$ and R$_{203}$ is in general from 1 to 30, and preferably from 1 to 20.

Furthermore, two of R$_{201}$ to R$_{203}$ may combine together to form a ring structure, and the ring may contain an oxygen atom, a sulfur atom, an ester bond, an amide bond, or a carbonyl group therein.

As the group which two of R$_{201}$ to R$_{203}$ are taken together to form, an alkylene group (for example, a butylene group and a pentylene group) can be enumerated.

Specific examples of R$_{201}$, R$_{202}$ and R$_{203}$ include corresponding groups in compounds (ZI-1), (ZI-2) and (ZI-3) as described later.

Incidentally, compounds having plural structures represented by the general formula (ZI) may be employed. For example, compounds having a structure in which at least one of R$_{201}$ to R$_{203}$ of a compound represented by the general formula (ZI) is bonded to at least one of R$_{201}$ to R$_{203}$ of another compound represented by the general formula (ZI) may be employed.

As more preferred examples as the component (ZI), compounds (ZI-1), (ZI-2) and (ZI-3) as described below can be enumerated.

The compound (ZI-1) is an arylsulfonium compound represented by the foregoing general formula (ZI) wherein at least one of R$_{201}$ to R$_{203}$ is an aryl group, that is, a compound in which an arylsulfonium is a cation.

In the arylsulfonium compound, all of R$_{201}$ to R$_{203}$ may be an aryl group, or a part of R$_{201}$ to R$_{203}$ may be an aryl group, with the remainder being an alkyl group or a cycloalkyl group.

Examples of the arylsulfonyl compound include triarylsulfonium compounds, diarylalkylsulfonium compounds, aryldialkylsulfonium compounds, diarylcycloalkylsulfonium compounds, and aryldicycloalkylsulfonium compounds.

As the aryl group of the arylsulfonium compound, a phenyl group, a naphthyl group, and an indol residue are preferable; and a phenyl group and an indol residue are more preferable. When the arylsulfonium compound has two or more aryl groups, the two or more aryl groups may be the same or different.

As the alkyl group which the arylsulfonium compound optionally has, a linear or branched alkyl group having from 1 to 15 carbon atoms is preferable. Examples thereof include a methyl group, an ethyl group, a propyl group, an n-butyl group, a sec-butyl group, and a t-butyl group.

As the cycloalkyl group which the arylsulfonium compound optionally has, a cycloalkyl group having from 3 to 15 carbon atoms is preferable. Examples thereof include a cyclopropyl group, a cyclobutyl group, and a cyclohexyl group.

The aryl group, the alkyl group and the cycloalkyl group of R$_{201}$ to R$_{203}$ may have an alkyl group (for example, ones having from 1 to 15 carbon atoms), a cycloalkyl group (for example, ones having from 3 to 15 carbon atoms), an aryl group (for example, ones having from 6 to 14 carbon atoms), an alkoxy group (for example, ones having from 1 to 15 carbon atoms), a halogen atom, a hydroxyl group, or a phenylthio group as a substituent. Preferred examples of the substituent include a linear or branched alkyl group having from 1 to 12 carbon atoms, a cycloalkyl group having from 3 to 12 carbon atoms, and a linear, branched or cyclic alkoxy group having from 1 to 12 carbon atoms. Of these, an alkyl group having from 1 to 4 carbon atoms and an alkoxy group having from 1 to 4 carbon atoms are the most preferable. The substituent may be substituted on any one of R$_{201}$ to R$_{203}$ or may be substituted on all of R$_{201}$ to R$_{203}$. Also, when R$_{201}$ to R$_{203}$ are an aryl group, it is preferable that the substituent is substituted at the p-position of the aryl group.

Next, the compound (ZI-2) will be described below.

The compound (ZI-2) is a compound represented by the general formula (ZI) wherein R$_{201}$ to R$_{203}$ each independently represents an aromatic ring-free organic group. The aromatic ring as referred to herein also includes an aromatic ring containing a hetero atom.

The carbon atom number of the aromatic ring-free organic group as R$_{201}$ to R$_{203}$ is in general from 1 to 30, and preferably from 1 to 20.

R$_{201}$ to R$_{203}$ each independently represents preferably an alkyl group, a cycloalkyl group, a linear, branched or cyclic 2-oxoalkyl group, an alkoxycarbonylmethyl group, an allyl group, or a vinyl group; more preferably a linear, branched or cyclic 2-oxoalkyl group or an alkoxycarbonylmethyl group; and most preferably a linear or branched 2-oxoalkyl group.

The alkyl group as R$_{201}$ to R$_{203}$ may be linear or branched and is preferably a linear or branched alkyl group having from 1 to 10 carbon atoms. Examples thereof include a methyl group, an ethyl group, a propyl group, a butyl group, and a pentyl group.

The cycloalkyl group as R$_{201}$ to R$_{203}$ is preferably a cycloalkyl group having from 3 to 10 carbon atoms. Examples thereof include a cyclopentyl group, a cyclohexyl group, and a norbornyl group.

The 2-oxoalkyl group as $R_{201}$ to $R_{203}$ may be linear, branched or cyclic and is preferably a group in which the foregoing alkyl group or cycloalkyl group has >C=O at the 2-position thereof.

The alkoxy group in the alkoxycarbonylmethyl group as $R_{201}$ to $R_{203}$ is preferably an alkoxy group having from 1 to 5 carbon atoms (for example, a methoxy group, an ethoxy group, a propoxy group, a butoxy group, and a pentyloxy group).

$R_{201}$ to $R_{203}$ may be additionally substituted with a halogen atom, an alkoxy group (for example, ones having from 1 to 5 carbon atoms), a hydroxyl group, a cyano group, or a nitro group.

The compound (ZI-3) as referred to herein is a compound represented by the following general formula (ZI-3) and is a compound having a phenacylsulfonium salt structure.

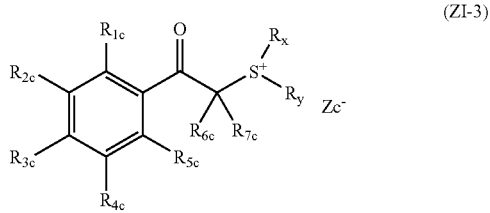

(ZI-3)

In the general formula (ZI-3), $R_{1c}$ to $R_{5c}$ each independently represents a hydrogen atom, an alkyl group, a cycloalkyl group, an alkoxy group, or a halogen atom.

$R_{6c}$ and $R_{7c}$ each independently represents a hydrogen atom, an alkyl group, or a cycloalkyl group.

Rx and Ry each independently represents an alkyl group, a cycloalkyl group, a 2-oxoalkyl group, an alkoxycarbonylmethyl group, an allyl group, or a vinyl group.

Two or more of $R_{1c}$ to $R_{5c}$, $R_{6c}$ and $R_{7c}$, or Rx and Ry may combine together to form a ring structure. This ring structure may contain an oxygen atom, a sulfur atom, an ester bond, or an amide bond. Examples of the group which two or more of $R_{1c}$ to $R_{5c}$, $R_{6c}$ and $R_{7c}$, or Rx and Ry are taken together to form include a butylene group and a pentylene group.

$Zc^-$ represents a non-nucleophilic anion, and examples thereof are those which are the same as in the non-nucleophilic anion of $X^-$ in the general formula (ZI).

The alkyl group as $R_{1c}$ to $R_{7c}$ may be linear or branched and is preferably a linear or branched alkyl group having from 1 to 20 carbon atoms, and more preferably a linear or branched alkyl group having from 1 to 12 carbon atoms. Examples thereof include a methyl group, an ethyl group, a linear or branched propyl group, a linear or branched butyl group, and a linear or branched pentyl group.

The cycloalkyl group as $R_{1c}$ to $R_{7c}$ is preferably a cycloalkyl group having from 3 to 8 carbon atoms. Examples thereof include a cyclopentyl group and a cyclohexyl group.

The alkoxy group as $R_{1c}$ to $R_{5c}$ may be linear, branched or cyclic. Examples thereof include an alkoxy group having from 1 to 10 carbon atoms. Of these, a linear or branched alkoxy group having from 1 to 5 carbon atoms (for example, a methoxy group, an ethoxy group, a linear or branched propoxy group, a linear or branched butoxy group, and a linear or branched pentoxy group) and a cyclic alkoxy group having from 3 to 8 carbon atoms (for example, a cyclopentyloxy group and a cyclohexyloxy group) are preferable.

It is preferable that any one of $R_{1c}$ to $R_{5c}$ represents a linear or branched alkyl group, a cycloalkyl group, or a linear branched or cyclic alkoxy group; and it is more preferable that the sum of the carbon atom number of from $R_{1c}$ to $R_{5c}$ is from 2 to 15. In this way, the solubility in a solvent is further enhanced, and the generation of particles at the time of preservation is suppressed.

Examples of the alkyl group or cycloalkyl groups as Rx and Ry include those which are the same as in the alkyl group or cycloalkyl group as $R_{1c}$ to $R_{7c}$.

As the 2-oxoalkyl group, a group in which the alkyl group or cycloalkyl group as $R_{1c}$ to $R_{7c}$ has >C=O at the 2-position thereof can be enumerated.

With respect to the alkoxy group in the alkoxycarbonylmethyl group, those which are the same as in the alkoxy group as $R_{1c}$ to $R_{5c}$ can be enumerated.

Rx and Ry are each preferably an alkyl group having 4 or more carbon atoms, more preferably an alkyl group having 6 or more carbon atoms, and further preferably an alkyl group having 8 or more carbon atoms.

In the general formulae (ZII) and (ZIII), $R_{204}$ to $R_{207}$ each independently represents an aryl group, an alkyl group, or a cycloalkyl group.

As the aryl group as $R_{204}$ to $R_{207}$, a phenyl group and a naphthyl group are preferable; and a phenyl group is more preferable.

The alkyl group as $R_{204}$ to $R_{207}$ may be linear or branched and is preferably a linear or branched alkyl group having from 1 to 10 carbon atoms. Examples thereof include a methyl group, an ethyl group, a propyl group, a butyl group, and a pentyl group.

The cycloalkyl group as $R_{204}$ to $R_{207}$ is preferably a cycloalkyl group having from 3 to 10 carbon atoms. Examples thereof include a cyclopentyl group, a cyclohexyl group, and norbornyl group.

$R_{204}$ to $R_{207}$ may have a substituent. Examples of the substituent which $R_{204}$ to $R_{207}$ may have include an alkyl group (for example, ones having from 1 to 15 carbon atoms), a cycloalkyl group (for example, ones having from 3 to 15 carbon atoms), an aryl group (for example, ones having from 6 to 15 carbon atoms), an alkoxy group (for example, ones having from 1 to 15 carbon atoms), a halogen atom, a hydroxyl group, and a phenylthio group.

$X^-$ represents a non-nucleophilic anion, and examples thereof are those which are the same as in the non-nucleophilic anion of $X^-$ in the general formula (I).

As the compound capable of generating an acid upon irradiation with active rays or radiations, which can be used, compounds represented by the following general formulae (ZIV), (ZV) and (ZVI) can be additionally enumerated.

$$Ar_3-SO_2-SO_2-Ar_4$$

ZIV

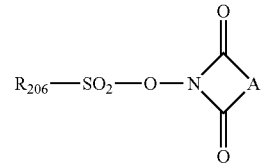

ZV

-continued

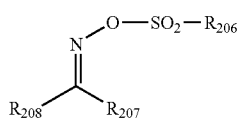
(ZVI)

In the general formulae (ZIV) to (ZVI),
Ar3 and Ar4 each independently represents an aryl group, $R_{206}$, $R_{207}$, and $R_{208}$ each independently represents an alkyl group or an aryl group, and A represents an alkylene group, an alkenylene group, or an arylene group.

Of the compounds capable of generating an acid upon irradiation with active rays or radiations, the compounds represented by the general formula (ZI) to (ZIII) are more preferable.

Especially preferred examples of the compound capable of generating an acid upon irradiation with active rays or radiations will be given below.

(z1) 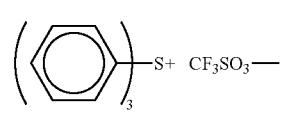

(z2) 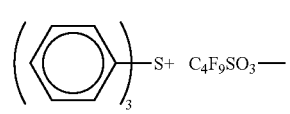

(z3) 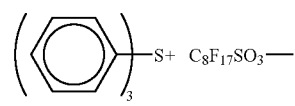

(z4) 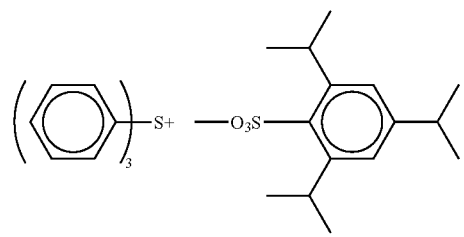

(z5) 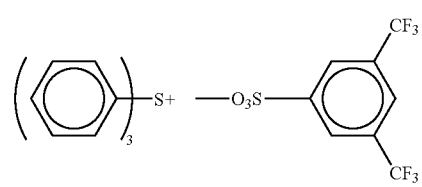

(z6) 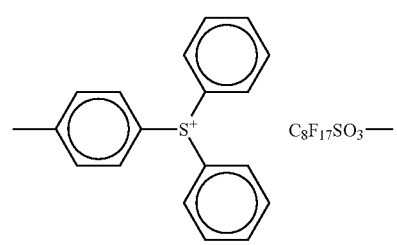

(z7) 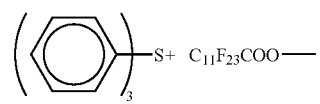

(z8) 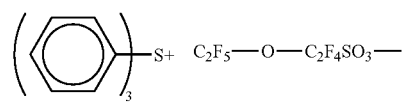

(z9) 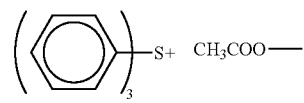

(z10) 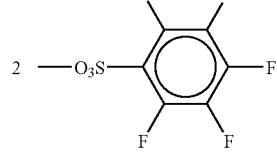

(z11) 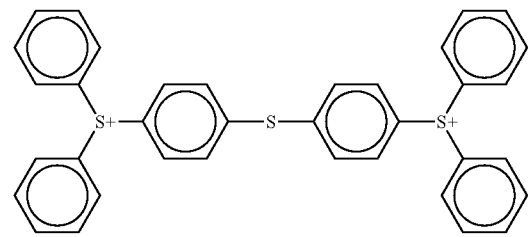

(z12) 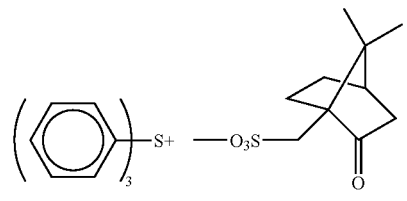

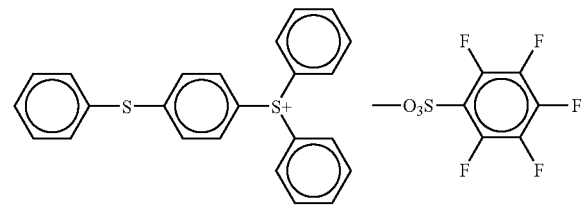

-continued

-continued
(z29) 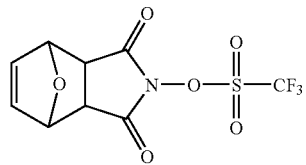
(z30) 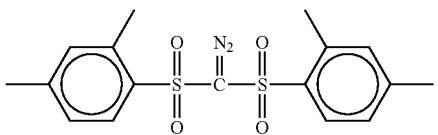
(z31) 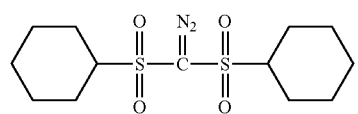
(z32) 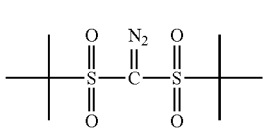
(z33) 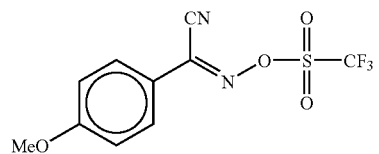
(z34) 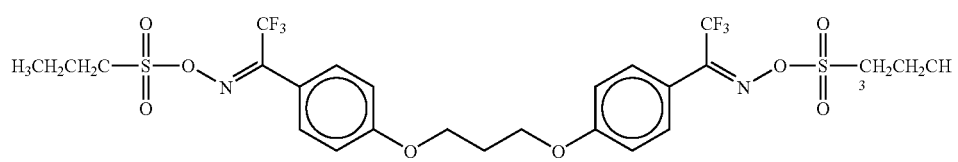
(z35) 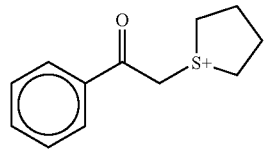
(z36) 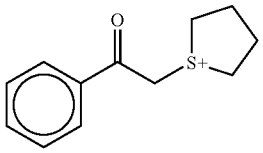
(z37) 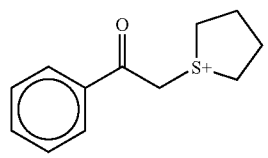
(z38) 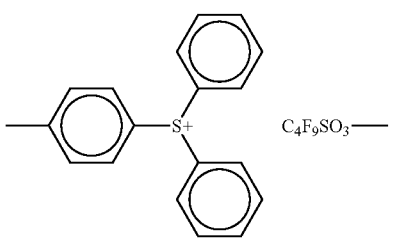
(z39) 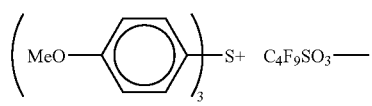
(z40) 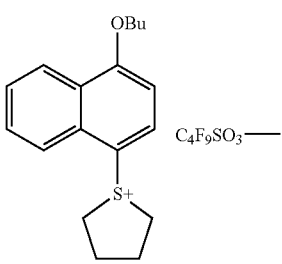
(z41) 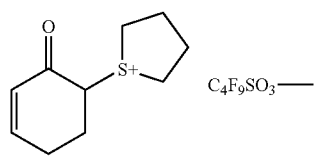
(z42) 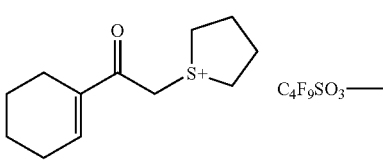

-continued
(z43) 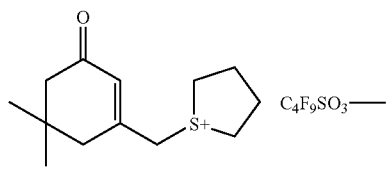
(z44) 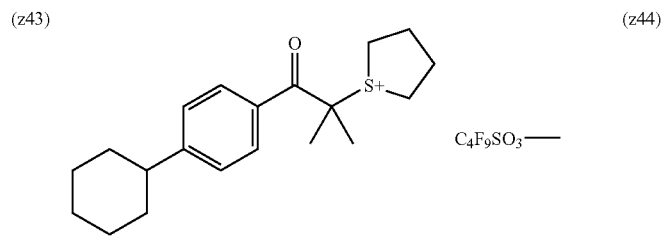
(z45) 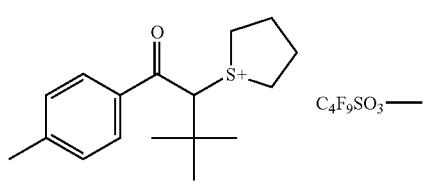
(z46) 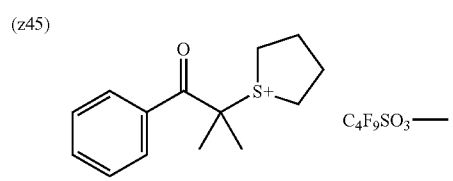
(z47) 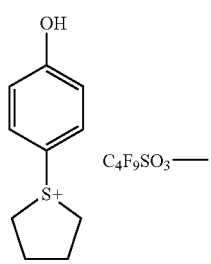
(z48) 
(z49) 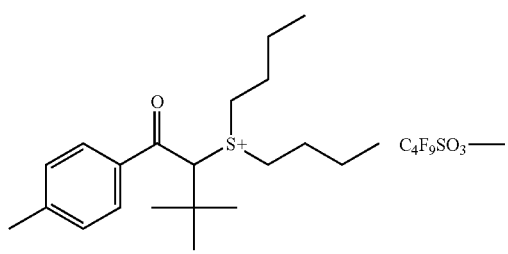
(z50) 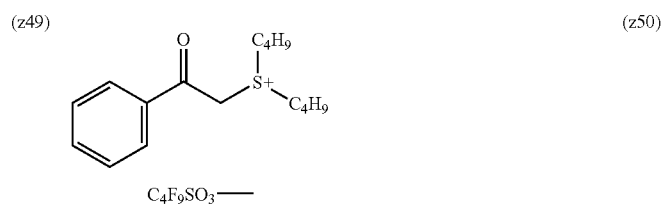
(z51) 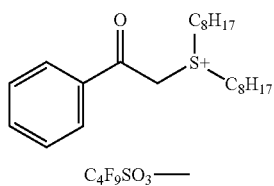
(z52) 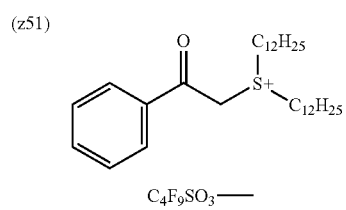
(z53) 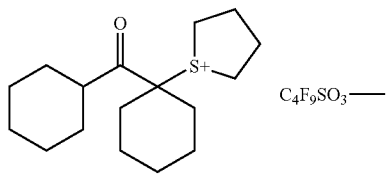
(z54) 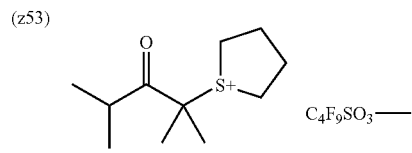
(z55) 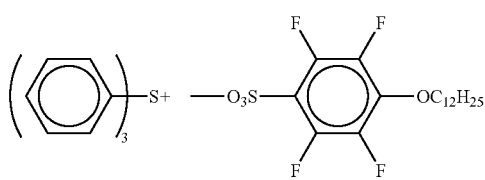
(z56) 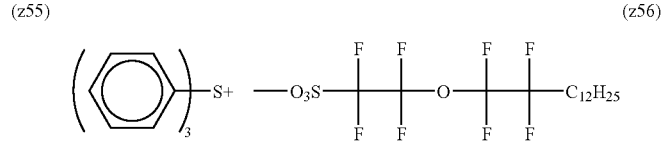

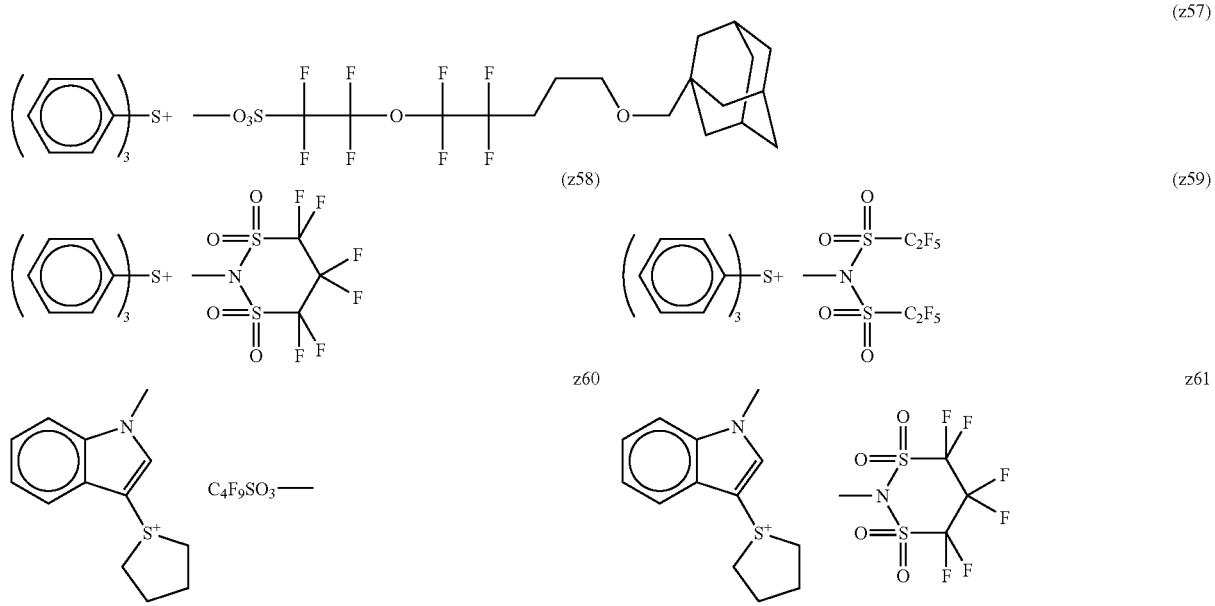

An addition amount of the compound as the component (B) is usually from 0.1 to 20% by weight, preferably from 0.5 to 20% by weight, and more preferably from 1 to 10% by weight based on the whole of solids of the composition.

[3] (C) Basic Compound:

It is preferable that the photosensitive composition of the invention further contains a basic compound.

As the basic compound, organic amines, basic ammonium salts, basic sulfonium salts, basic iodonium salts, and the like are used, and ones which do not deteriorate sublimation or resist performance are useful. The basic compound is a component having an action to control a diffusion phenomenon of an acid as generated from an acid generator by exposure in a resist film and suppress a non-preferable chemical reaction in a non-exposed region. By blending such a basic compound, it is possible to obtain a composition having extremely excellent process stability such that a diffusion phenomenon of an acid as generated from an acid generator by exposure in a resist film is controlled, storage stability of the resulting photosensitive composition is enhanced, resolution as a resist is further enhanced, and a change of line width of a resist pattern due to fluctuation of deferment time of period (PED) from exposure until development treatment can be suppressed.

As the basic compound, an organic amine can be used. Examples thereof include primary, secondary and tertiary aliphatic amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives, and nitrogen-containing compounds having a cyano group.

Examples of the aliphatic amine include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decyl amine, dodecylamine, cetyl amine, methylenediamine, ethylenediamine, tetraethylenepentamine, dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N, N',N'-tetramethylmethylenediamine, N,N,N',N'-tetramethylethylenediamine, N,N,N',N'-tetramethyltetraethylenepentamine, dimethylethyl amine, methyl ethylpropylamine, benzylamine, phenethylamine, and benzyldimethylamine.

Examples of the aromatic amine and the heterocyclic amine include aniline derivatives (for example, aniline, N-methylaniline, N-ethylaniline, N-propylaniline, N,N-dimethylaniline, 2-methylaniline, 3-methyaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, and N-methylpyrrole), oxazole derivatives (for example, oxazole and isoxazole), thiazole derivatives (for example, thiazole and isothiazole), imidazole derivatives (for example, imidazole, 4-methylimidazole, and 4-methyl-2-phenylimidazole), pyrazole derivatives, furazane derivatives, pyrroline derivatives (for example, pyrroline and 2-methyl-1-pyrroline), pyrrolidine derivatives (for example, pyrrolidine, N-methylpyrrolidine, pyrrolidinone, and N-methylpyrrolidone), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the nitrogen-containing compound having a carboxyl group include aminobenzoic acid, indolecarboxylic acid, and amino acid derivatives (for example, nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyal anine).

Examples of the nitrogen-containing compound having a sulfonyl group include 3-pyridinesulfonic acid and p-toluenesulfonic acid pyridinium.

Examples of the nitrogen-containing compound having a hydroxyl group include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, pyridineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-3-pyrrolidineethanol, 1-aziridineethanol, N-(2-hydroxyethyl)phthalimide, and N-(2-hydroxyethyl)isonicotinamide.

Examples of the amide derivative include formamide, N-methylformamide, N,N-dimethylformamide, acetamide, N-methylacetamide, N,N-dimethylacetamide, propionamide, and benzamide.

Examples of the imide derivative include phthalimide, succinimide, and maleimide.

Specific examples of the nitrogen-containing compound having a cyano group include 3-(diethylamino)propionitrile, N,N-bis(2-hydroxyethyl)-3-aminopropionitrile, N,N-bis(2-acetoxyethyl)-3-aminopropionitrile, N,N-bis(2-formyloxyethyl)-3-aminopropionitrile, N,N-bis(2-methoxyethyl)-3-aminopropionitrile, N,N-bis[2-(methoxymethoxy)ethyl]-3-aminopropionitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropionitrile, N-(2-cyanoethyl)-N-(2-hydroxyethyl)-3-aminopropionitrile, N-(2-acetoxyethyl)-N-(2-cyanoethyl)-3-aminopropionitrile, N-(2-cyanoethyl)-N-(2-formyloxyethyl)-3-amino-propionitrile, N-(2-cyanoethyl)-N-(2-methoxyethyl)-3-aminopropionitrile, N-(2-cyanoethyl)-N-[2-(methoxymethoxy)ethyl]-3-aminopropionitrile, N-(2-cyanoethyl)-N-(3-hydroxy-1-propyl)-3-aminopropionitrile, N-(3-acetoxy-1-propyl)-N-(2-cyanoethyl)-3-aminopropionitrile, N-(2-cyanoethyl)-N-(3-formyloxy-1-propyl)-3-aminopropionitrile, N-(2-cyanoethyl)-N-tetrahydrofurfuryl-3-aminopropionitrile, N,N-bis(2-cyanoethyl)-3-aminopropionitrile, diethylaminoacetonitrile, N,N-bis(2-hydroxyethyl)aminoacetonitrile, N,N-bis(2-acetoxyethyl) aminoacetonitrile, N,N-bis-(2-formyloxyethyl) aminoacetonitrile, N,N-bis(2-methoxyethyl) aminoacetonitrile, N,N-bis[2-(methoxymethoxy)ethyl] aminoacetonirile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoaetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetorile, N-cyanomethyl-N-(3-formyloxy-1-propyl) aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis (2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]-octane, 4-dimethylaminopyridine, 1-naphthylamine, piperidines, hexamethylenetetramine, imidazoles, hydroxypyridines, pyridines, anilines, hydroxyalkylanilines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, triisooctylamine, tris(ethylhexyl)amine, tridecylamine, tridodecylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3- hydroxyphenyl)propane, 2-(4-aminophenyl)-2-(4-hydroxyphenyl)propane, 1,4-bis[1-(4-aminophenyl)-1-methylethyl]benzene, 1,3-[1-(4-aminophenyl)-1-methylethyl]benzene, bis(2-dimethylaminoethyl) ether, bis (2-diethylaminoethyl) ether, N,N,N',N'-tetrakis(2-hydroxypropyl)ethylenediamine, tri(cyclo)alkylamines such as tricyclohexylamine, aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, and 2,6-diisopropylaniline, polyethyleneimine, polyallylamine, polymers of 2-dimethylaminoethyl acrylamide, N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantyl amine, N,N-di-t-butoxycarbonyl-1-ad amantyl amine, N,N-di-t-butoxycarbonyl-N-methyl-1-adamantylamine, N-t-butoxycarbonyl-4,4'-diaminodiphenylmethane, N,N-di-t-butoxycarbonylhexamethylenediamine, N,N,N',N'-tetra-t-butoxycarbonylhexamethylenediamine, N,N'-di-t-butoxycabonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, formamide, N-methylformamide, N,N-dimethylformamide, acetamide, N-methylacetamide, N,N-dimethylacetamide, propionamide, benzamide, pyrrolidone, N-methylpyrrolidone, urea, methylurea, 1,1-dimethylurea, 1,3-dimethylurea, 1,1,3,3-tetramethylurea, 1,3-diphenylurea, tri-n-butylthiourea, imidazoles such as, imidazole, 4-methylimidazole, 4-methyl-2-phenylimidazole, benzimidazole, and 2-phenylmidazole, pyridines such as pyridiene, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 4-hydroxyquinoline, 8-oxoquinoline, and acridine, piperazines such as piperazine and 1-(2-hydroxyethyl)piperazine, and besides, pyrazine, pyrazole, pyridazine, quinozaline, purine, pyrrolidine, piperidine, 3-piperidino-1,2-propanediol, morpholine, 4-methylmorpholine, 1,4-dimethylpiperazine, and 1,4-diazabicyclo[2.2.2]octane.

Of these, 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, imidazoles, hydroxypyridienes, pyridines, and organic amines such as 4,4'-diaminodiphenyl ether, triethylamine, tributylamine, tripentylamine, tri-n-octylamine, tris(ethylhexyl)amine, tridodecylamine, N,N-dihydroxyethylaniline, and N-hydroxyethyl-N-ethylaniline.

The nitrogen-containing basic compound can be used singly or in combinations of two or more kinds thereof. It is preferred to use a combination of two or more kinds thereof.

It is also preferable that the photosensitive composition of the invention further contains an ammonium salt compound. Specific examples of the ammonium salt will be given below, but it should not be construed that the invention is limited thereof.

Specific examples include ammonium hydroxides, ammonium triflate, ammonium pentaflate, ammonium heptaflate, ammonium nonaflate, ammonium undecaflate, ammonium tridecaflate, ammonium pentadecaflate, ammonium methylcarboxylate, ammonium ethylcarboxylate, ammonium propylcarboxylate, ammonium butylcarboxylate, ammonium heptylcarboxylate, ammonium hexylcarboxylate, ammonium octylcarboxylate, ammonium nonylcarboxylate, ammonium decylcarboxylate, ammonium undecylcarboxylate, ammonium dodecadecylcarboxylate, ammonium tridecylcarboxylate, ammonium tetradecylcarboxylate, ammonium pentadecylcarboxylate, ammonium hexadecylcarboxylate, ammonium heptadecylcarboxylate, and ammonium octadecylcarboxylate.

That is, specific examples of the foregoing ammonium hydroxide include tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethylammonium hydroxide, tetrakisdecylammonium hydroxide, dodecyltrimethylammonium hydroxide, dodecylethyldimethylammonium hydroxide, didodecyldimethylammonium hydroxide, tridodecylmethylammonium hydroxide, myristylammonium hydroxide, dimethylditetradecylammonium hydroxide, hexadecyltrimethylammonium hydroxide, octadecyltrimethylammonium hydroxide, dimethyldioctadecylammonium hydroxide, tetraoctadecylammonium hydroxide, diallyldimethylammonium hydroxide, (2-chloroethyl)-trimethylammonium hydroxide, (2-bromoethyl)-triethylammonium hydroxide, (3-bromopropyl)-trimethylammonium hydroxide, (3-bromopropyl)-triethylammonium hydroxide, glycidyltrimethylammonium hydroxide, choline hydroxide, (R)—(+)-(3-chloro-2-hydroxypropyl)-trimethylammonium hydroxide, (S)—(−)-(3-chloro-2-hydroxypropyl)-trimethylammonium hydroxide, (3-chloro-2-hydroxypropyl)-trimethylammonium hydroxide, (2-aminoethyl)-trimethylammonium hydroxide, hexamethonium hydroxide, decamethonium hydroxide, 1-azoniaproperane hydroxide, petroleum hydroxide, 2-chloro-1, 3-dimethyl-2-imidazolinium hydroxide, and 3-ethyl-2-methyl-2-thiazolium hydroxide.

An amount of the basic compound such as the organic amine or the basic ammonium salt to be used is usually from 0.001 to 10% by weight, and preferably from 0.01 to 5% by weight in total based the solids of the photosensitive composition. By making the subject use amount fall within the range of from 0.001 to 10% by weight, not only effects of the addition of the foregoing components are obtained, but also it is possible to prevent a tendency that the sensitivity is lowered or the developability in a non-exposed area is deteriorated.

[4] (D) Dissolution inhibiting compound which is decomposed by the action of an acid so that the solubility in an alkaline developer increases and which has a molecular weight of not more than 3,000 (hereinafter also referred to as "dissolution inhibiting compound"):

As the dissolution inhibiting compound which is decomposed by the action of an acid so that the solubility in an alkaline developer increases and which has a molecular weight of not more than 3,000, for the purpose of not lowering the transmittance at not more than 220 nm, alicyclic or aliphatic compounds containing an acid decomposable group, such as cholic acid derivatives containing an acid decomposable group as described in *Proceeding of SPIE*, 2724, 355 (1996), are preferable. With respect to the acid decomposable group and the alicyclic structure, those which are the same as described in the foregoing acid decomposable resin are enumerated.

The molecular weight of the dissolution inhibiting compound in the invention is not more than 3,000, preferably from 300 to 3,000, and more preferably from 500 to 2,500.

An addition amount of the dissolution inhibiting compound is preferably from 1 to 30% by weight, and more preferably from 2 to 20% by weight based on the solids of the photosensitive composition.

Specific examples of the dissolution inhibiting compound will be given below, but it should not be construed that the invention is limited thereto.

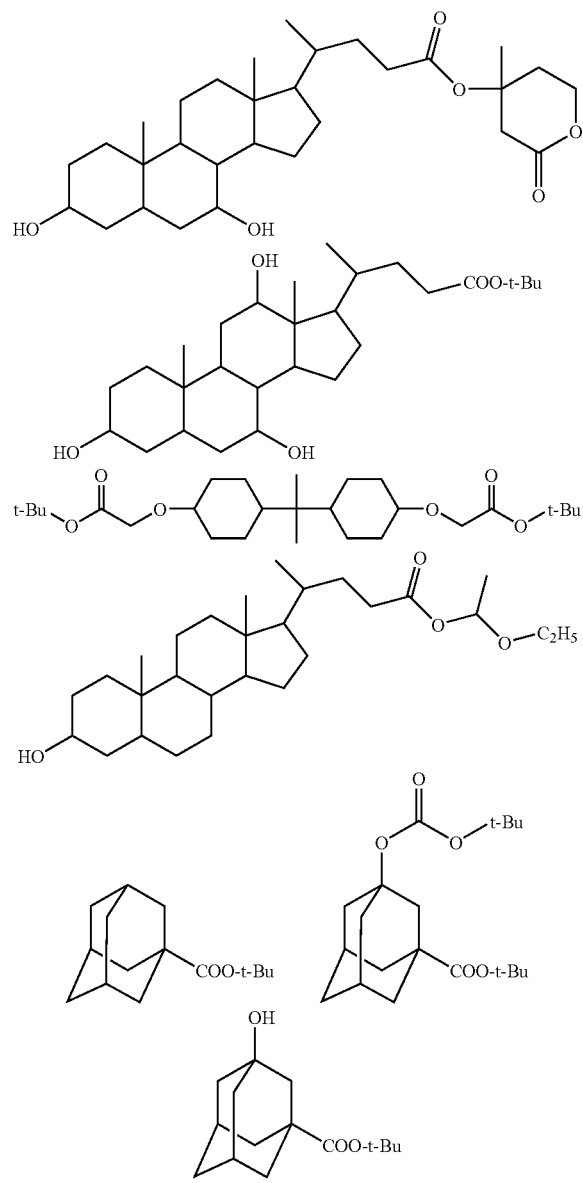

[5] Fluorine Based and/or Silicon Based Surfactant:

It is preferable that the photosensitive composition of the invention further contains any one or two of more of fluorine based and/or silicon based surfactants (for example, fluorine based surfactants, silicon based surfactants, and surfactants containing both a fluorine atom and a silicon atom).

When the photosensitive composition of the invention contains a fluorine based and/or silicon based surfactant, it is possible to give a resist pattern having good sensitivity, resolution and adhesion and less development defect at the time of using an exposure light source of not more than 250 nm, especially not more than 220 nm.

Examples of such a fluorine based and/or silicon based surfactant include surfactants as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. Commercially available surfactants as described below can be used as they are.

Examples of the commercially available surfactant which can be used include fluorine based surfactants or silicon based surfactants such as EFTOP EF301 and EF303 (manufactured by Shin Akita Kasei Co., Ltd.), FLUORAD FC430 and 431 (manufactured by Sumitomo 3M Limited), MEGAFAC F171, F173, F176, F189 and R08 (manufactured by Dainippon Ink and Chemicals, Incorporated), SARFRON S-382, SC101, 102, 103, 104, 105 and 106 (manufactured by Asahi Glass Co., Ltd.), and TROY SOL S-366 (manufactured by Troy Chemical Corporation). Also, a polysiloxane polymer KP-341 (manufactured by Shin-Etsu Chemical Co., Ltd.) can be used as the silicon based surfactant.

Furthermore, besides the foregoing known surfactants, surfactants using a polymer having a fluoroaliphatic group which is derived from a fluoroaliphatic compound as produced by the telomerization method (also called as "telomer method") or oligomerization method (also called as "oligomer method") can be used. The fluoroaliphatic compound can be synthesized by a method as described in JP-A-2002-90991.

As the polymer having a fluoroaliphatic group, copolymers of a monomer having a fluoroaliphatic group and a (poly(oxyalkylene)) acrylate and/or a (poly(oxyalkylene)) methacrylate are preferable, and they may be irregularly distributed or block copolymerized. Also, examples of the poly(oxyalkylene) group include a poly(oxyethylene) group, a poly(oxypropylene) group, and a poly(oxybutylene) group. Furthermore, the poly(oxyalkylene) group may be a unit having alkylenes having a different chain length in the same chain length such as a poly(oxyethylene/oxypropylene/oxyethylene block conjugate) and a poly(oxyethylene/oxypropylene block conjugate). Moreover, the copolymer of a monomer having a fluoroaliphatic group and a (poly(oxyalkylene)) acrylate (or methacrylate) may be a two-component copolymer or a three-component or multi-component copolymer resulting from simultaneous copolymerization of two or more different kinds of a monomer having a fluoroaliphatic group and two or different kinds of a (poly(oxyalkylene)) acrylate (or methacrylate).

As the commercially available surfactant, for example, MEGAFAC F178, F-470, F-473, F-475, F-476 and F-472 (manufactured by Dainippon Ink and Chemicals, Incorporated) can be enumerated. Furthermore, copolymers of an acrylate (or methacrylate) having a $C_6F_{13}$ group and a (poly(oxyalkylene)) acrylate (or methacrylate); copolymers of an acrylate (or methacrylate) having a $C_6F_{13}$ group, (poly(oxyethylene)) acrylate (or methacrylate) and (poly(oxypropylene)) acrylate (or methacrylate); copolymers of an acrylate (or methacrylate) having a $C_8F_{17}$ group and a (poly(oxyalkylene)) acrylate (or methacrylate); and copolymers of an acrylate (or methacrylate) having a $C_8F_{17}$ group, (poly(oxyethylene)) acrylate (or methacrylate) and (poly(oxypropylene)) acrylate (or methacrylate) can be enumerated.

An amount of the fluorine based and/or silicon based surfactant to be used is preferably from 0.0001 to 2% by weight, and more preferably from 0.001 to 1% by weight based on the total amount (excluding the solvent) of the photosensitive composition.

[6] Organic Solvent:

In the photosensitive composition of the invention, the respective components are dissolved in a prescribed organic solvent and used.

Examples of the solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran.

In the invention, though the organic solvent may be used singly or in admixture, it is preferred to use a mixed solvent comprising a mixture of two or more members selected from solvents having a hydroxyl group in the structure, solvents having an ester or lactone structure in the structure, and solvents having a ketone structure in the structure. In this way, it is possible to reduce the generation of particles at the time of preserving a resist solution.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Of these, propylene glycol monomethyl ether and ethyl lactate are especially preferable.

Examples of the solvent having an ester or lactone structure include propylene glycol monomethyl ether acetate, ethyl ethoxy propionate, γ-butyrolactone, and butyl acetate. Of these, propylene glycol monomethyl ether acetate and ethyl ethoxy propionate are especially preferable, with propylene glycol monomethyl ether acetate being the most preferable.

Examples of the solvent having a ketone structure include 2-heptanone and cyclohexanone. Of these, cyclohexanone is preferable.

Examples of a preferred combination of the mixed solvent include a combination of a solvent having a hydroxyl group and a solvent having an ester structure and a combination of a solvent having a ketone structure and a solvent having an ester structure.

A mixing ratio (on a weight basis) of the solvent having a hydroxyl group to the solvent having an ester structure is usually from 1/99 to 99/1, preferably from 5/95 to 95/5, more preferably from 20/80 to 80/20, and especially preferably from 20/80 to 60/40.

A mixing ratio (on a weight basis) of the solvent having a ketone structure to the solvent having an ester structure is usually from 1/99 to 99/1, preferably from 5/95 to 95/5, more preferably from 20/80 to 80/20, and especially preferably from 20/80 to 60/40.

<Other Additives>

If desired, in the photosensitive composition of the invention, a dye, a plasticizer, a surfactant other the foregoing components, a photo-sensitizer, a compound capable of promoting the dissolution in the developer, and the like can be contained.

The dissolution promoting compound in the developer which can be used in the invention is a low molecular weight compound having two or more phenolic OH groups or one or more carboxyl groups and having a molecular weight of not more than 1,000. When the dissolution promoting compound has a carboxyl group, it is preferably an alicyclic or aliphatic compound.

A preferred addition amount of the dissolution promoting compound is preferably from 2 to 50% by weight, and more preferably from 5 to 30% by weight based on the resin as the component (A). By making the addition amount of the dissolution inhibiting compound fall within the range of from 2 to 50% by weight, it is possible to prevent a phenomenon in which the development residue becomes worse, whereby the pattern is deformed at the time of development from occurring.

Such a phenol compound having a molecular weight of not more than 1,000 can be easily synthesized by those skilled in the art by referring to, for example, methods as described in JP-A-4-122938, JP-A-2-28531, U.S. Pat. No. 4,916,210, and European Patent No. 219,294.

Specific examples of the alicyclic or aliphatic compound having a carboxyl group include carboxylic acid derivatives having a steroid structure such as cholic acid, deoxycholic acid, and lithocholic acid, adamantanecarboxylic acid derivatives, adamantanedicarboxylic acid, cyclohexanecarboxylic acid, and cyclohexanedicarboxylic acid. However, it should not be construed that the invention is limited thereto.

In the invention, a surfactant other than the foregoing fluorine based and/or silicon based surfactant can be added. Specific examples thereof include nonionic surfactants such as polyoxyethylene alkyl ethers, polyoxyethylene alkyl allyl ethers, polyoxyethylene/polyoxypropylene block copolymers, sorbitan aliphatic esters, and polyoxyethylene sorbitan aliphatic esters.

Such a surfactant may be added singly qr in combinations of several kinds thereof.

<<Use Method>>

In the photosensitive composition of the invention, the respective components are dissolved in a prescribed organic solvent, preferably dissolved in the foregoing mixed solvent, and the solution is coated on a prescribed support as described below and used.

For example, the photosensitive composition is coated on a substrate which is used in the manufacture of precision integrated circuit devices (for example, silicon/silicon dioxide coated substrates) by a proper coating method using a spinner, a coater, etc.

After coating, the photosensitive composition is irradiated with active rays or radiations through a prescribed mask, baked and then developed. In this way, a satisfactory pattern can be obtained. Examples of the active rays which can be employed include infrared light, visible light, ultraviolet light, far ultraviolet light, X-rays, and electron beams. Of these, far ultraviolet light having a wavelength of not more than 250 nm is preferable, and far ultraviolet light having a wavelength of not more than 220 nm is more preferable. Specific examples thereof include KrF excimer laser (248 nm), ArF excimer laser (193 nm), $F_2$ excimer laser (157 nm), X-rays, and electron beams, with ArF excimer laser and F2 excimer laser being the most preferable. Incidentally, in the invention, it should be noted that X-rays and electron beams are included in the active rays.

At the time of irradiation with active rays or radiations, exposure (liquid immersion exposure) may be carried out by filling a liquid (liquid immersion medium) having a higher refractive index than air between a photosensitive film and a lens. In this way, it is possible to enhance resolving properties. While any liquid having a higher refractive index than air can be used as the liquid immersion liquid to be used, pure water is preferable, Also, in order that the photosensitive film may not come into direct contact with the liquid immersion medium during the liquid immersion exposure, an overcoat layer may be further provided on the photosensitive film. In this way, elution of the composition from the photosensitive film into the liquid immersion medium is suppressed, thereby reducing the development defect.

In the development step, the alkaline developer is used in the following way. As the alkaline developer of the resist composition, alkaline aqueous solutions of an inorganic alkali (for example, sodium hydroxide, potassium hydroxide, sodium carbonate, sodium silicate, sodium metasilicate, and ammonia water), a primary amine (for example, ethylamine and n-propylamine), a secondary amine (for example, diethylamine and di-n-butylamine), a tertiary amine (for example, triethylamine and methyldiethylamine), an alcholamine (for example, dimethylethanolamine and triethanolamine), a quaternary amine (for example, tetramethylammonium hydroxide and tetraethylammonium hydroxide), or a cyclic amine (for example, pyrrole and piperidine) can be used.

Furthermore, an alcohol and a surfactant can also be used in proper amounts in the foregoing alkaline developer.

An alkali concentration of the alkaline developer is usually from 0.1 to 20% by weight.

A pH of the alkaline developer is usually from 10.0 to 15.0.

EXAMPLES

The invention will be described below with reference to the following Examples, but it should not be construed that the invention is limited thereto.

Synthesis Example 1

Synthesis of Monomer (Ib-1)

36 g of D-glucurono-6,3-lactone (manufactured by Tokyo Kasei Kogyo Co., Ltd.) was dissolved in 800 mL of acetone, to which was then gradually added dropwise 5 mL of concentrated sulfuric acid. The mixture was allowed to react at room temperature for 5 hours, and thereafter, the reaction mixture was neutralized by the addition of sodium hydrogencarbonate. The excessive sodium hydrogencarbonate was removed by filtration, and the filtrate was concentrated to 200 mL. Ethyl acetate was added thereto, and an organic layer was washed with water, dried over anhydrous sodium sulfate, and then concentrated. The resulting crude product was recrystallized from toluene to obtain 9.8 g of a ketal.

9 g of the resulting ketal was dissolved in 100 mL of tetrahydrofuran, to which was then added 8.4 g of triethylamine. 9.6 g of methacrylic anhydride was added dropwise thereto under ice cooling over 30 minutes.

The mixture was allowed to react at room temperature for 10 hours, to which was then added 500 mL of ethyl acetate. An organic layer was washed with water, dried, and then concentrated to obtain a crude product. This crude product was purified by column chromatography to obtain 8.3 g of a monomer (Ib-1).

$^1$H-NMR (CDCl$_3$):

δ1.36 (s, 3H), δ1.51 (s, 3H), δ2.00 (s, 3H), δ4.85 (d, 1H), δ4.90 (d, 1H), δ5.09 (dd, 1H), δ5.55 (d, 1H), δ5.73 (s, 1H), δ6.02 (d, 1H), δ6.31 (s, 1H)

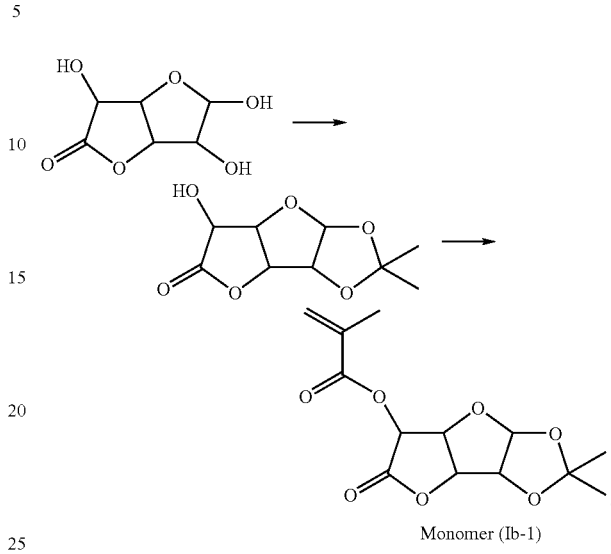

Monomer (Ib-1)

The foregoing monomer (Ib-1) contained 99% or more of a component having the following stereostructure.

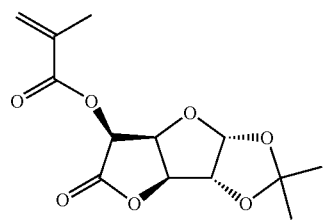

Ib-1

Synthesis Example 2

Synthesis of Monomer (IIIb-1)

The following hydroxylactone (HL1) was obtained according a method as described in J. Chem. Soc. PERKIN Trans., 1 (1993), p. 313. The resulting hydroxylactone (HL1) was converted into a methacrylic ester using the same method as in Synthesis Example 1, thereby obtaining a monomer (IIIb-1).

Synthesis Example 3

Synthesis of Monomer (IIb-1))

5 g of the following hydroxylactone (HL1) was dissolved in 50 mL of ethanol, to which was then added 0.25 g of 5% palladium/carbon, and the mixed solution was stirred for 6 hours under a steam stream. The reaction solution was filtered by a celite and concentrated, thereby obtaining a white solid. The white solid was purified by column chromatography to obtain 4.3 g of the following hydroxylactone (HL2). The resulting hydroxylactone (HL2) was converted into a methacrylic ester using the same method as in Synthesis Example 1, thereby obtaining a monomer (IIb-1).

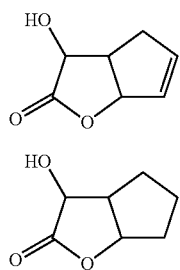

The foregoing monomers (IIIb-1) and (IIb-1) contained 98% or more of the following stereostructures, respectively.

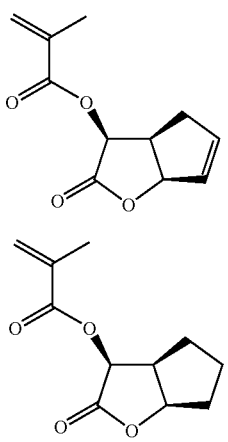

Synthesis Example 4

Synthesis of Resin (1)

A three-necked flask wash charged with 13.8 g of propylene glycol monomethyl ether acetate and 9.2 g of propylene glycol monomethyl ether under a nitrogen gas stream, and the mixture was heated at 80° C. To the resulting mixture, a solution as prepared by dissolving 22.8 g of the monomer (Ib-1), 10.1 g of dihydroxyadamantane methacrylate, 15.7 of isoadamantyl methacrylate, 1.8 g of methacrylic acid, 124.2 g of propylene glycol monomethyl ether acetate, and 8% by mole, based on the monomer, of an initiator V-601 (manufactured by Wako Pure Chemical Industries, Ltd.) in 82.8 g of propylene glycol monomethyl ether was added dropwise over 6 hours. After completion of the dropwise addition, the mixture was allowed to react at 80° C. for an additional 2 hours. After allowing the reaction solution to cool, the resulting reaction solution was poured into a mixture of 2,700 mL of hexane and 300 mL of ethyl acetate, and a deposited powder was collected by filtration and dried to obtain 46 g of a resin (1). The resulting resin had a weight average molecular weight of 8,400 and a degree of dispersion (Mw/Mn) of 1.89.

Resins (2) to (24) and a comparative resin (Q1) were synthesized in the same manner.

The structure, weight average molecular weight and degree of dispersion of each of the resins (1) to (24) and comparative resin (Q1) will be shown below.

|     | Molecular weight | Mw/Mn |
| --- | --- | --- |
| (1) | 8400 | 1.89 |

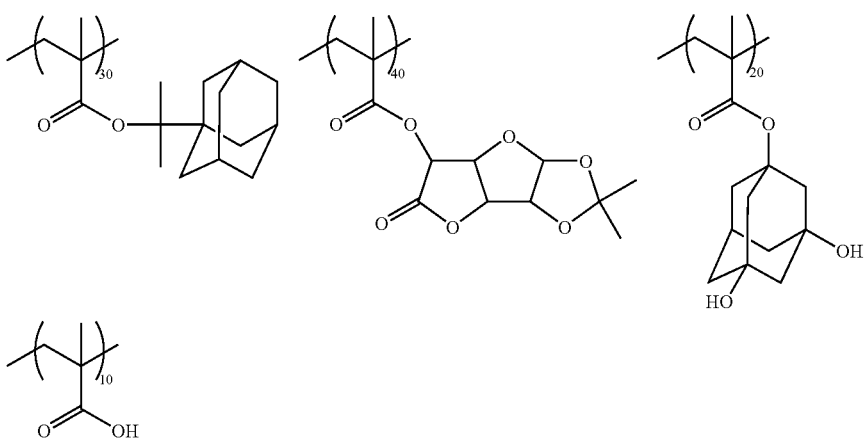

-continued

| | Molecular weight | Mw/Mn |
|---|---|---|
| (2) | 9400 | 1.89 |
| (3) | 10700 | 1.96 |
| (4) | 10300 | 2.01 |
| (5) | 8900 | 1.85 |

-continued
| | Molecular weight | Mw/Mn |
|---|---|---|
| (6) | 11300 | 1.96 |
| (7) | 18600 | 2.10 |
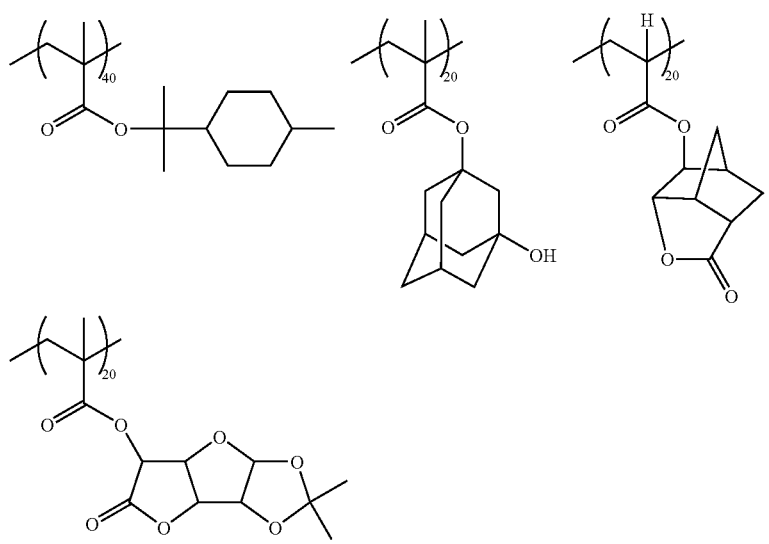
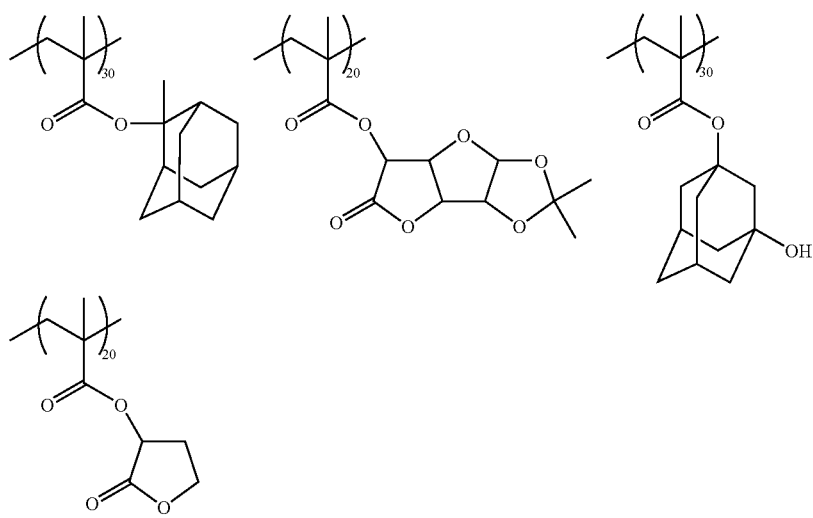

-continued

| | Molecular weight | Mw/Mn |
|---|---|---|
| (8) | 19000 | 2.13 |
| (9) | 11700 | 1.79 |
| (10) | 13400 | 1.90 |

-continued

| | Molecular weight | Mw/Mn |
|---|---|---|
| (11) | 9300 | 2.01 |
| (12) | 12600 | 1.96 |
| (13) | 5900 | 1.67 |

-continued

| | Molecular weight | Mw/Mn |
|---|---|---|
| (14) | 9800 | 1.90 |
| (15) | 11300 | 2.02 |
| (16) | 8600 | 1.78 |
| (17) | 7900 | 1.71 |

-continued
| | Molecular weight | Mw/Mn |
|---|---|---|
| (18) 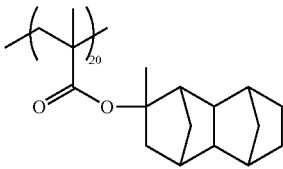 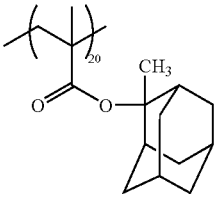 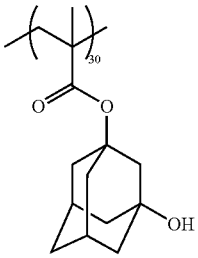 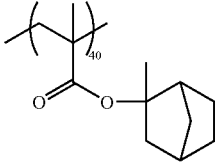 | 12000 | 2.10 |
| (19) 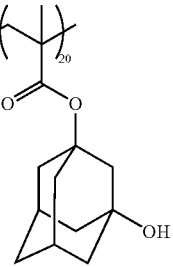 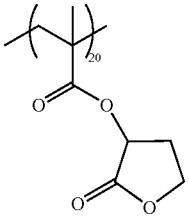 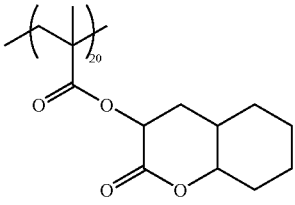 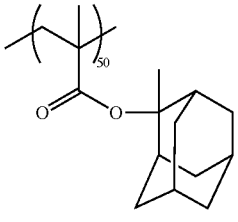 | 11000 | 1.96 |
| (20) 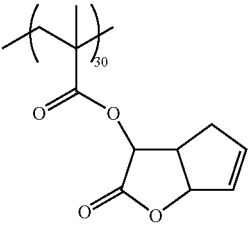 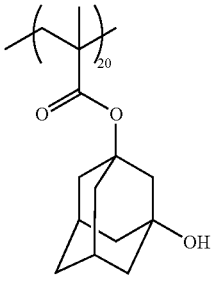 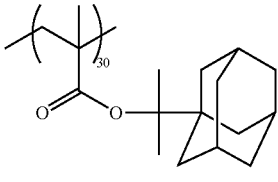 | 15600 | 2.32 |
| (21) 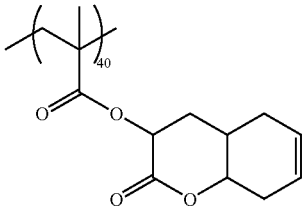 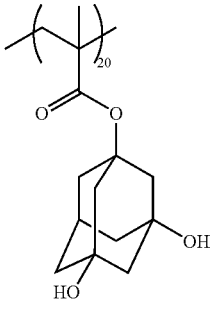 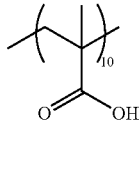 | 7900 | 1.79 |

-continued

| | Molecular weight | Mw/Mn |
|---|---|---|
| (22) | 5600 | 1.86 |
| (23) | 4800 | 1.74 |
| (24) | 7000 | 1.95 |
| (Q1) | 8900 | 1.92 |

Resin for Comparative Example

Example 1 to 29 and Comparative Example 1

<Preparation of Resist>

The respective components as shown in the following Tables 1 to 3 were dissolved in a solvent as also shown in the following Tables 1 to 2 to prepare a solution having a concentration of solids of 8% by weight, which was then filtered by a polyethylene filter of 0.03 μm, thereby preparing a positive working resist solution. The thus prepared positive working resist solution was evaluated in methods as described blow. The results obtained are shown in Tables 1 to 3.

TABLE 1

|  | (A) Resin | (B) Photo-acid generator (g) | Basic compound (g) | Surfactant (0.02 g) | Dissolution inhibiting compound | Solvent | Resolution (nm) | Line edge roughness (nm) |
|---|---|---|---|---|---|---|---|---|
| Example 1 | (1) (10 g) | z2 (0.5) | N-1 (0.03) | W-1 | — | SL-2/4 = 60/40 | 50 | 4.8 |
| Example 2 | (2) (10 g) | z3 (0.4) | N-2 (0.01) | W-2 | — | SL-1/3 = 60/40 | 55 | 5.5 |
| Example 3 | (3) (10 g) | z5 (0.4) | N-3 (0.025) | W-3 | — | SL-1/2 = 95/5 | 55 | 5.5 |
| Example 4 | (4) (10 g) | z14 (0.3) | N-4 (0.02) | W-4 | — | SL-2/4 = 80/20 | 55 | 5.4 |
| Example 5 | (5) (10 g) | z38 (0.15) z50 (0.2) | N-2 (0.01) N-3 (0.01) | W-4 | — | SL-1/2 = 70/30 | 55 | 5.2 |
| Example 6 | (6) (10 g) | z55 (0.4) | N-6 (0.03) | W-4 | — | SL-2/4 = 40/60 | 60 | 5.2 |
| Example 7 | (7) (10 g) | z56 (0.2) z40 (0.2) | N-7 (0.01) | W-1 | — | SL-2/4 = 60/40 | 55 | 5.6 |
| Example 8 | (8) (10 g) | z14 (0.3) | N-1 (0.02) | W-1 | — | SL-1/2 = 70/30 | 55 | 5.3 |
| Example 9 | (9) (10 g) | z44 (0.6) | N-2 (0.02) | W-1 | — | SL-2/3 = 90/10 | 60 | 5.1 |
| Example 10 | (10) (10 g) | z58 (0.3) | N-3 (0.02) | W-4 | — | SL-2/4 = 60/40 | 55 | 5.0 |
| Example 11 | (11) (10 g) | z58 (0.2) z52 (0.2) | N-1 (0.03) | W-3 | — | SL-1/2 = 40/60 | 60 | 5.4 |
| Example 12 | (12) (10 g) | z40 (0.1) z59 (0.4) | N-1 (0.01) N-3 (0.01) | W-4 | — | SL-1/2 = 60/40 | 55 | 5.3 |
| Example 13 | (13) (10 g) | z38 (0.3) z55 (0.1) | N-3 (0.02) | W-4 | D-1 (0.5 g) | SL-2/4 = 60/40 | 60 | 5.2 |
| Example 14 | (1) (7 g) (Q1) (3 g) | z13 (0.4) z5 (0.05) | N-5 (0.03) | W-4 | — | SL-2/5 = 95/5 | 55 | 5.2 |
| Example 15 | (1) (5 g) (12) (5 g) | z58 (0.3) z60 (0.2) | N-2 (0.02) N-3 (0.02) | W-4 | — | SL-2/4 = 60/40 | 60 | 5.5 |
| Example 16 | (4) (5 g) (11) (5 g) | z14 (0.4) z12 (0.1) | — | W-4 | — | SL-2/4 = 60/40 | 60 | 5.4 |
| Example 17 | (7) (5 g) (10) (5 g) | z58 (0.2) z61 (0.3) | N-2 (0.02) N-3 (0.02) | W-4 | — | SL-2/4 = 60/40 | 55 | 5.2 |

TABLE 2

|  | (A) Resin | (B) Photo-acid generator (g) | Basic compound (g) | Surfactant (0.02 g) | Solvent | Resolution (nm) | Line edge roughness (nm) |
|---|---|---|---|---|---|---|---|
| Example 18 | (14) (10 g) | z2 (0.5) | N-2 (0.03) | W-1 | SL-2/4 = 60/40 | 55 | 5.3 |
| Example 19 | (15) (10 g) | z3 (0.4) | N-3 (0.01) | W-2 | SL-1/3 = 60/40 | 55 | 5.4 |
| Example 20 | (16) (10 g) | z5 (0.4) | N-3 (0.025) | W-3 | SL-2/5 = 95/5 | 55 | 5.6 |
| Example 21 | (17) (10 g) | z14 (0.3) | N-4 (0.02) | W-4 | SL-2/4 = 80/20 | 55 | 5.1 |
| Example 22 | (18) (10 g) | z38 (0.15) z50 (0.2) | N-2 (0.01) N-3 (0.01) | W-4 | Sl-1/2 = 70/30 | 55 | 4.9 |
| Example 23 | (19) (10 g) | z55 (0.4) | N-6 (0.03) | W-4 | SL-1/4 = 40/60 | 55 | 5.0 |
| Example 24 | (1) (7 g) (20) (3 g) | z56 (0.2) z40 (0.2) | N-7 (0.01) | W-1 | SL-2/4 = 60/40 | 55 | 5.2 |
| Example 25 | (4) (10 g) | z14 (0.3) | N-1 (0.02) | W-4 | SL-1/4 = 70/30 | 50 | 4.7 |
| Example 26 | (21) (10 g) | z44 (0.6) | N-2 (0.02) | W-4 | SL-2/3 = 90/10 | 50 | 4.8 |

TABLE 3

| | (A) Resin | (B) Photo-acid generator (g) | Basic compound (g) | Surfactant (0.02 g) | Solvent | Resolving power (nm) | Line edge roughness (nm) |
|---|---|---|---|---|---|---|---|
| Example 27 | (22) (10 g) | z58 (0.3) z38 (0.2) | N-2 (0.02) N-3 (0.02) | W-4 | SL-1/2 = 50/50 | 55 | 5.6 |
| Example 28 | (23) (10 g) | z58 (0.3) z61 (0.2) | N-2 (0.02) N-3 (0.02) | W-4 | SL-1/2 = 50/50 | 55 | 5.2 |
| Example 29 | (24) (10 g) | z58 (0.2) z60 (0.3) | N-2 (0.02) N-3 (0.02) | W-4 | SL-1/2 = 50/50 | 55 | 6.0 |
| Comparative Example 1 | (Q1) (10 g) | z2 (0.5) | N-1 (0.03) | W-1 | SL-2/4 = 60/40 | 65 | 7.4 |

The abbreviations in Tables 1 to 3 are as follows.
N-1: Trioctylamine
N-2: 2,6-Diisopropylaniline
N-3: N-Phenyldiethanolamine
N-4: Diazabicyclo[4.3.0]nonene
N-5: Dicyclohexylmethylamine
N-6: 2,4,5-Triphenyl imidazole
N-7: 4-Dimethylaminopyridine
W-1: MEGAFAC F176 (manufactured by Dainippon Ink and Chemicals, Incorporated) (fluorine based)
W-2: MEGAFAC R08 (manufactured by Dainippon Ink and Chemicals, Incorporated) (fluorine and silicon based)
W-3: Polysiloxane polymer KP-341 (manufactured by Shin-Etsu Chemical Co., Ltd.)
W-4: TROY SOL S-366 (manufactured by Troy Chemical Corporation)
SL-1: Cyclohexanone
SL-2: Propylene glycol monomethyl ether acetate
SL-3: Ethyl lactate
SL-4: Propylene glycol monomethyl ether
SL-5: γ-Butyrolactone
In Tables 1 and 2, a ratio of the plural solvents is on a weight basis.
D-1: t-Butyl lithocholate <Evaluation of Resist>

ARC29A manufactured by Brewer Science, Inc. was uniformly coated in a thickness of 78 nm on a silicon wafer using a spin coater and dried by heating at 205° C. for 60 seconds to form an antireflection film. Thereafter, each of the positive working resist compositions immediately after the preparation was coated using a spin coater and dried (PB) at 115° C. for 90 seconds to form a resist film of 170 nm.

This resist film was exposed through a mask by an ArF excimer laser stepper (PAS5500/1100 manufactured by ASML, NA=0.75 (⅔ annular illumination)) and immediately after the exposure, heated (PEB) on a hot plate at 120° C. for 90 seconds. Furthermore, the resulting resist film was developed with a 2.38% by weight tetramethylammonium hydroxide aqueous solution at 23° C. for 60 seconds, rinsed with pure water for 30 seconds, and then dried, thereby obtaining a resist pattern.

(Resolution)

An exposure amount at which a mask pattern of line-and-space 1/1 of 80 nm was reproduced was defined as an optimum exposure amount. In further increasing the exposure amount from the optimum exposure amount to make the line width thin, a line width at which the resolution could be achieved without causing falling of the pattern was defined as the resolution.

(Line Edge Roughness)

The measurement of line edge roughness was carried out as follows. That is, a pattern of line-and-space 1/1 of 80 nm was observed using a length measuring scanning electron microscope (SEM); with respect to the range of 5 μm of an edge in the longitudinal direction of the line pattern, a distance from the standard line at which the edge should be present was measured at 50 points using a length measuring SEM (S-8840 manufactured by Hitachi, Ltd.); and a standard deviation was determined, from which was then calculated 3σ.

It is meant that the smaller the value, the better the performance is.

It is clear from the results as shown in Tables 1 to 3 that the photosensitive compositions of the invention are excellent in the resolution and satisfactory in the line edge roughness.

Immersion Exposure:

<Preparation of Resist>

The components of each of Examples 1 to 29 were dissolved in a solvent to prepare a solution having a concentration of solids of 7% by weight, which was then filtered by a polyethylene filter of 0.03 μm, thereby preparing a photosensitive composition. The thus prepared positive working resist solution was evaluated in a method as described blow.

<Evaluation of Resolution>

An organic antireflection film ARC29A (manufactured by Nissan Chemical Industries, Ltd.) was coated on a silicon wafer and baked at 205° C. for 60 seconds to form an antireflection film. The prepared positive working resist composition was coated thereon and baked at 115° C. for 60 seconds to form a resist film of 150 nm. The thus obtained wafer was subjected to two-beam interference exposure (wet exposure) using pure water as a liquid immersion liquid. Incidentally, in the two-beam interference exposure (wet exposure), as shown in FIG. 1, a wafer 10 having an antireflection film and a resist film was exposed via a prism 8 and a liquid immersion liquid (pure water) 9 by using a laser 1, a diaphragm 2, a shutter 3, three reflection mirrors 4, 5 and 6, and a condenser lens 7. The laser 1 having a wavelength of 193 nm was used, and the prism 8 for forming a line-and-space pattern of 65 nm was used. Immediately after the exposure, the exposed wafer was heated at 115° C. for 90 seconds, developed with a tetramethylammonium hydroxide aqueous solution (2.38%) for 60 seconds, rinsed with pure water, and then spin dried to obtain a resist pattern. This resist pattern was observed using a scanning electron microscope (S-9260 manufactured by Hitachi, Ltd.). As a result, a line-and-space pattern of 65 nm was resolved.

It is clear that the positive working photosensitive compositions of the invention also have a satisfactory image forming ability even in the exposure method via an immersion liquid.

This application is based on Japanese patent applications JP 2004-189265, filed on Jun. 28, 2004 and JP 2004-302988, filed on Oct. 18, 2004, the entire content of which is hereby incorporated by reference, the same as if set forth at length.

What is claimed is:

1. A positive photosensitive composition comprising (A) a resin increasing the solubility in an alkaline developer by the action of an acid wherein the resin (A) is a resin having a repeating unit containing a structure of formula (I),

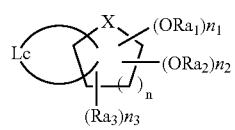

(I)

wherein:

X represents an oxygen atom, a sulfur atom or —C(=O)—;

Lc represents a group for forming a lactone;

$Ra_1$ and $Ra_2$ each independently represents a hydrogen atom, an alkyl group, a cycloalkyl group, an acyl group, or an acid decomposable group;

$Ra_3$ represents a carboxyl group, an alkyl group, an alkoxy group, an acyloxy group, an alkoxycarbonyl group, or a group having an acid decomposable group;

two of $Ra_1$ to $Ra_3$ may combine together to form a ring;

n represents an integer of 1 or 2;

$n_1$ and $n_2$ each represents an integer of from 0 to 3, with proviso that $(n_1+n_2)$ represents an integer of from 1 to 6; and $n_3$ represents an integer of from 0 to 3.

2. A positive photosensitive composition according to claim 1, wherein (A) is a resin having a repeating unit containing a structure of formula (I'),

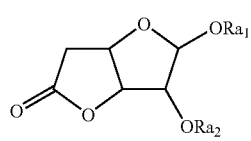

(I')

wherein:

$Ra_1$ and $Ra_2$ each independently represents a hydrogen atom, an alkyl group, a cycloalkyl group, an acyl group, or an acid decomposable group; and $Ra_1$ and $Ra_2$ may combine together to form a ring.

3. A positive photosensitive composition according to claim 1, wherein (A) is a resin having a repeating unit of formula (Ia),

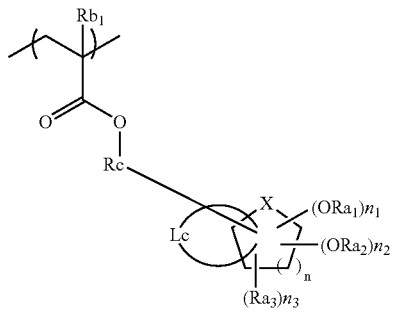

(Ia)

wherein:

$Rb_1$ represents a hydrogen atom, an alkyl group, or —$CH_2$—O—$Rb_2$, wherein $Rb_2$ represents a hydrogen atom, an alkyl group, a cycloalkyl group, an acyl group, or a group having a lactone structure;

Rc represents a single bond or a divalent connecting group; and

X, Lc, $Ra_1$, $Ra_2$, $Ra_3$, n, $n_1$, $n_2$ and $n_3$ have the same meaning as in claim 1, respectively.

4. A positive photosensitive composition according to claim 1, wherein (A) is a resin having a repeating unit of formula (Ia-1) or (Ia")

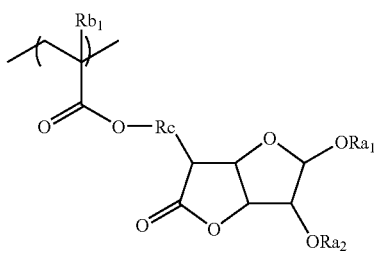

(Ia-1)

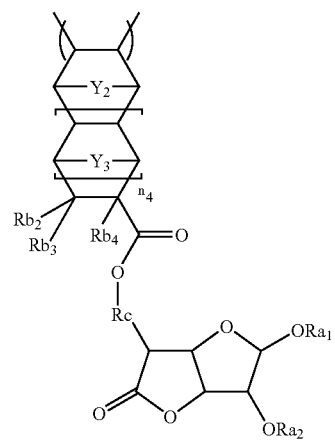

(Ia")

wherein:

$Ra_1$ and $Ra_2$ each independently represents a hydrogen atom, an alkyl group, a cycloalkyl group, an acyL group, or an acid decomposable group;

$Ra_1$ and $Ra_2$ may combine together to form a ring;

$Rb_1$ represents a hydrogen atom, an alkyl group, or —$CH_2$—O—$Rb_2$, wherein $Rb_2$ represents a hydrogen atom, an alkyl group, a cycloalkyl group, an acyl group, or a group having a lactone structure;

Rc represents a single bond or a divalent connecting group;

$Y_2$ and $Y_3$ each independently represents —$CH_2$—, —$CH_2CH_2$—, —O—, or —S—;

$Rb_2$, $Rb_3$, and $Rb_4$ each independently represents a hydrogen atom, an alkyl group, a hydroxyl group, a carboxyl group, or an alkoxycarbonyl group; and $n_4$ represents 0 or 1.

5. A positive photosensitive composition comprising: (A) a resin increasing the solubility in an alkaline developer by the action of an acid, wherein (A) is a resin containing a repeating unit of formula (IIa-1)

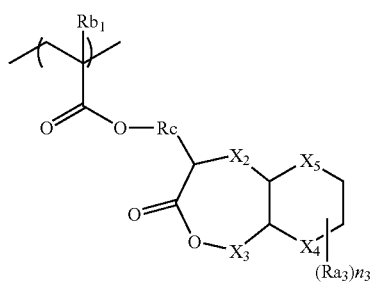

(IIa-1)

wherein:

$Rb_1$ represents a hydrogen atom, an alkyl group, or —$CH_2$—O—$Rb_{2a}$, wherein $Rb_{2a}$ represents a hydrogen atom, an alkyl group, a cycloalkyl group, an acyl group, or a group having a lactone structure;

Rc represents a single bond or a divalent connecting group;

$Ra_3$ represents a carboxyl group, an alkyl group, an alkoxy group, an acyloxy group, an alkoxycarbonyl group, or a group having an acid decomposable group;

$X_2$ represents a single bond or —$CH_2$-;

$X_3$ represents a single bond or —$CH_2$-;

$X_4$ represents a single bond, —$CH_2$—, —$CH_2CH_2$—, —$CH_2O$—, —O—, —S—, or —$CH_2S$—;

$X_5$ represents a single bond, —$CH_2$—, —$CH_2CH_2$—, —$CH_2O$—, —O—, —S—, or —$CH_2S$—;

the sum of the number of atoms exclusive of a hydrogen atom of $X_4$ and $X_5$ is 1 or 2; and $n_3$ represents an integer of from 0 to 3.

6. A positive pholosensitive composition according to claim 5, wherein (A) is a resin having a repeating unit of formula (IIa') or (IIa'')

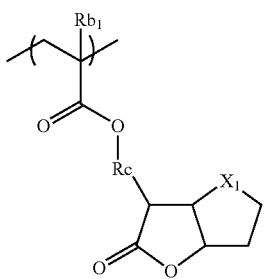

(IIa')

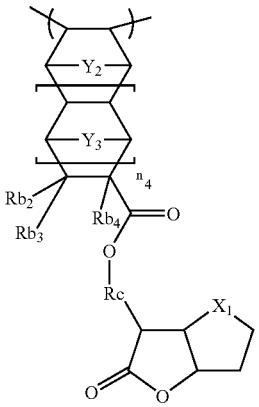

(IIa'')

wherein:

$X_1$ represents —$CH_2$—, —$CH_2CH_2$—, —$CH_2O$—, —O—, —S—, or —$CH_2S$—;

$Y_2$ and $Y_3$ each independently represents —$CH_2$—, —$CH_2CH_2$—, —O—, or —S—;

$Rb_2$, $Rb_3$, and $Rb_4$ each independently represents a hydrogen atom, an alkyl group, a hydroxyl group, a carboxyl group, or an alkoxycarbonyl group;

$n_4$ represents 0 or 1; and

Rc and $Rb_1$ each has the same meaning as in claim 5, respectively.

7. A positive photosensitive composition comprising: (A) a resin increasing the solubility in an alkaline developer by the action of an acid: wherein (A) is a resin having a repeating unit containing a structure of formula (III)

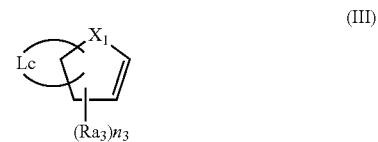

(III)

wherein:

Lc represents a group for forming a lactone;

$Ra_3$ represents a carboxyl group, an alkyl group, an alkoxy group, an acyloxy group, an alkoxycarbonyl group, or a group having an acid decomposable group;

two $Ra_3$ may combine together to form a ring;

$X_1$ represents —$CH_2$—, —$CH_2CH_2$—, —$CH_2O$—, —O—, —S—, or —$CH_2S$—; and $n_2$ represents an integer of from 0 to 3.

8. A positive photosensitive composition according to claim 7, wherein (A) is a resin having a repeating unit containing a structure of formula (III')

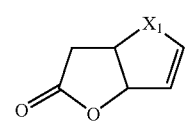

III' wherein $X_1$ has the same meaning recited in claim 7, respectively.

9. A positive photosensitive composition according to claim 7, wherein (A) is a resin having a repeating unit of formula (IIIa)

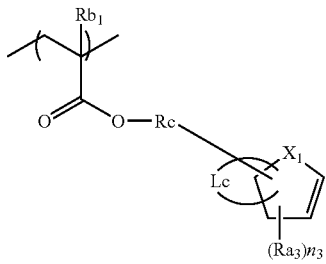

(IIIa)

wherein:
$Rb_1$ represents a hydrogen atom, an alkyl group, or —$CH_2$—O—$Rb_{2a}$, wherein $Rb_{2a}$ represents a hydrogen atom, an alkyl group, a cycloalkyl group, an acyl group, or a group having a lactone structure;
Rc represents a single bond or a divalent connecting group; and
$X_1$, Lc, $Ra_3$, and $n_3$ each has the same meaning as recited in claim 7, respectively.

10. A positive photosensitive composition according to claim 7, wherein (A) is a resin having a repeating unit of formula (IIIa-1)

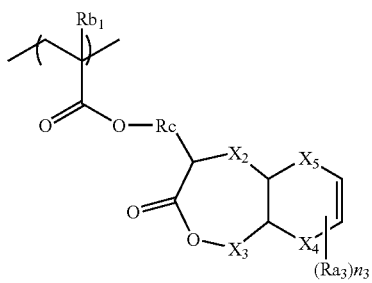

(IIIa-1)

wherein:
$Rb_1$ represents a hydrogen atom, an alkyl group, or —$CH_2$—O—$Rb_{2a}$, wherein $Rb_{2a}$ represents a hydrogen atom, an alkyl group, a cycloalkyl group, an acyl group, or a group having a lactone structure;
Rc represents a single bond or a divalent connecting group;
$Ra_3$ represents a carboxyl group, an alkyl group, an alkoxy group, an acyloxy group, an alkoxycarbonyl group, or a group having an acid decomposable group;
two $Ra_3$ groups may combine together to form a ring;
$X_2$ represents a single bond or —$CH_2$—;
$X_3$ represents a single bond or —$CH_2$—;
$X_4$ represents a single bond, —$CH_2$—, —$CH_2CH_2$—, —$CH_2O$—, —O—, —S—, or —$CH_2S$—;
$X_5$ represents a single bond, —$CH_2$—, —$CH_2CH_2$—, —$CH_2O$—, —O—, —S—, or —$CH_2S$—;
the sum of the number of atoms exclusive of a hydrogen atom of $X_4$ and $X_5$ is 1 or 2, and
$n_3$ represents an integer of from 0 to 3.

11. A positive photosensitive composition according to claim 7, wherein (A) is a resin having a repeating unit of formula (IIIa') or (IIIa")

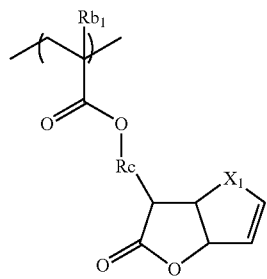

(IIIa')

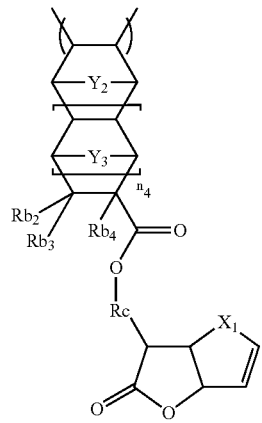

(IIIa")

wherein:
$Rb_1$ represents a hydrogen atom, an alkyl group, or —$CH_2$—O—$Rb_{2a}$, wherein $Rb_{2a}$ represents a hydrogen atom, an alkyl group, a cycloalkyl group, an acyl group, or a group having a lactone structure;
Rc represents a single bond or a divalent connecting group;
$Rb_2$, $Rb_3$, and $Rb_4$ each independently represents a hydrogen atom, an alkyl group, a hydroxyl group, a carboxyl group, or an alkoxycarbonyl group;
$n_4$ represents 0 or 1; and
$X_1$ has the same meaning as in claim 7, respectively.

12. A resin having a repeating unit containing a structure of formula (I')

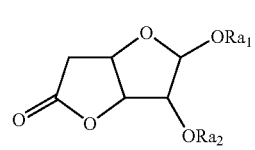

I' wherein:
$Ra_1$ and $Ra_2$ each independently represents a hydrogen atom, an alkyl group, a cycloalkyl group, an acyl group, or an acid decomposable group; and
$Ra_1$ and $Ra_2$ may combine together to form a ring.

13. A resin according to claim 12, wherein the resin has a repeating unit of formula (Ia') or (Ia")

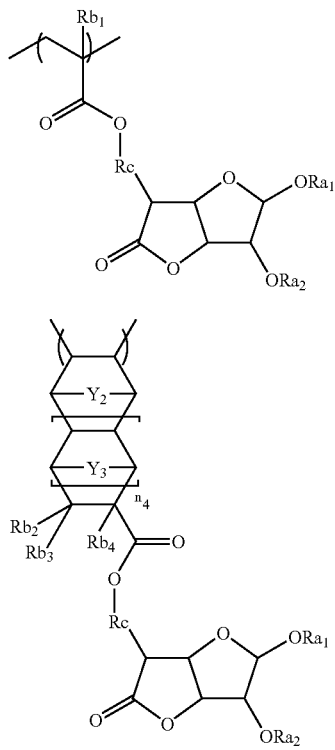

(Ia')

(Ia")

wherein:
- Rb1 represents a hydrogen atom, an alkyl group, or —CH$_2$—O—Rb$_{2a}$, wherein Rb$_{2a}$ represents a hydrogen atom, an alkyl group, a cycloalkyl group, an acyll group, or a group having a lactone structure;
- Rc represents a single bond or a divalent connecting group;
- Ra$_1$ and Ra$_2$ each independently represents a hydrogen atom, an alkyl group, a cycloalkyl group, an acyl group, or an acid decomposable group;
- Ra$_1$ and Ra$_2$ may combine together to form a ring;
- Y$_2$ and Y$_3$ each independently represents —CH$_2$—, —CH$_2$CH$_2$—, —O—, —S—;
- Rb$_2$, Rb$_3$ and Rb$_4$ each independently represent a hydrogen atom, an alkyl group, a hydroxyl group, a carboxyl group, or an alkoxycarbonyl group; and
- n$_4$, represents 0 or 1.

14. A resin having a repeating unit of formula (IIa') or (IIa")

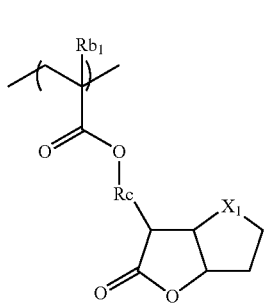

(IIa')

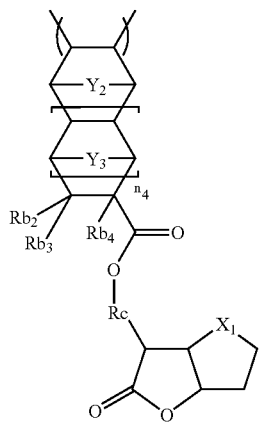

(IIa")

wherein:
- Rb$_1$ represents a hydrogen atom, an alkyl group, or —CH$_2$—O—Rb$_{2a}$, wherein Rb$_{2a}$ represents a hydrogen atom, an alkyl group, a cycloalkyl group, an acyl group, or a group having a lactone structure;
- Rc represents a single bond or a divalent connecting group;
- X$_1$ represents —CH$_2$—, —CH$_2$CH$_2$—, —CH$_2$, —O—, —S—, or —CH$_2$—S—;
- Y$_2$ and Y$_3$ each independently represents —CH$_2$—, —CH$_2$CH$_2$—, —O—, or —S—;
- Rb$_2$, Rb$_3$, and Rb$_4$ each independently represents a hydrogen atom, an alkyl group, a hydroxyl group, a carboxyl group, or an alkoxycarbonyl group; and
- n$_4$ represents 0 or 1.

15. A resin having a repeating unit containing a structure of formula (III')

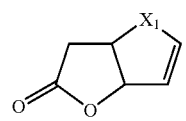

(III')

wherein:
- X$_1$ represents —CH$_2$—, —CH$_2$CH$_2$—, —CH$_2$O—, —O—, —S—, or —CH$_2$S—.

16. A resin according to claim 15, wherein the resin has a repeating unit of the formula (IIIa') or (IIa")

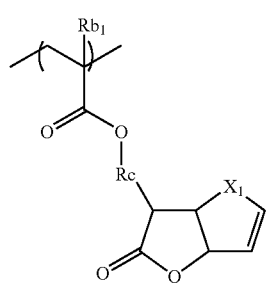

(IIIa')

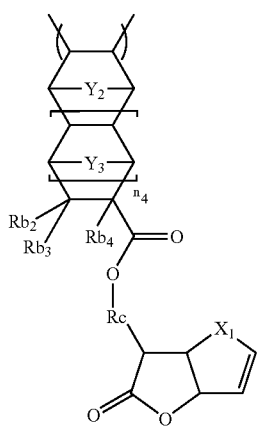
(IIIa'')

wherein:
Rb$_1$ represents a hydrogen atom, an alkyl group, or —CH$_2$—O—Rb$_{2a}$, wherein Rb$_{2a}$ represents a hydrogen atom, an alkyl group, a cycloalkyl group, an acyl group, or a group having a lactone structure;
Rc represents a single bond or a divalent connecting group;
X$_1$ represents —CH$_2$—, —CH$_2$CH$_2$—, —CH$_2$O—, —O—, —S—, or —S—;
Y$_2$ and Y$_3$ each independently represents —CH$_2$—, —CH$_2$CH$_2$—, —O—, or —S—;
Rb$_2$, Rb$_3$, and Rb$_4$ each independently represents a hydrogen atom, an alkyl group, a hydroxyl group, a carboxyl group, or an alkoxycarbonyl group; and
n$_4$ represents 0 or 1.

17. A polymerizable compound containing a structure of formula (I')

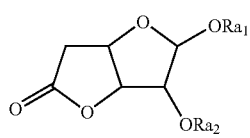
(I')

wherein:
Ra$_1$ and Ra$_2$ each independently represents a hydrogen atom, an alkyl group, a cycloalkyl group, an acyl group, or an acid decomposable group; and
Ra$_1$ and Ra$_2$ may combine together to form a ring.

18. A polymerizable compound according to claim 17, containing a structure of formula (Ib') or (Ib'')

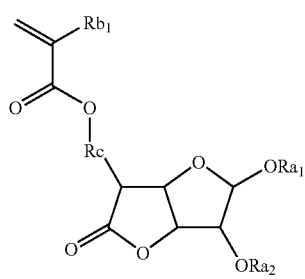
(Ib')

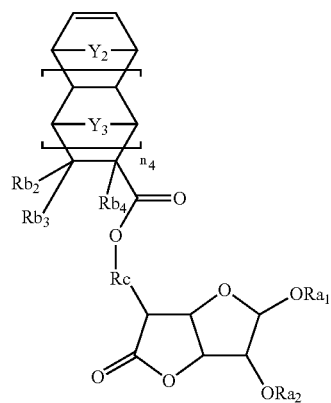
(Ib'')

wherein:
Rb$_1$ represents a hydrogen atom, an alkyl group, or —CH$_2$—O—Rb$_{2a}$, wherein Rb$_{2a}$ represents a hydrogen atom, an alkyl group, a cycloalkyl group, an acyl group, or a group having a lactone structure;
Rc represents a single bond or a divalent connecting group;
Y$_2$ and Y$_3$ each independently represents —CH$_2$—, —CH$_2$CH$_2$—, —O—, or —S—;
Rb$_2$, Rb$_3$, and Rb$_4$ each independently represents a hydrogen atom, an alkyl group, a hydroxyl group, a carboxyl group, or an alkoxycarbonyl group;
n$_4$ represents 0 or 1; and
Ra$_1$ and Ra$_2$ each have the same meaning as recited in claim 17, respectively.

19. A polymerizable compound containing a structure of formula (IIb'-1) or (IIb''-1)

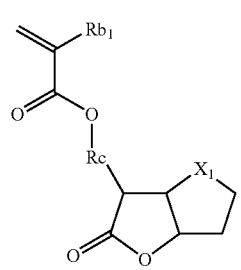
(IIb'-1)

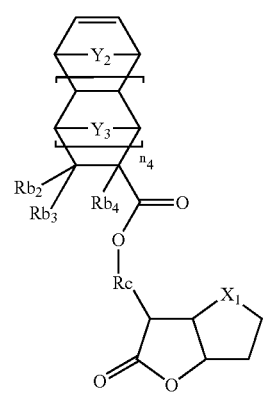
(IIb''-1)

wherein:

Rb$_1$ represents a hydrogen atom, an alkyl group, or —CH$_2$—O—Rb$_{2a}$, wherein Rb$_{2a}$ represents a hydrogen atom, an alkyl group, a cycloalkyl group, an acyl group, or a group having a lactone structure;

Rc represents a single bond or a divalent connecting group;

X$_1$ represents —CH$_2$—, —CH$_2$CH$_2$—, —CH$_2$O—, —O—, —S—, or —CH$_2$S—;

Y$_2$ and Y$_3$ each independently represents —CH$_2$—, —CH$_2$CH$_2$—, —O—, or —S—;

Rb$_2$, Rb$_3$, and Rb$_4$ each independently represents a hydrogen atom, an alkyl group, a hydroxyl group, a carboxyl group, or an alkoxycarbonyl group; and n$_4$ represents 0 or 1.

20. A polymerizable compound containing a structure of formula (III')

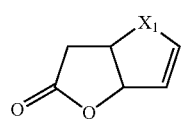
(III')

wherein:

X$_1$ represents —CH$_2$—, —CH$_2$CH$_2$—, —CH$_2$O—, —O—, —S—, or —CH$_2$S—.

21. A polymerizable compound according to claim 20, containing a structure of formula (IIIb'-1) or (IIIb''-1)

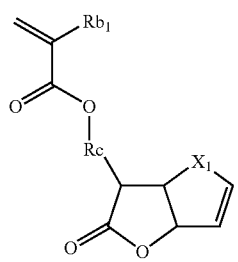
(IIIb'-1)

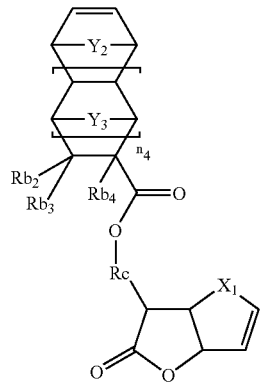
(IIIb''-1)

wherein:

Rb$_1$ represents a hydrogen atom, an alkyl group, or —CH$_2$—O—Rb$_{2a}$, wherein Rb$_{2a}$ represents a hydrogen atom, an alkyl group, a cycloalkyl group, an acyl group, or a group having a lactone structure;

Rc represents a single bond or a divalent connecting group;

Y$_2$ and Y$_3$ each independently represents —CH$_2$—, —CH$_2$CH$_2$—, —O—, or —S—;

Rb$_2$, Rb$_3$, and Rb$_4$ each independently represents a hydrogen atom, an alkyl group, a hydroxyl group, a carboxyl group, or an alkoxycarbonyl group;

n$_4$ represents 0 or 1; and

X$_1$ has the same meaning as in claim 20, respectively.

22. A method for forming a pattern, which comprises: forming a film from the photosensitive composition according to claim 1; exposing the film; and then developing the exposed film.

23. A method for forming a pattern, which comprise: forming a film from the photosensitive composition according to claim 5; exposing the film; and then developing the exposed film.

24. A method for forming a pattern, which comprise: forming a film from the photosensitive composition according to claim 7; exposing the film; and then developing the exposed film.

* * * * *